US009911880B2

(12) United States Patent
West et al.

(10) Patent No.: US 9,911,880 B2
(45) Date of Patent: Mar. 6, 2018

(54) METHOD AND APPARATUS FOR FORMING AND MOUNTING A PHOTOVOLTAIC ARRAY

(71) Applicant: SolarCity Corporation, San Mateo, CA (US)

(72) Inventors: Jack Raymond West, San Rafael, CA (US); Tyrus Hudson, San Rafael, CA (US); Brian West, San Rafael, CA (US)

(*) Notice: Subject to any disclaimer, the term of this patent is extended or adjusted under 35 U.S.C. 154(b) by 0 days.

(21) Appl. No.: 13/961,662

(22) Filed: Aug. 7, 2013

(65) Prior Publication Data

US 2014/0053891 A1 Feb. 27, 2014
US 2017/0104118 A9 Apr. 13, 2017

Related U.S. Application Data

(63) Continuation-in-part of application No. 13/351,397, filed on Jan. 17, 2012, now abandoned.

(60) Provisional application No. 61/771,050, filed on Feb. 28, 2013.

(51) Int. Cl.
*H02S 20/23* (2014.01)
*H01L 31/042* (2014.01)

(52) U.S. Cl.
CPC .................. *H01L 31/042* (2013.01)

(58) Field of Classification Search
CPC . F24J 2/5245; F24J 2/5262; F24J 2/52; H01L 31/0424; H01L 31/0482; H01L 31/05; H02S 40/36; H02S 30/10; H02S 20/23; F16L 3/1033; F16L 3/1041; F16L 3/1058; F16L 3/04; F16L 3/026
USPC .. 52/173.3, 582.2, 584.1, 586.1, 586.2, 698, 52/710; 136/244, 251, 252; 126/621, 126/622, 623; 248/220.21, 220.22, 248/221.11, 222.14, 223.13, 237
See application file for complete search history.

(56) References Cited

U.S. PATENT DOCUMENTS

| 4,631,648 | A | 12/1986 | Nilssen |
| 6,111,189 | A * | 8/2000 | Garvison et al. ............. 136/244 |
| 7,592,537 | B1 * | 9/2009 | West .............................. 136/251 |
| 8,590,223 | B2 | 11/2013 | Kilgore et al. |
| 2005/0211463 | A1* | 9/2005 | Zeuner ..................... H02G 3/30 174/138 G |
| 2005/0257453 | A1* | 11/2005 | Cinnamon ................... 52/173.3 |
| 2005/0257823 | A1* | 11/2005 | Zwanenburg ................ 136/244 |
| 2007/0245611 | A1* | 10/2007 | McDonald ............. G09F 3/204 40/661.03 |
| 2009/0025314 | A1* | 1/2009 | Komamine et al. ......... 52/173.3 |
| 2009/0078299 | A1* | 3/2009 | Cinnamon et al. .......... 136/244 |
| 2009/0282755 | A1* | 11/2009 | Abbott et al. .............. 52/173.3 |
| 2010/0276558 | A1* | 11/2010 | Faust et al. ............. 248/222.14 |

(Continued)

FOREIGN PATENT DOCUMENTS

WO 2010074701 A1 7/2010

OTHER PUBLICATIONS

Final Office Action, U.S. Appl. No. 13/491,436, dated Feb. 13, 2015, 32 pages.

(Continued)

*Primary Examiner* — Adriana Figueroa
*Assistant Examiner* — Jessie T Fonseca
(74) *Attorney, Agent, or Firm* — Kilpatrick Townsend & Stockton LLP

(57) ABSTRACT

A PV module framing and coupling system which enables the attachment of PV modules to a roof or other mounting surface without requiring the use of separate structural support members which attach directly to and span between multiple PV modules in a formed PV array and a cable management system that holds, directs, organizes, and otherwise manages cables, wires, cord, and similar components of and relating to a PV array.

12 Claims, 48 Drawing Sheets

(56) References Cited

U.S. PATENT DOCUMENTS

| | | | |
|---|---|---|---|
| 2011/0070765 A1* | 3/2011 | Kobayashi | F24J 2/5207 |
| | | | 439/387 |
| 2011/0271999 A1 | 11/2011 | Almogy | |
| 2012/0085394 A1 | 4/2012 | McPheeters et al. | |
| 2012/0192925 A1* | 8/2012 | Grushkowitz et al. | 136/251 |
| 2012/0304556 A1 | 12/2012 | Teller et al. | |
| 2013/0091786 A1 | 4/2013 | DuPont et al. | |
| 2013/0102165 A1 | 4/2013 | DuPont | |
| 2013/0140416 A1 | 6/2013 | West et al. | |
| 2013/0206929 A1* | 8/2013 | Kobayashi | H02G 3/32 |
| | | | 248/74.1 |
| 2014/0000085 A1 | 1/2014 | Teller et al. | |
| 2014/0000186 A1* | 1/2014 | Yen | F16B 5/0635 |
| | | | 52/173.3 |
| 2014/0003861 A1 | 1/2014 | Cheung et al. | |
| 2014/0220834 A1* | 8/2014 | Rizzo | H01L 31/042 |
| | | | 439/834 |
| 2014/0326838 A1 | 11/2014 | West et al. | |

OTHER PUBLICATIONS

Final Office Action, U.S. Appl. No. 13/961,723, dated Jul. 17, 2015, 16 pages.
Final Office Action, U.S. Appl. No. 14/194,607, dated Aug. 19, 2015, 19 pages.
HellermannTylon—"Edge Clip and Tape Clip", retrieved Feb. 27, 2014, 1 page.
HellermannTylon—"Edge Clip Cable Clamp", retrieved Feb. 27, 2014, 1 page.
HellermannTylon—"Metal Edge Clip", retrieved Feb. 27, 2014, 1 page.
HEY Clip Sun Runner 2 Series Cable Clips, retrieved Feb. 27, 2014, 1 page.
HEY Clip Sun Runner EZ Cable Clip, retrieved Feb. 27, 2014, 1 page.
Ironridge, XRL and XRS Rail Wire Clips, online catalog at http://www.altestore.com/store/solar-panel-mounts-trackers/roof-mounts-for-solar-panels/ironridge-XRS-Mount-System/ironridge-XRL-and-XRS-wire-clips-polybag-20pcs/p9109/ , 201, 1 page.
Non-Final Office Action, U.S. Appl. No. 13/491,436, dated Apr. 23, 2014, 21 pages.
Non-Final Office Action, U.S. Appl. No. 13/491,436, dated Sep. 10, 2015, 20 pages.
Non-Final Office Action, U.S. Appl. No. 13/961,723, dated Jan. 14, 2015, 34 pages.
Non-Final Office Action, U.S. Appl. No. 14/194,607, dated Jan. 28, 2015, 25 pages.
Wiley, Advancing Renewable Technology, "Wire Management", retrieved Feb. 27, 2014, 1 page.

* cited by examiner

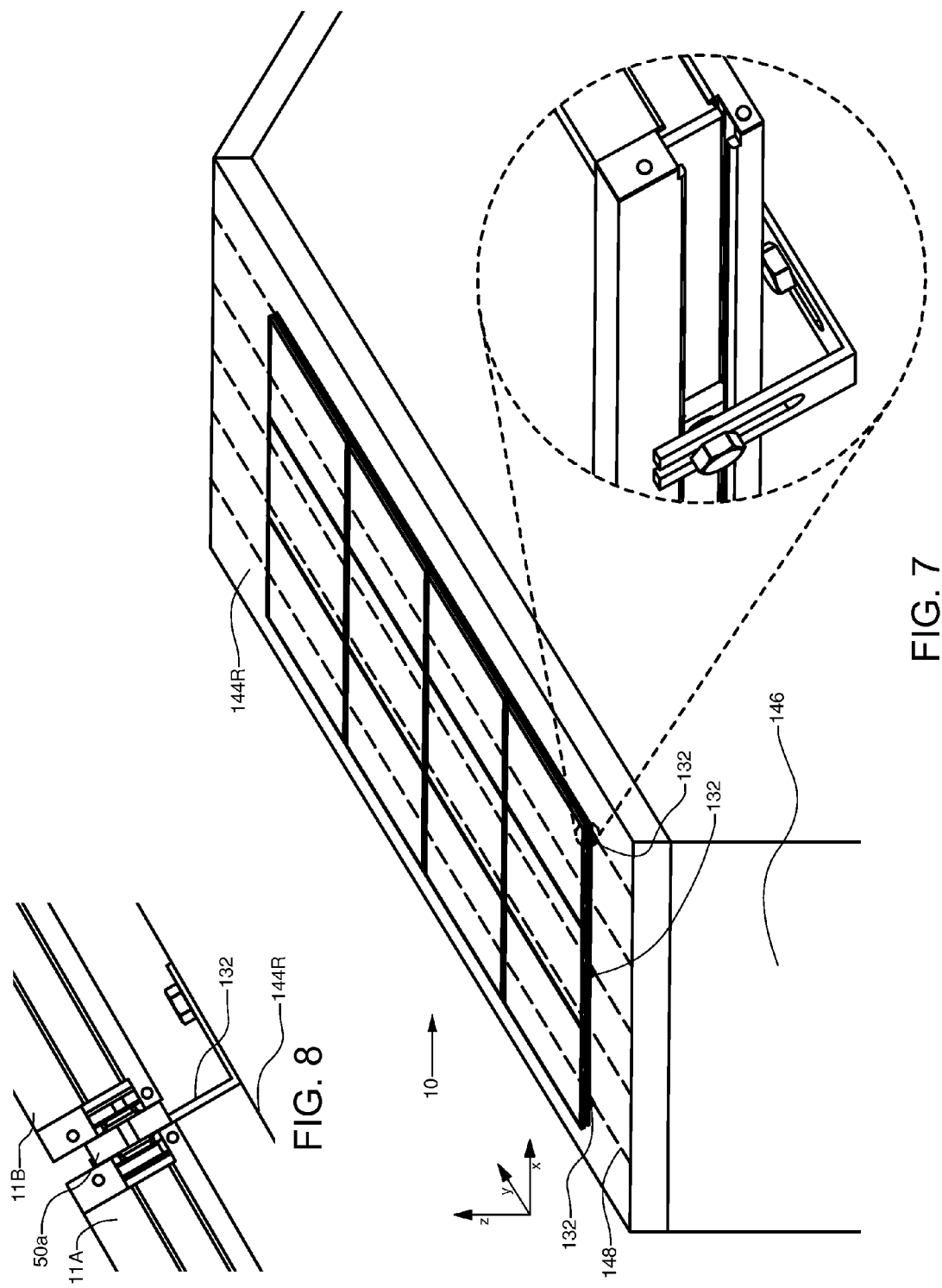

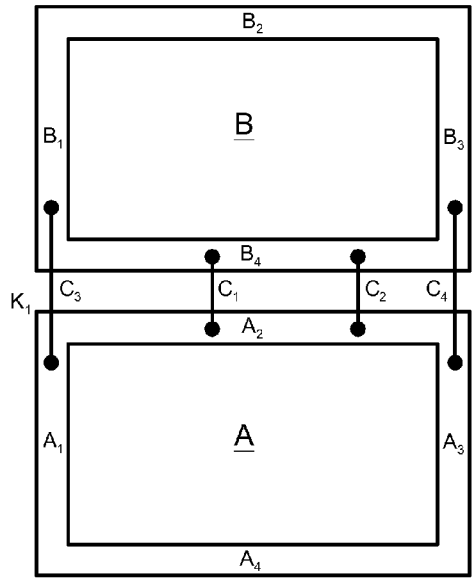
FIG. 12
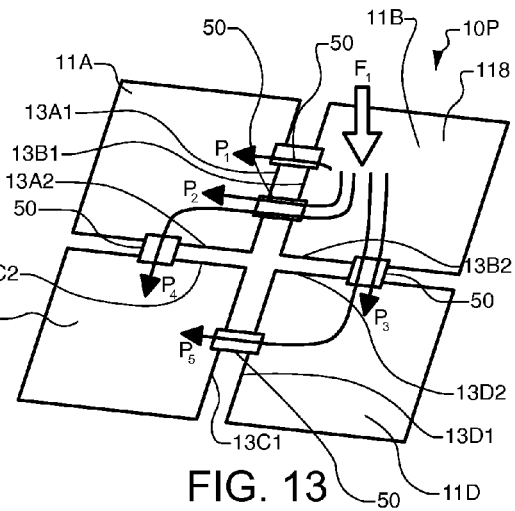
FIG. 13
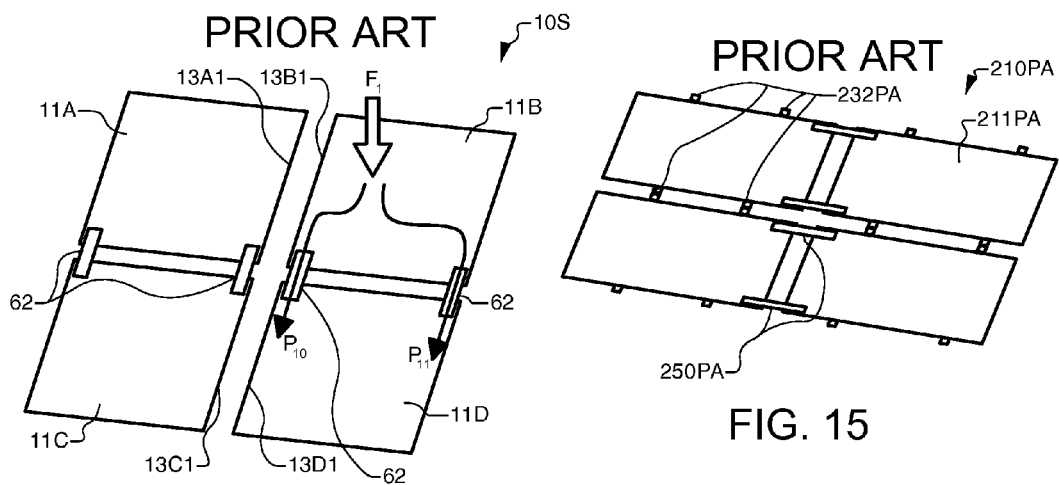
FIG. 14
FIG. 15

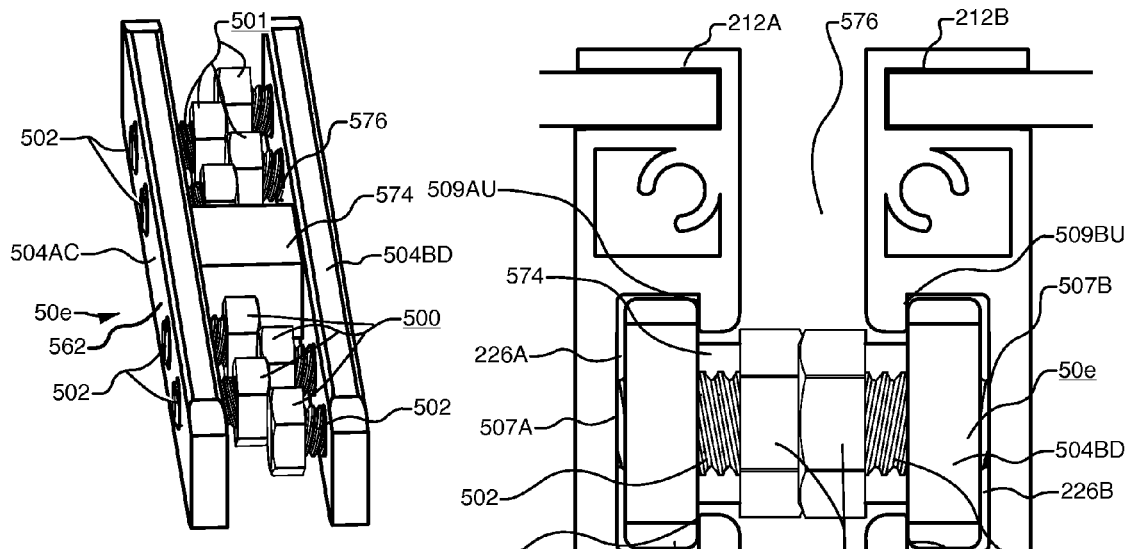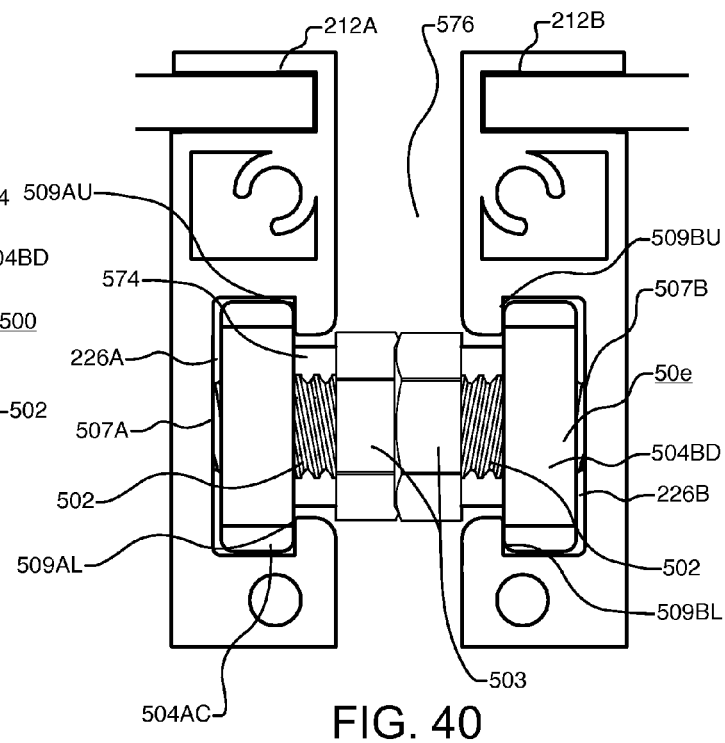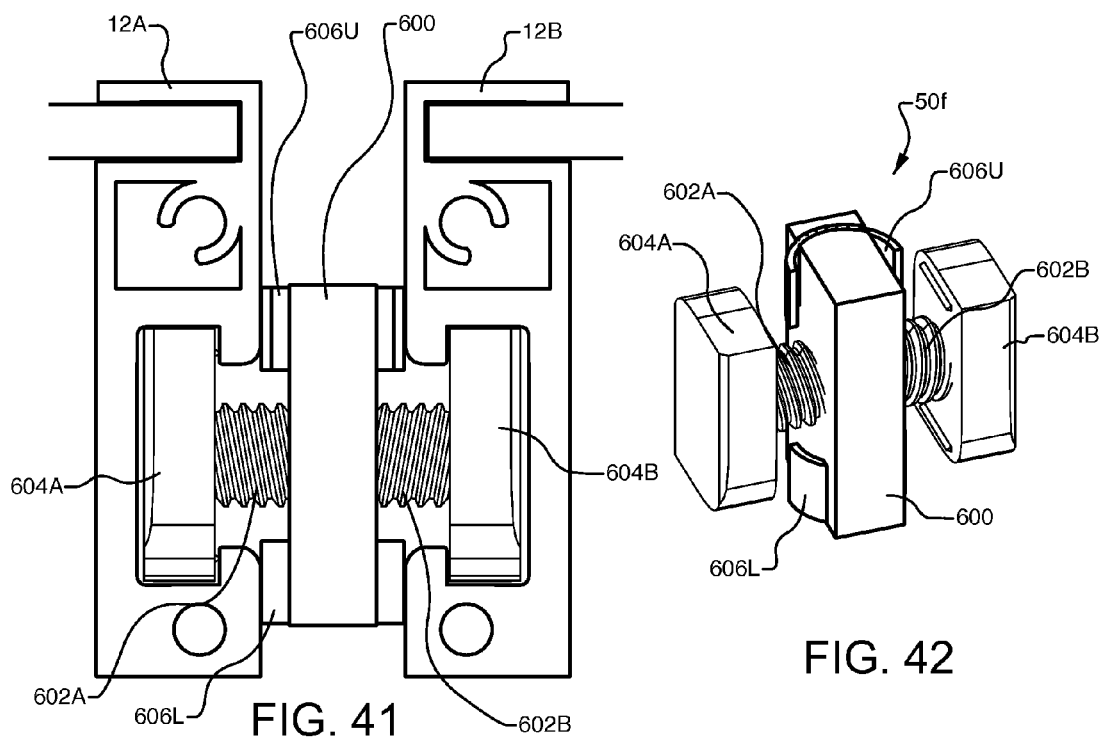
FIG. 39
FIG. 40
FIG. 41
FIG. 42

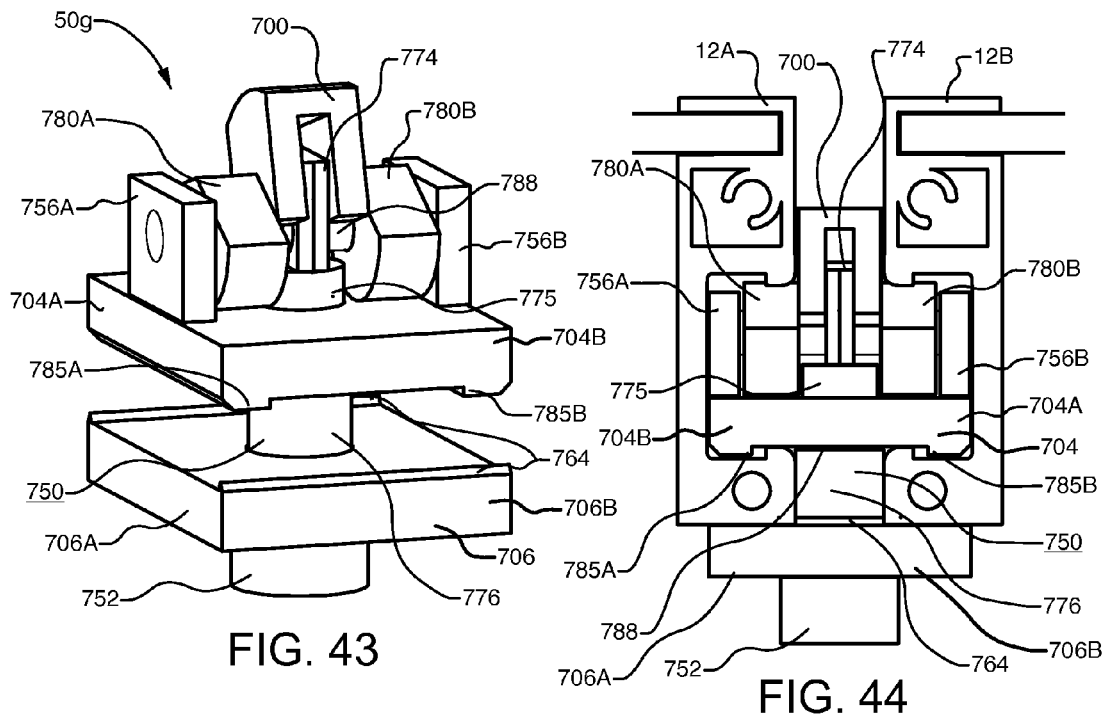
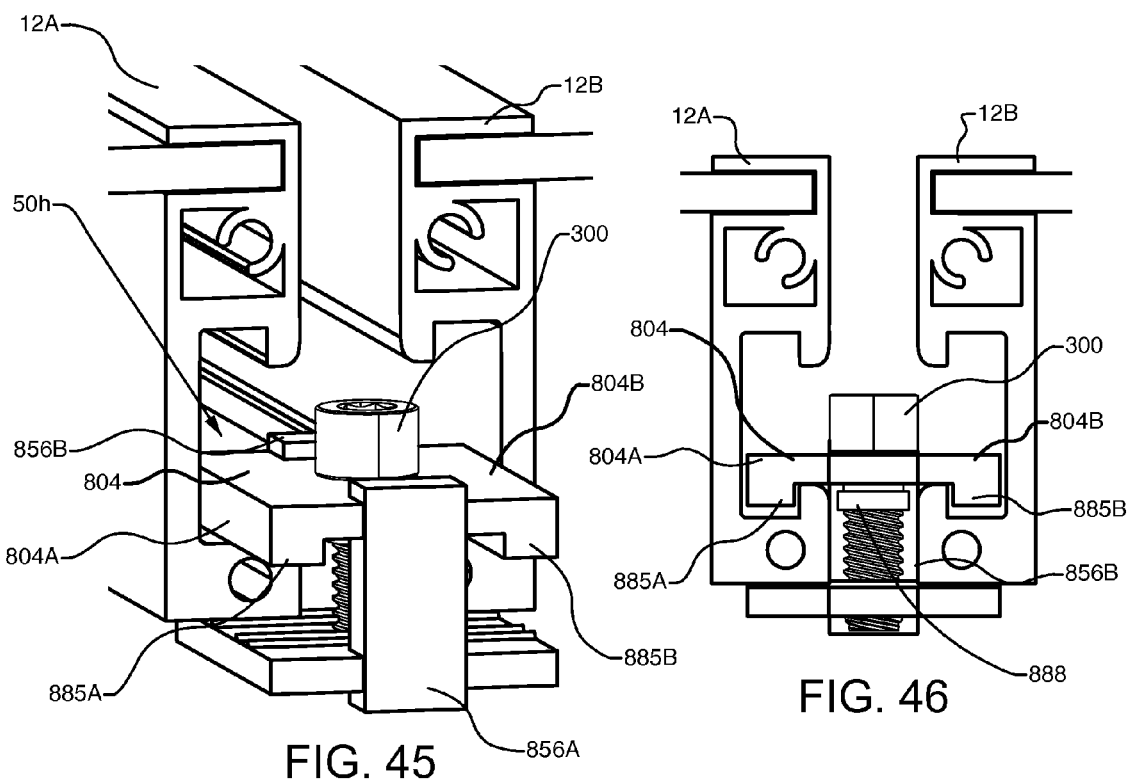

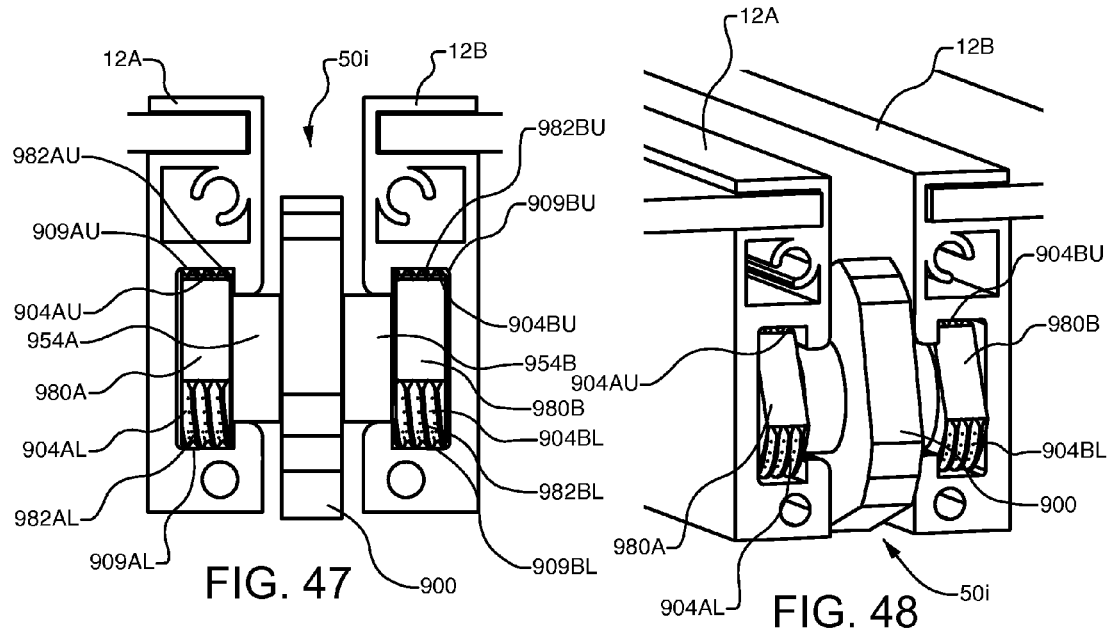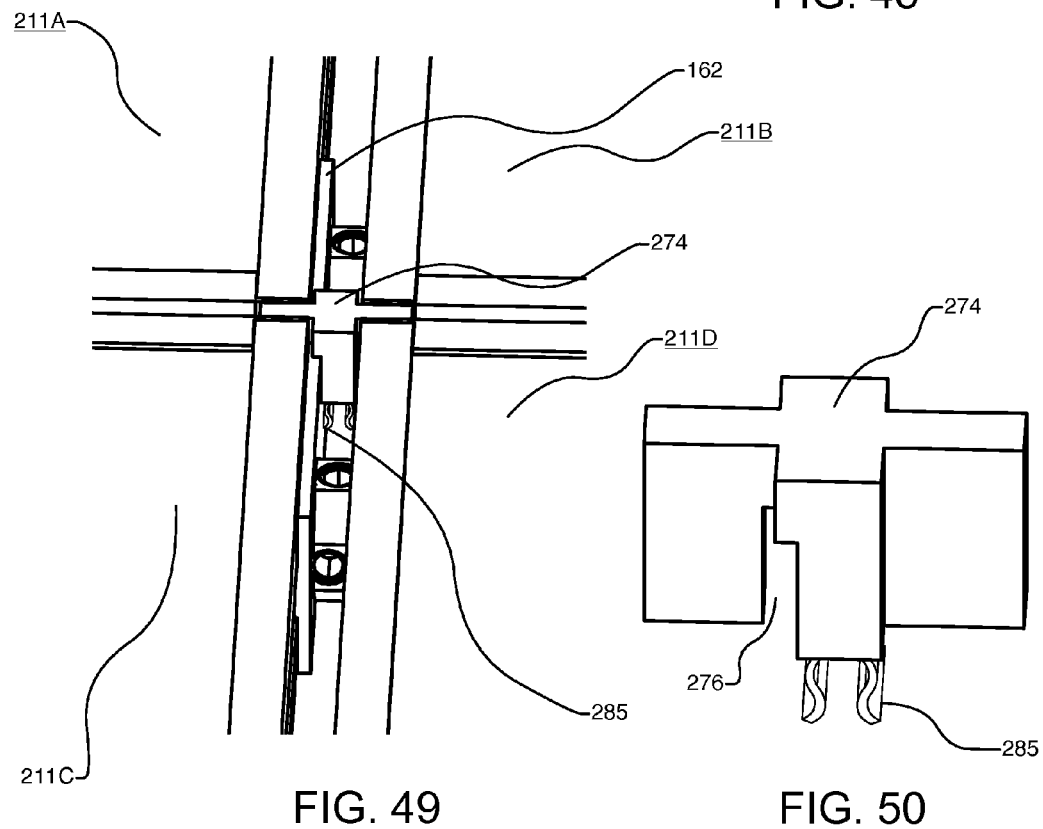

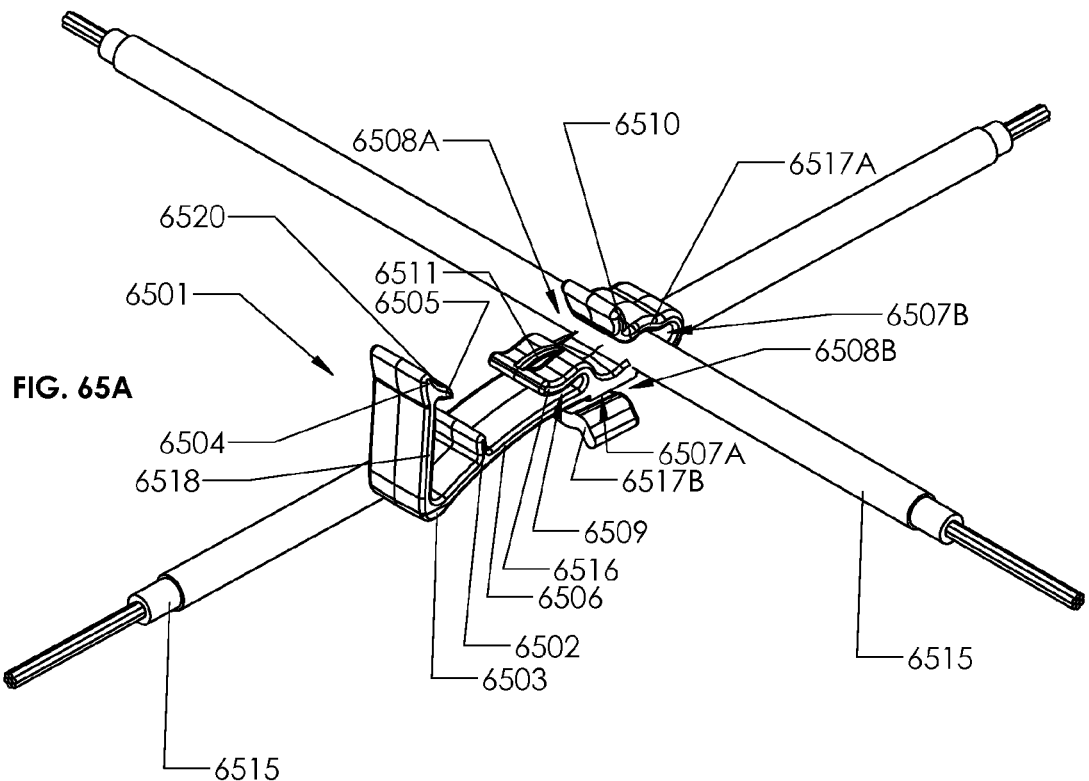
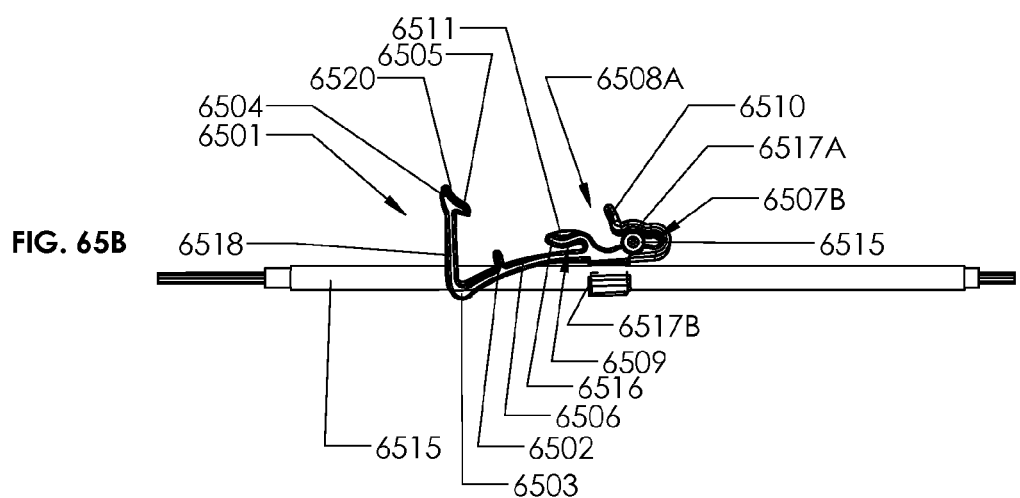

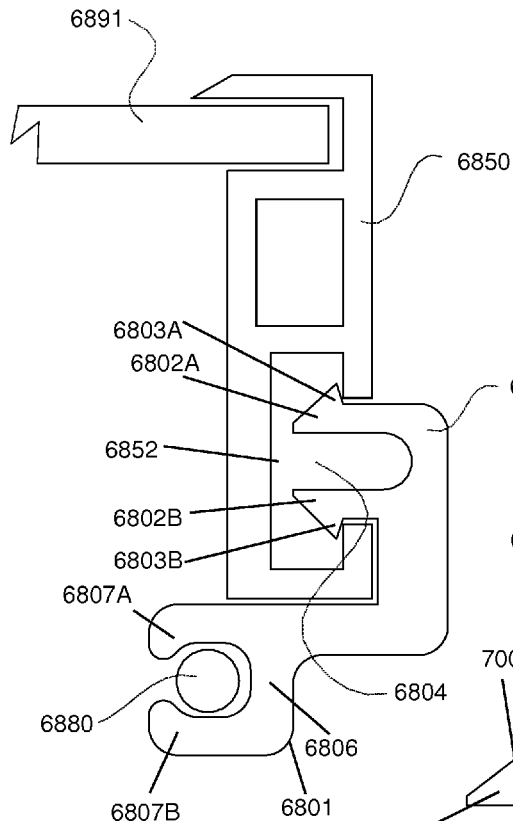
FIG. 68
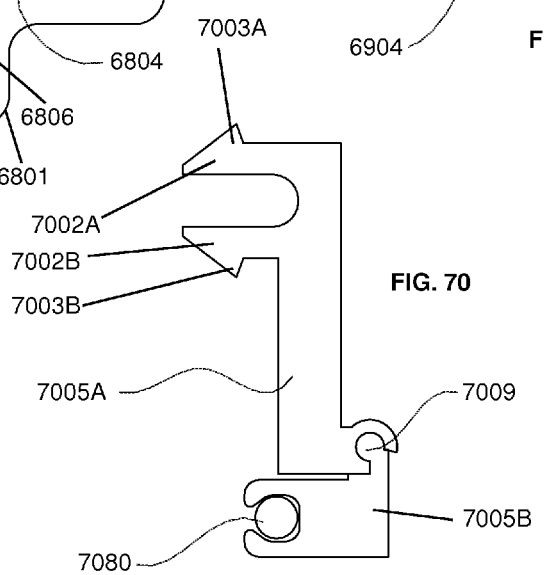
FIG. 69
FIG. 70

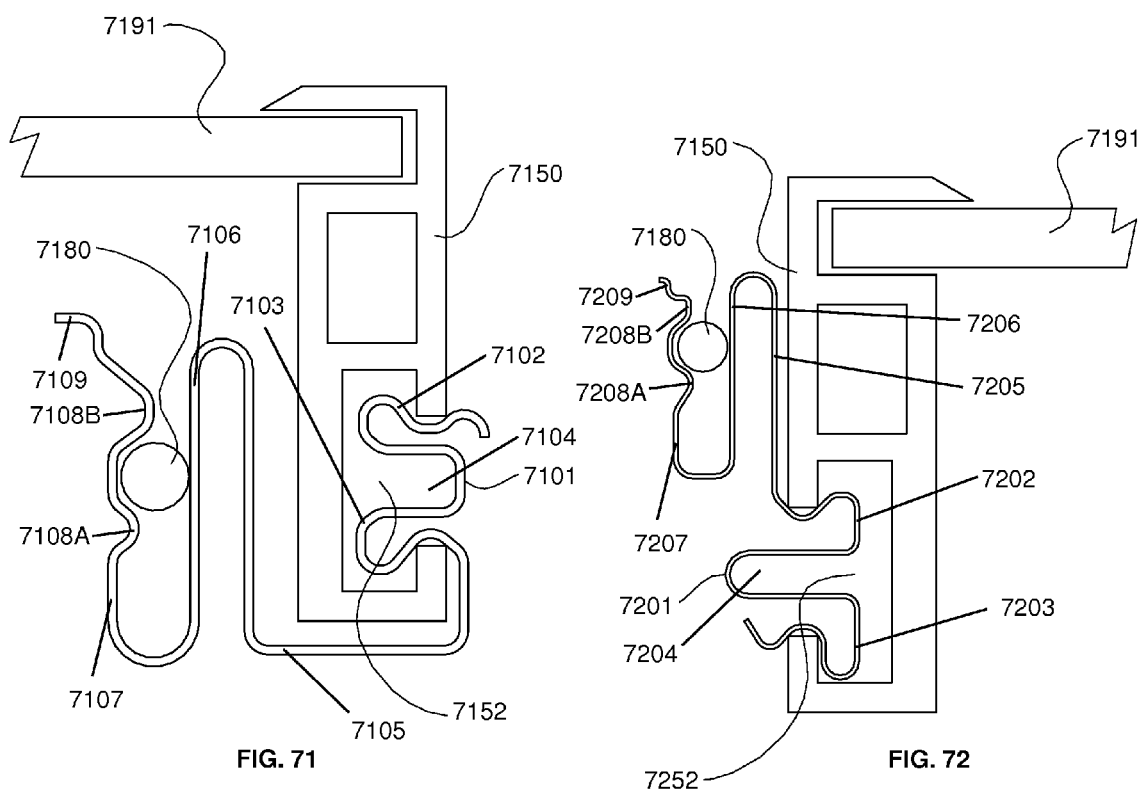

US 9,911,880 B2

METHOD AND APPARATUS FOR FORMING AND MOUNTING A PHOTOVOLTAIC ARRAY

CROSS REFERENCES

The present application is a continuation-in-part of application U.S. patent application Ser. No. 13/351,397, filed Jan. 17, 2012, which is a continuation of application Ser. No. 12/594,935 filed Oct. 6, 2009, now U.S. Pat. No. 8,109,048, issued Feb. 7, 2012. This application also claims the benefit of the filing date of U.S. Provisional Patent Application Ser. No. 61/771,050, filed Feb. 28, 2013. The foregoing applications are incorporated by reference in their entirety as if fully set forth herein.

BACKGROUND

Photovoltaic (PV) modules and related mounting hardware are well known and in widespread use. The most common mass-produced PV modules in use today include a laminated portion, or PV laminate, and a frame portion, and are designed specifically to convert light into electricity. The PV laminate portion is for encapsulating solar cells in a substantially flat, weather-tight envelope comprising a laminated construction of various layers including but not limited to glass, clear plastic, encapsulant material (like EVA), active photovoltaic material, interconnecting conductors between solar cells, and a protective backsheet (like PVF film or glass). Photovoltaic laminates are commonly manufactured today in rectilinear shapes like squares, rectangles, triangles, and trapezoids and, due to their fragile nature, are usually completely enclosed by a permanent, substantially rigid, glued-on frame portion which holds and protects the delicate edges of the PV laminate portion and provides a means of supporting the PV laminate and attaching it to other objects without damaging the PV laminate. The combination of the PV laminate portion and the glued-on frame portion is referred to herein as a PV module or framed PV module. The present invention relates to integral frames for standard PV laminates, and to the associated mounting hardware which attaches to the integral frames for the purpose of securing the PV module to a roof or support structure.

U.S. Pat. No. 5,571,338 to Kadonome, et al. discloses a photovoltaic module comprising a photovoltaic panel having a top edge and a bottom edge. An exterior frame structure attached to edges of the photovoltaic panel defines an upwardly open groove extending along at least the top and bottom edges of the panel to direct rain water away from the underside of the panel.

U.S. Pat. No. 7,406,800 to Cinnamon describes an integrated module frame and racking system for a solar panel. The solar panel comprises a plurality of solar modules and a plurality of series couplings or splices (in the form of series couplings) for coupling the plurality of solar modules together. The plurality of splices provide a way to make the connected modules mechanically rigid both during transport to the roof and after mounting for the lifetime of the system, provide wiring connections between modules, provide an electrical grounding path for the modules, provide a way to add modules to the panel, and provide a way to remove or change a defective module. Connector sockets are provided on the sides of the modules to simplify the electrical assembly of modules when the modules are connected together with splices.

U.S. Patent Application 20070074755 by Eberspacher, et al. teaches a photovoltaic module with a rigidizing backplane. A solar cell module includes one or more photovoltaic (PV) cells arranged in a substantially planar fashion. Each PV cell has a front side and a back side. The PV cells are adapted to produce an electric voltage when light is incident upon the front side. A rigid back plane is attached to the PV cells such that the back plane provides structural support from the back side. The rigid back plane includes a structural component having a plurality of voids.

The foregoing examples of the related art and limitations related therewith are intended to be illustrative and not exclusive. Other limitations of the related art will become apparent to those of skill in the art upon a reading of the specification and a study of the figures.

SUMMARY

The method and apparatus for forming and mounting a photovoltaic (PV) array of this invention is disclosed and provides, without limitation, (i) a PV module framing and coupling system which enables the attachment of PV modules to a roof or other mounting surface without requiring the use of separate structural support members which attach directly to and span between multiple PV modules in a formed PV array, and (ii) a cable management system that holds, directs, organizes, and otherwise manages cables, wires, cord, and similar components of and relating to a PV array. The following embodiments and aspects thereof are described and illustrated in conjunction with systems, apparatus, tools, and methods which are meant to be exemplary and illustrative, not limiting in scope.

One embodiment, by way of non-limiting example, may provide a slidable parallel coupling for securely interlocking the outside surfaces of parallel frame members together in a side to side arrangement, thereby enabling the formation of a PV array with improved structural load distribution. The inventive coupling member may attach to a slot in the frame at substantially any position along the length of the frame thereby enabling the interconnection of adjacent PV modules along both an x and y axis. The inventive apparatus may further provide a rotating portion and locking portion for coupling to frame attachment, mounting brackets for direct connection to a mounting surface, grounding teeth for the automatic creation of a reliable two axis grounding matrix, and a rapid twist-lock engagement means for reliably interlocking and aligning PV modules in the array.

Yet another one or more embodiments provides a photovoltaic module comprising: a frame supporting a photovoltaic laminate, the frame comprising an outer portion and an inner portion, the inner portion located substantially beneath the photovoltaic laminate; and a wire clip comprising a wire channel for holding a wire, an arm portion extending away from the wire channel, a slot portion near a first end of the arm portion, and a catch portion near a second end of the arm portion; where the catch portion engages the outer portion and the slot portion engages a portion of the frame underneath the photovoltaic module to securely attach the wire clip to the frame. Various additional embodiments include: (a) the wire clip being adjustably positionable along the frame; (b) the wire clip further comprising a brace acting as a fulcrum about which the arm at least partly pivots during installation of the wire clip; (c) the wire clip further comprising a trigger such that application of a force to the trigger moves the arm such that the catch snaps into the outer portion; (d) the outer portion comprising a groove; and (e) the portion of the frame underneath the photovoltaic module comprising a flange. Such embodiments may connect to a frame and hold wires, cord, cables, or similar components. Such embodiments may be adjustably positionable on the frame. Such embodiments may facilitate the collection, catching, trapping, or gathering of wires, cord, cables, or similar components. The benefits discussed above of these embodiments are exemplified, without limitation, in FIGS. 57, 57A, 61, 65A, and 65B and their descriptions.

And, yet another one or more embodiments provides a photovoltaic module comprising: a frame supporting a photovoltaic laminate; and a wire clip attached to the frame and comprising a first wire channel for holding a first wire and a second wire channel for holding a second wire, the first wire channel oriented substantially perpendicular to the second wire channel. Various additional embodiments include: (f) the wire clip being adjustably positionable along the frame; (g) a top surface of a light-receiving side of the photovoltaic laminate defining a plane, the first wire being held in the first wire channel substantially parallel with the plane, the second wire being held in the second wire channel substantially parallel with the plane and substantially perpendicular to the first wire; (h) the frame comprising a first side and a second side orthogonally connected to the first side, the wire clip attaching to the second side, the first wire channel holding the first wire such that the first wire runs substantially parallel to the second side, and the second wire channel holding the second wire such that the second wire runs substantially perpendicular to the second side; (i) the first wire being held closer to the photovoltaic laminate than the second wire such that the first and second wires non-interferingly cross paths; and (j) the second wire being held closer to the photovoltaic laminate than the first wire such that the first and second wires non-interferingly cross paths. Such embodiments, in addition to aforementioned features and uses, may align multiple wires, cord, cables, or similar components in multiple directions and at varying distances from a photovoltaic laminate and/or any portion of a frame. The benefits discussed above of these embodiments are exemplified, without limitation, in the Wire Clips section, below, and in FIGS. 65A, and 65B and their descriptions.

In addition to the exemplary aspects and embodiments described above, further aspects and embodiments will become apparent by reference to the figures and by study of the following detailed descriptions.

BRIEF DESCRIPTION OF THE DRAWINGS

Demonstrative embodiments are illustrated in referenced figures and drawings. It is intended that the embodiments and figures disclosed herein are to be considered illustrative rather than restrictive.

FIG. 7 is a perspective view of building with a PV array attached to a roof.

FIG. 8 is a side view of the PV array of FIG. 7 at a larger scale.

FIG. 12 is a simplified top view of two adjacent rectangular frames.

FIGS. 13-14 show generic PV arrays comprising four PV modules with adjacent frame members.

FIG. 15 shows a prior art strutless PV array.

FIGS. 39-40 are a perspective view and a cross section cut between two interlocked PV modules.

FIGS. 41-42 are a cross section cut between two interlocked PV modules and a perspective view of a coupling.

FIGS. 43-44 are a perspective view and a cross section cut between two interlocked PV modules.

FIGS. 45-46 are a perspective view and a cross section cut between two interlocked PV modules.

FIGS. 47-48 are a cross section cut between two interlocked PV modules and a perspective view respectively for an alternate embodiment.

FIGS. 49-50 depict a further alternate embodiment.

FIG. 65A is a perspective view of a wire clip engaging two wires.

FIG. 645B is a side view of a wire clip engaging two wires.

FIG. 68 is a side view of an embodiment of a wire clip.

FIG. 69 is a side view of another embodiment of a wire clip.

FIG. 70 is a side view of yet another embodiment of a wire clip.

FIG. 71 is a side view of still another embodiment of a wire clip.

FIG. 72 is a side view of another embodiment of a wire clip.

DETAILED DESCRIPTION OF THE INVENTION

Terms

Figure 1:
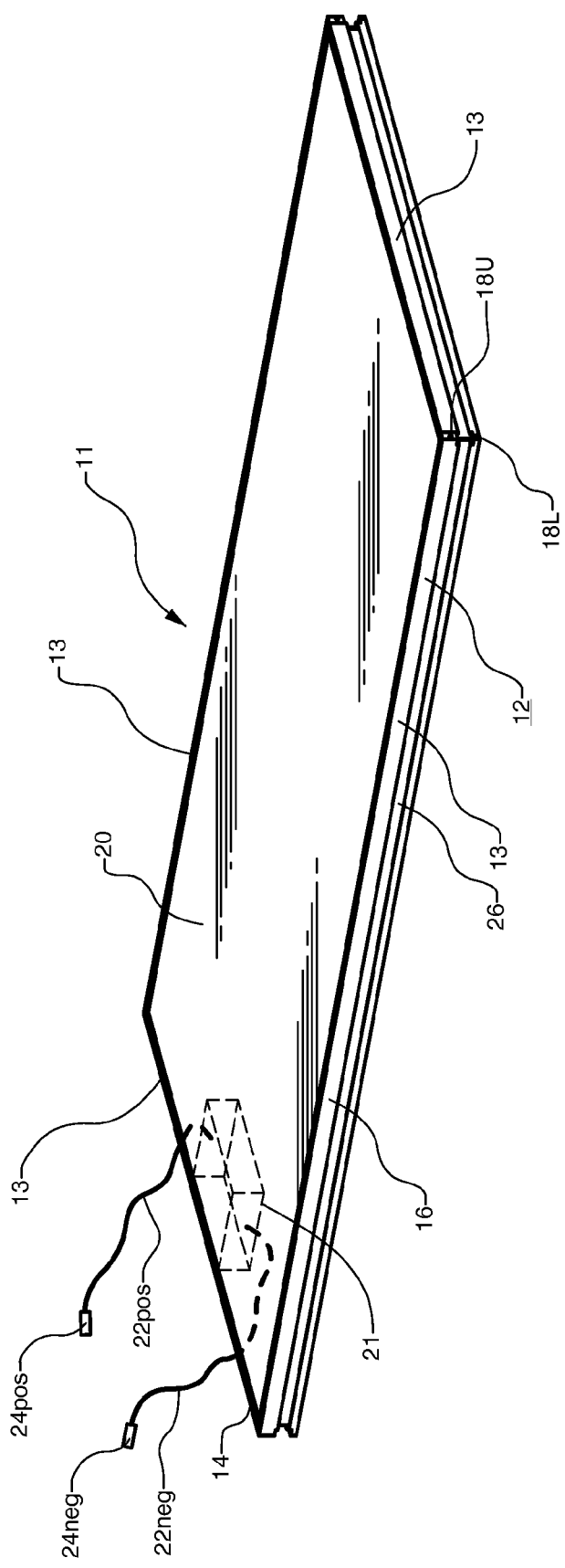
FIG. 1 is a perspective view of a PV module with a hybrid, strut-like frame.

While various terms may have their ordinary meaning or particular meaning in the art, for ease of understanding there is provided herein, both below and at other locations in this specification, a non-limiting explanation as to the minimum scope intended for understanding of the present specification. Terms may be in singular or plural or any tense while retaining the same general meaning.

Connecting, connects, or connect refers to linking, joining, uniting or fastening two or more things together, to become joined or united.

Disengage refers to detaching, freeing, loosening, extricating, separating or releasing from something that holdsfast, connects, couples or entangles.

Engage refers to contacting, interlocking or meshing one or more items, mechanisms, objects, things, structures or the like.

Extending refers to spreading or stretching forth, to cause to reach (as in distance or scope), to cause to be of greater area or volume, to stretch out in distance, space, or time.

Flexible portion refers to a part, segment or portion of a device or feature that is capable of bending or deforming easily, such as made with a supple, pliable, pliant, or elastic material. For example, an arm of a wire clip may flex as the wire clip connects to a frame as exemplified in FIGS. 56, 57, and 85 and their descriptions.

Groove refers to a long, narrow cut, rut, indentation, channel, furrow, gutter, slot or depression often used to guide motion or receive a corresponding ridge or tongue. Some grooves in the frame wall of a PV module are exemplified at part 5722 in FIG. 57 and its descriptions.

Inside portion or inner portion refers to, in regards to a frame discussed below, that portion of a frame not readily accessible from a position adjacent to said photovoltaic module, referring without limitation to that portion of the frame substantially beneath a photovoltaic laminate, excepting any groove on the outermost surface of the frame or portions of that groove which may appear beneath the laminate. An inside portion or inner portion is exemplified at 5798 in FIG. 57.

Near refers to closely related or associated, in a close manner, within a short distance or interval in space or time, and/or closer of two or more items or positions.

Opening refers to something that is open, as breach, aperture; an open width or span; an open space serving as a passage or gap; a breach or aperture; a vacant or unobstructed space, such as one that will serve as a passageway; and/or a gap. Openings, without limitation, are exemplified at parts 5608A, 5608B, and 5608C in FIG. 56, and its descriptions.

Outside portion or outer portion refers to, in regards to a frame discussed below, (i) the surface of the frame that features a groove, as well as (ii) the groove itself and (iii) all of the surfaces of the groove. Alternatively and without limitation, inside portion or inner portion refers to that portion of a frame accessible from a position adjacent to said photovoltaic module. An outside portion or outer portion is exemplified at 5799 in FIG. 57.

PV array refers to a plurality of photovoltaic modules connected together often in a pattern of rows and columns with module sides placed close to or touching other modules. An example PV array is exemplified at array 10 in FIG. 7, and its descriptions.

PV module refers to a photovoltaic module (sometimes referred to as a solar panel or photovoltaic panel) in a packaged interconnected assembly of solar cells, also known as photovoltaic cells. A plurality of PV modules are commonly used to form a larger photovoltaic system referred to as a PV array, to provide electricity for commercial, industrial and residential applications.

Figure 55:
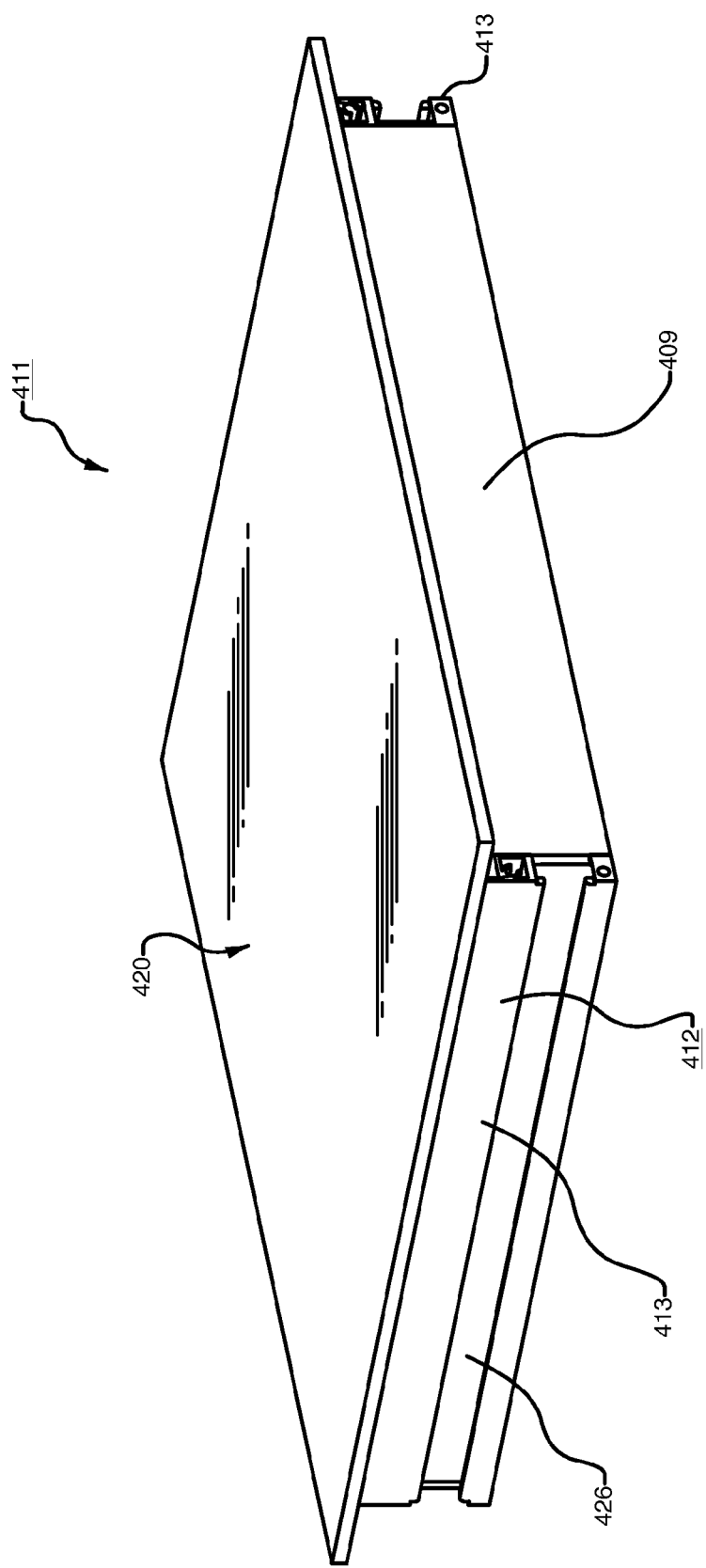
FIG. 55 depicts a perspective view of a further alternate embodiment of a PV module.

Referring to FIGS. 1 through 55, wherein like reference numerals refer to like components in the various views, there is illustrated therein a new and improved framing and mounting system for photovoltaic arrays, generally denominated 10 herein. While various terms may have their ordinary meaning or particular meaning in the art, for ease of understanding there is provided herein, both below and at other locations in this specification, a non-limiting explanation as to the minimum scope intended for understanding of the present specification. Terms may be in singular or plural or any tense while retaining the same general meaning Photovoltaic is abbreviated as "PV". PV laminate refers to an encapsulated group of solar cells. Frame refers to a group of frame members (typically four for a rectangular-shaped PV module) which support and provide rigidity to a PV laminate. PV module refers to a single, one-piece, individually deployable electricity generating device comprising a PV laminate, a frame, and at least two output wires. A PV array refers to a group of PV modules which are deployed together and are a part of the same electricity generating system. A mounting rail or strut is a structural member which connects to the bottom of a PV module via the use of a separate fastener (such as a coupling, bolt, etc.) and which serves to mechanically link two or more PV modules together, thereby providing structural support for the modules and also providing a means for connection to a mounting surface.

First Embodiment—Structure

FIGS. 1-24 depict a first embodiment of the present invention. FIG. 1 provides a perspective view of a photovoltaic or PV module 11 with a hybrid, strut-like frame 12. Each PV module is made of substantially identical construction. As is typical in the art, frame 12 comprises four frame members 13 which are assembled around PV laminate 20 and secured by optional adhesive between frame members 13 and laminate 20 and frame screws 18U, 18L at the corners. The complete PV module 11 is typically assembled in this way at a PV module manufacturing facility; then a plurality of one-piece PV module assemblies 11 are transported to a particular job site and mounted to a building or other structure to form a PV array 10. In other embodiments we contemplate the assembly of frames 12 around PV laminates 20 at the final installed location. Thus, the exact location of the manufacturing and assembly steps is non-critical with regards to proper implementation of the present invention.

Hybrid, strut-like frame 12 may include substantially similar construction on all four sides of PV module 11. Top surface 14 of frame 12 is the surface which faces the same direction as the cells (not shown) in PV laminate 20. Frame outside surface 16 comprises a multifunction female channel portion or slot 26 for the purpose of interlocking PV modules 11 together and connecting to a roof or other mounting surface as will be discussed below. Frames 12 as shown here have the corners cut to allow for a typical butt joint. In other embodiments the frames are joined at the corners via a mitre joint. Furthermore, any of the typical methods for joining framing members at the corners is applicable and covered in the scope of the present invention. Corners may also be fashioned to allow insertion of couplings from the corner and to allow smaller couplings to slide around the corner in a formed array. PV module 11 further comprises positive 22pos and negative 22neg output cables with positive 24pos and negative 24neg plugs as are typical in the art. In other embodiments multi-conductor cables are utilized. Output cables 22pos, 22neg originate in a rear-mounted electrical box 21.

Figure 2:
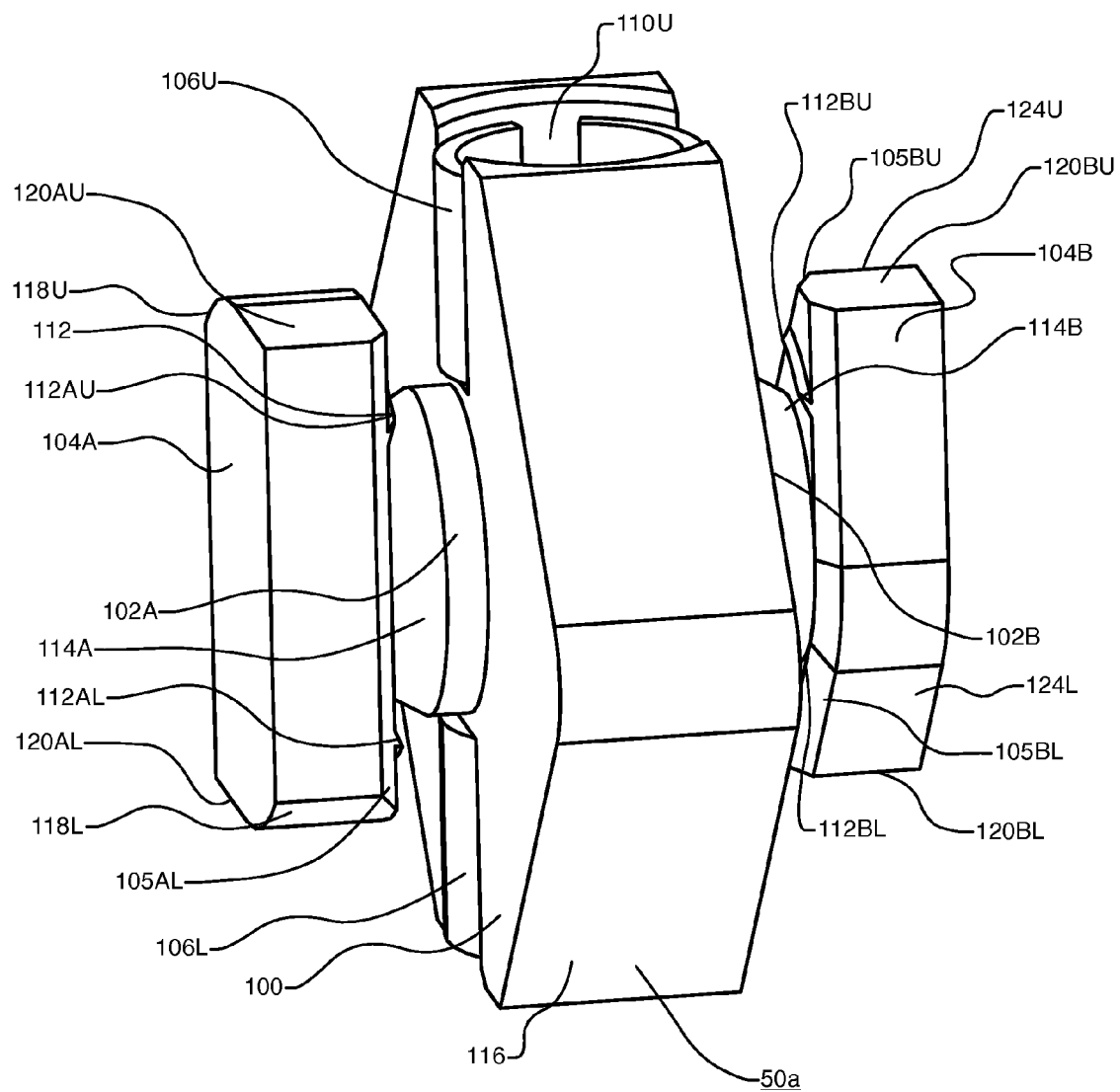
FIG. 2 is a perspective view of a series coupling.

FIG. 2 depicts a perspective view of an interlocking device or parallel coupling 50a which may be utilized to interlock the outside surfaces 16 of two adjacent PV module frames 12 via a twist-lock action. This first embodiment contemplates a one-piece parallel coupling 50a comprising a rotating portion 100 with shaft portions 102A, 102B protruding from each side. The end of shaft portion 102A comprises a first key or locking portion 104A, and the end of shaft portion 102B comprises a second key or locking portion 104B. Both locking portions 104A, 104B rotate with the shaft portions 102A, 102B upon rotation of rotating portion 100 with a wrench.

Rotating portion 100 further comprises an optional top spring 106U and bottom spring 106L to help account for variations in material and assembly tolerances, to mitigate thermal expansion and contraction variance, and to provide a force which resists the unlocking of two interlocked PV modules 11. Bores 110U and 110L (not viewable here) in rotating portion 100 are provided to house and structurally support springs 106U, 106L respectively. Springs 106U, 106L are shown here as cylindrical springs and may be made from spring steel or other suitable spring material. Other embodiments contemplate springs of other types and shapes, and still other embodiments provide coupling 50a without springs since frame 12 under compression provides some spring force. For example, disc washers, wave washers, star washers, finger springs, spiral springs, polyurethane springs, and others are all suitable for use with the present embodiment under discussion. Rotating portion 100 comprises four flat faces 116 so that rotating portion 100 can be easily turned with a typical wrench from above. Preferably the number of flat faces could vary and rotating portion 100 could be simply rounded, slotted, bored, or knurled depending on the type of wrench which is utilized. Shaft portions 102A, 102B further comprise optional reduced diameter portions 114A, 114B to help guide and hold a free PV module 11 which is being moved into position for coupling. Rotating portion 100 (except for springs 106U, 106L), shaft portions 102A, 102B, and locking portions 104A, 104B may be machined from a single piece of solid metal, such as steel or aluminum. In another embodiment rotating portion 100 may be made of a light-weight material such as plastic. However, multiple components could be assembled together and various materials could be used to form the various portions of coupling 50a as described herein.

Figure 3:
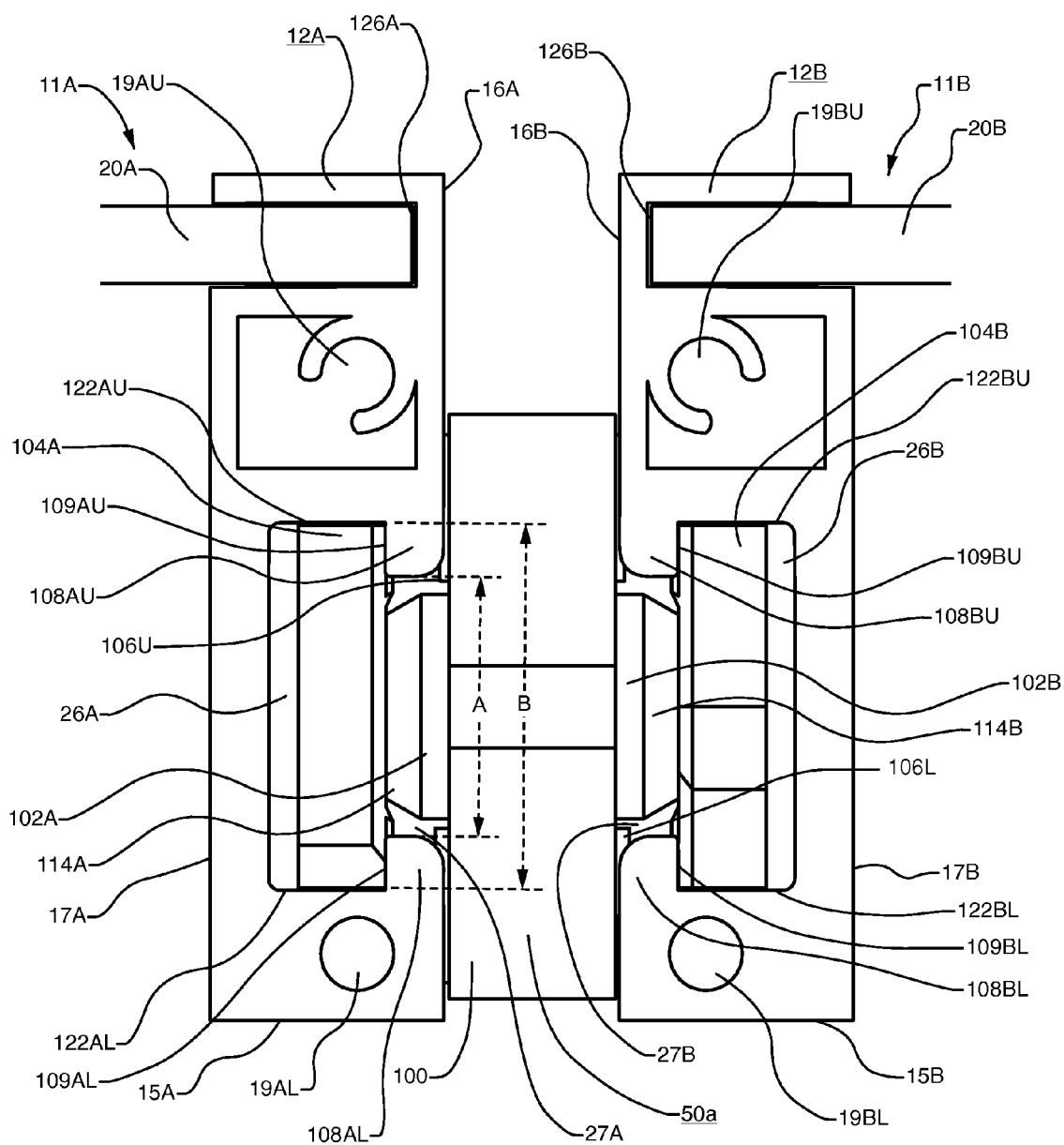
FIG. 3 is a cross-section cut through two adjacent PV modules.

Expanding the discussion now to further include FIG. 3, which depicts a cross-section cut through two adjacent PV modules 11A, 11B which are coupled together with a coupling 50a, it can be seen that first locking portion 104A may be specially shaped to be the first of the two locking portions 104A, 104B which is inserted into a first slot 26A of PV module 11A. Locking portion 104A may be provided with curved surfaces 118U, 118L on opposite corners which allow locking portion 104A to be rotated in a clockwise manner inside of slot 26A until locking portion stops 120AU, 120AL contact upper 122AU and lower 122AL inside surfaces of slot 26A respectively. With reference to FIGS. 16-24, which will be discussed in more detail below, the width of locking portion 104A is slightly less than the height A of openings 27A, 27B in slots 26A, 26B, while the length is approximately equal to the height B inside of slot 26A. Therefore locking portion 104A may be inserted when it is oriented in a first position 91 and captured behind male features or flanges 108AU, 108AL when it is rotated clockwise. After approximately 90 degrees of clockwise rotation, when locking portion stops 120AU, 120AL are reached coupling 50a is said to be in a third position 93 (see below for discussion of an intermediate second position 92).

Accordingly, second locking portion 104B may be specially shaped to be the second of the two locking portions 104B, 104A to be inserted into a second slot 26B in PV module 11B. This first embodiment contemplates a shape for locking portion 104B which is capable of passing between male features or flanges 108BU and 108BL for approximately the first 45 degrees of clockwise rotation of coupling 50a. Thus the intermediate position of approximately 45 degrees of clockwise rotation is said to be the second position 92. The shape of locking portion 104B is similar to locking portion 104A except that material has been removed in the clearance zones 124U, 124L directly opposite curved surfaces 118U, 118L on locking portion 104A. Thus, orientation of coupling 50a in first position 91 and insertion of locking portion 104A into slot 26A followed by a rotation to second position 92 results in locking portion 104A being captured by slot 26A and locking portion 104B being correctly oriented for insertion into slot 26B. Furthermore, insertion of locking portion 104B into slot 26B followed by an additional rotation of approximately 45 degrees clockwise to third position 93 results in locking portion 104B being captured by slot 26B. Rotation ceases when locking portion stops 120AU, 120AL contact surfaces 122AU, 122AL inside slot 26A and locking portion stops 120BU, 120BL contact surfaces 122BU, 122BL inside slot 26B, and at this point the outside surfaces 16A and 16B of PV modules 11A and 11B are said to be coupled or interlocked together (these two terms are used interchangeably throughout this document). Other embodiments contemplate a number of variations on the locking portions 104A, 104B and the slots 26A, 26B. For example, some embodiments may utilize locking portions 104A, 104B which are identical in shape but simply rotated at different angles from each other relative to shaft portions 102A, 102B. Such embodiments are still capable of providing a solid interlock but do not allow removal of a single module from the middle of a completely installed PV array 10 since first position 91 can only be reached when locking portion 104B is not inside slot 26B. Other embodiments include locking portions which are shaped for different angles of rotation other than 45 and 90 as discussed above, while others have locking portions which are shaped for counter-clockwise rotation.

Locking portions 104A,104B further comprise tapered surfaces 105AU, 105AL, 105BU, and 105BL to guide them into position as coupling 50a is rotated and raised teeth 112AU, 112AL, 112BU, and 112BL for cutting into frame 12 and ensuring solid electrical ground contact between two adjacent PV modules 11 when they are coupled together. Teeth 112AU, 112AL, 112BU, 112BL also provide structural support by counteracting forces which tend to slide coupling 50a lengthwise in slots 26A, 26B. In other embodiments teeth 112 are provided in different locations than those shown here, and in still other embodiments teeth 112 are replaced by a separate grounding washer, such as a star washer, which is positioned between a portion of coupling 50a and frame 12.

As shown in FIG. 3, slots 26A, 26B from two adjacent, interlocked modules 11A, 11B comprise openings 27A, 27B which allow insertion of couplings 50a in a direction which may be substantially parallel with the plane of laminates 20A, 20B and substantially perpendicular with outside surfaces 16A, 16B. Flanges 108AU, 108AL, 108BU, 108BL, which are located near openings 27A, 27B create (by virtue of their position) inside surfaces 109AU, 109AL, 109BU, 109BL of slots 26A, 26B which are available for use by couplings 50a and brackets 132 (see below) as a bearing surface. Inside surfaces are shown here as being substantially perpendicular to PV laminate 20. However, other embodiments provide sloped and curved surfaces 109AU, 109AL, 109BU, 109BL.

FIG. 3 further reveals frame inside surfaces 17A, 17B; frame bottom surfaces 15A, 15B; frame screw holes 19AU, 19AL, 19BU, 19BL for frame screws 18B, 18U; and frame recesses 126A, 126B for capturing PV laminates 20A, 20B. This view also shows how substantially constant spacing between PV modules 11 in an array 10 is automatically determined by the width of rotating portion 100, with minor material and assembly tolerance issues being allowed by variable compression amounts on springs 106U, 106L. For example, manufacturing of a perfectly square PV module 11 is very difficult. Therefore it is common for PV modules to have widths and lengths that vary by up to ⅛". In prior art systems this variance is not accounted for. The springs 106U, 106L as shown here provide a degree of compliance that helps to mitigate the compounding of tolerance errors and therefore major problems with proper alignment during installation.

Figure 4:
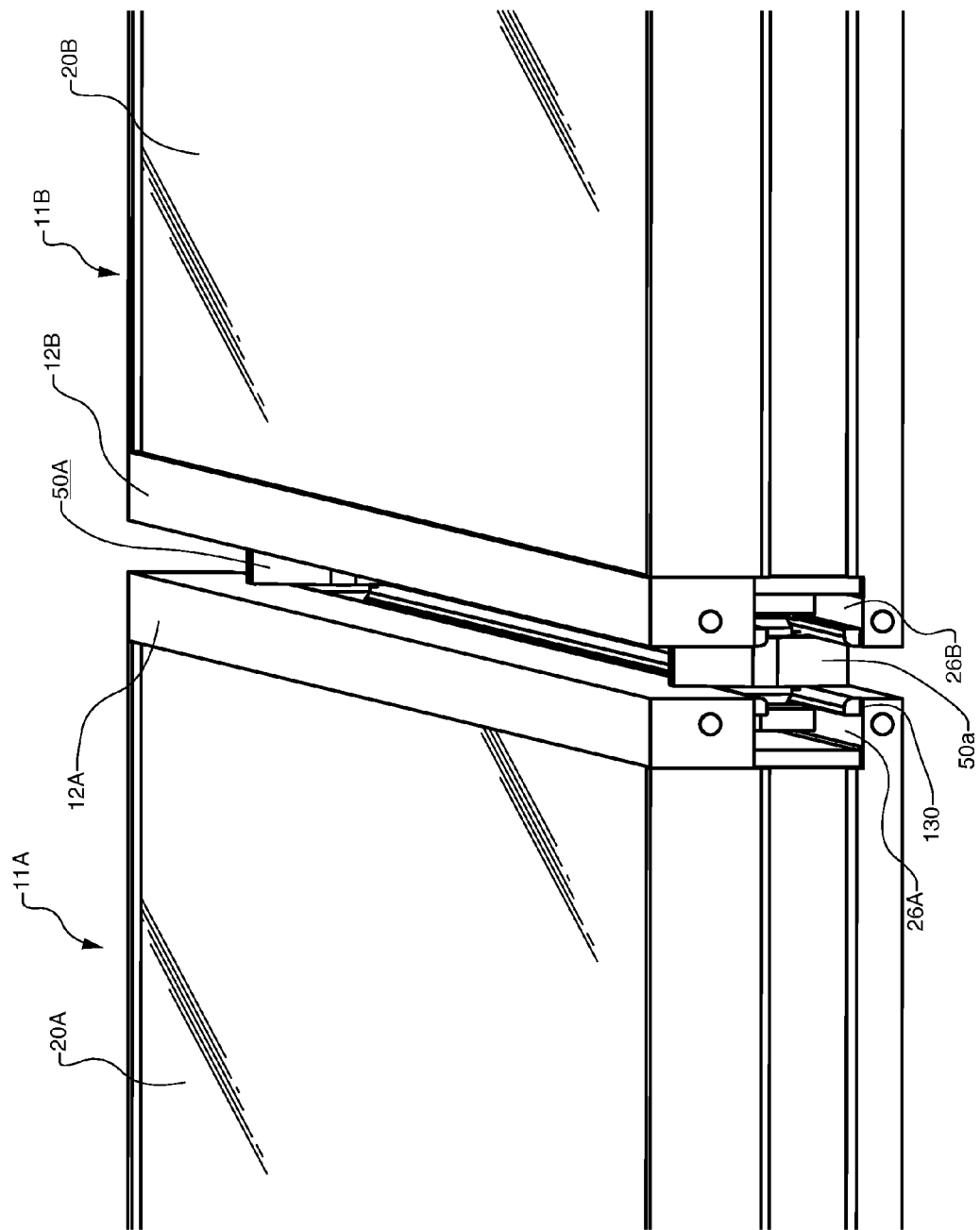
FIG. 4 is a perspective view of two adjacent PV modules coupled together.

FIG. 4 depicts a perspective view of two adjacent PV modules 11A, 11B which are coupled together with two couplings 50a. Since slots 26A, 26B may run substantially the whole length of frames 12A, 12B, couplings 50a may be located at substantially any point along the length. Given the high strength connection provided, in practice one to three couplings per seam between two PV modules is typically adequate. At a corner 130 of each PV module 11 the flanges 108AU, 108AL, 108BU, 108BL are cut off thus allowing coupling 50a to easily slide from the seam between one set of PV modules 11 over to the seam between an adjacent pair of PV modules 11 when coupling 50a is in first position 91 as discussed above.

Figure 5:
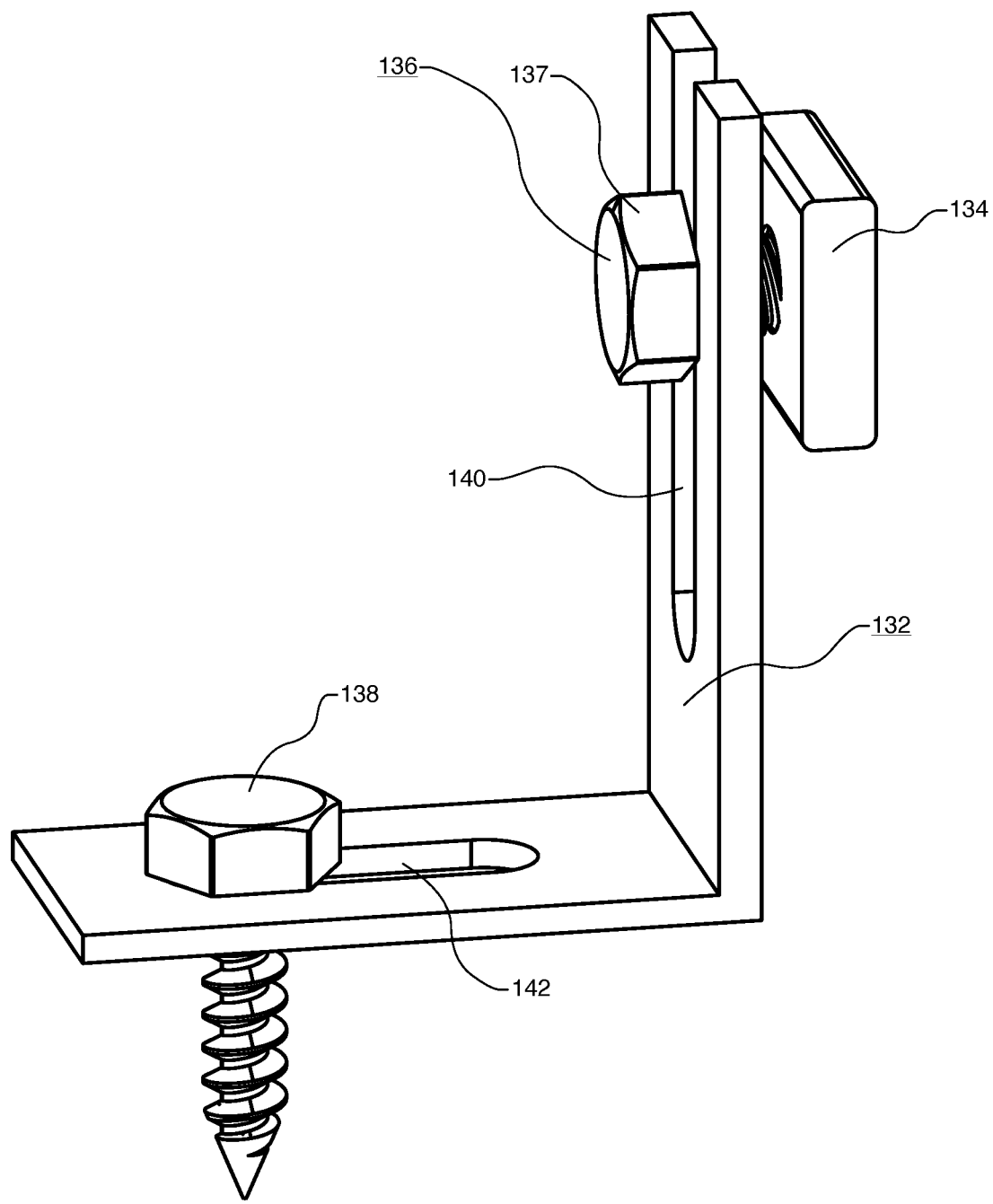
FIG. 5 is a perspective view of a height adjustable bracket.
Figure 6:
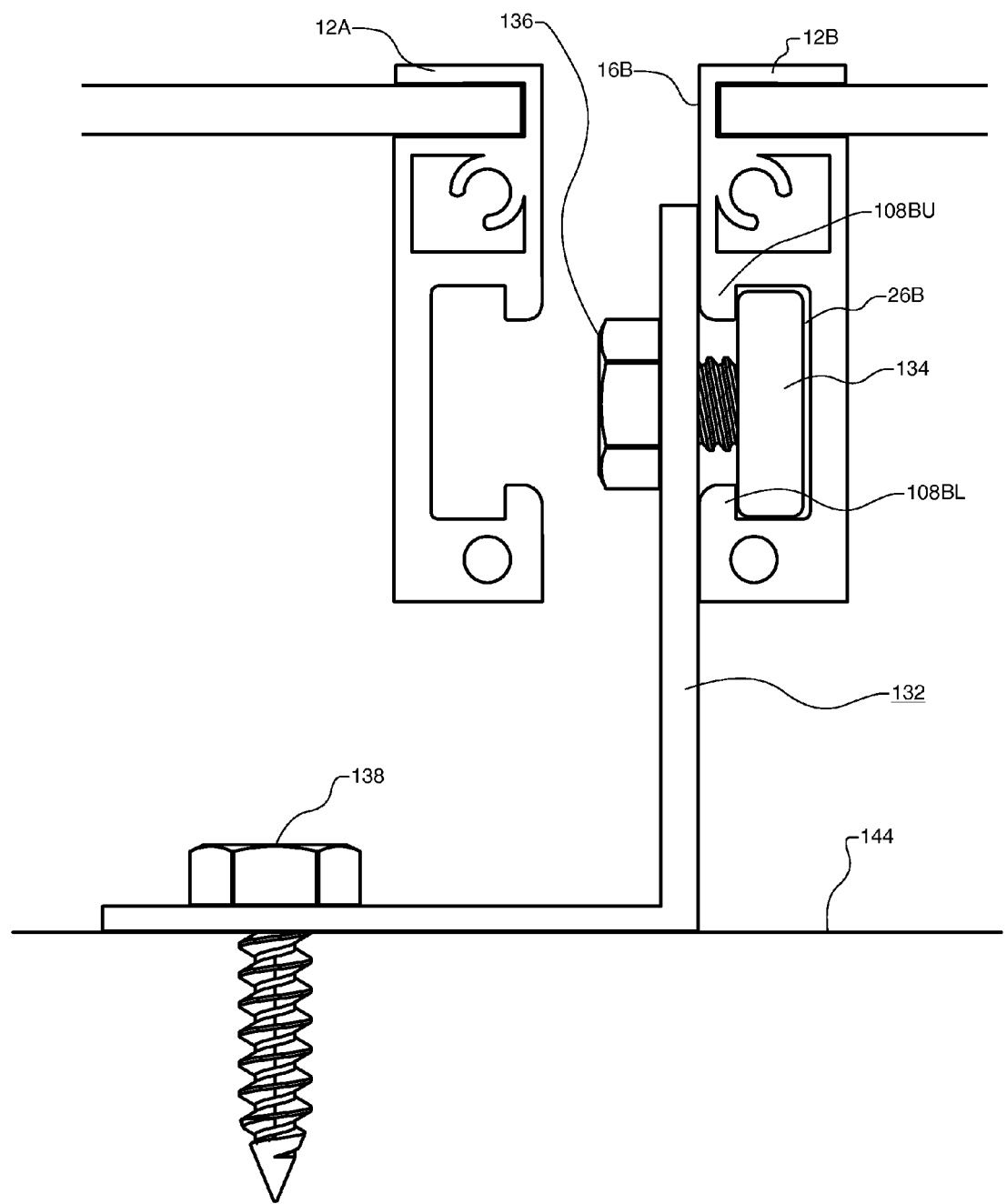
FIG. 6 is a cross-section cut through two adjacent PV modules.

Referring now to FIGS. 5-6, FIG. 5 depicts a perspective view of a height adjustable bracket 132 which is suitable for connection to a PV module 11 of the first embodiment of the present invention, and FIG. 6 shows a cross-section cut through two adjacent PV modules 11A, 11B (not shown, appearing in FIG. 3 and others) which are coupled together with a coupling 50a (not picture here for clarity, see FIG. 3). An L-shaped bracket 132 comprises a z-axis or vertical adjustment slot 140 and a y-axis adjustment slot 142 (coordinate system based on plane of mounting surface, see FIG. 7). A channel bolt 136 with bolt head 137, which is threaded into a channel nut 134, is utilized to attach bracket 132 to outside surface 16B of frame 12B. Channel nut 134 is shaped to fit inside slot 26B and to be captured behind flanges 108BU, 108BL. This embodiment contemplates a simple rectangular shape for channel nut 134 with nut 134 being inserted at corner 130 and slid into position. Threading bolt 136 into nut 134, sliding bracket 132 between bolt head 137 and frame outside surface 16B, and then tightening bolt 136 serves to pull nut 134 solidly against flanges 108BU, 108BL thereby rigidly securing bracket 132 to frame 12B. And since slot 26B runs substantially the whole length of frame 12B, bracket 132 can be attached to substantially any point along the length, which will be referred to as the x-axis direction. Therefore, slot 26B along with slot 140 and slot 142 allows for 3 dimensional adjustability of bracket 132, enabling greatly simplified installation via much easier lining up of brackets 132 with rafters (which typically run in the y-axis direction) and much easier leveling and aligning of PV modules within array 10. Lag screw 138 provides a means of directly securing bracket 132, and therefore array 10, to a mounting surface 144, such as a roof without any other support structure as is typical in prior art systems.

Please note that while FIG. 6 shows a connection of bracket 132 to right frame 12B, it can be connected to any outside surface 16, and furthermore it can be reversed so that lag screw 138 is positioned beneath the PV module 11 to which it is connected. In other embodiments nut 134 comprises a rectangular shape with two opposing rounded corners, similar to locking portion 104B, so that it can be inserted into slot 26B from any point along frame 12B and then twisted 90 degrees to tuck behind flanges 108BU, 108BL. In still other embodiments nut 134 is a standard hexagonal-shaped nut.

One alternate embodiment removes lower flanges 108AL, 108BL from slots 26A, 26B and the lower portions of locking portions 104A, 104B resulting in a one-sided locking action instead two as with the first embodiment.

First Embodiment—Basic Operation

Referring to FIGS. 7-8 and FIGS. 10-11, a PV array 10 according to the first embodiment of the present invention is shown installed on the roof of a building 146. FIG. 7 depicts a perspective view of building 146 with PV array 10 shown attached to a roof 144R which serves as a suitable mounting surface 144. Roof rafters 148 are just beneath the top surface of the roof and are shown as dashed lines. Brackets 132 can be seen in this view along the front of PV array 10. Brackets 132 are oriented such that lag screws 138 are hidden under PV modules. Brackets 132 can be seen attached to slots 26 on the outside surface 16 of the lowest row of three PV modules 11, one bracket 132 per PV module 11. Brackets 132 have been adjusted in their respective slots 26 in the x-axis direction such that each bracket 132 lines up with a rafter 148. Since lining up of brackets 132 with rafters 148 is only required with certain types of roofs and mounting surfaces, other embodiments provide brackets 132 which are not lined up with rafters, but rather attach directly to the mounting surface at any desired point. In still other embodiments, brackets 132 are adjusted in the x and y directions to line up with ground mounted structures, pier blocks, concrete posts, and specialized mounting hardware such as roof jacks, mounting posts, mounting jacks, tile brackets, specialized brackets, and stand-offs. Since the inventive system provides three dimensional adjustability, it can be connected to almost any suitable mounting surface.

Figure 9:
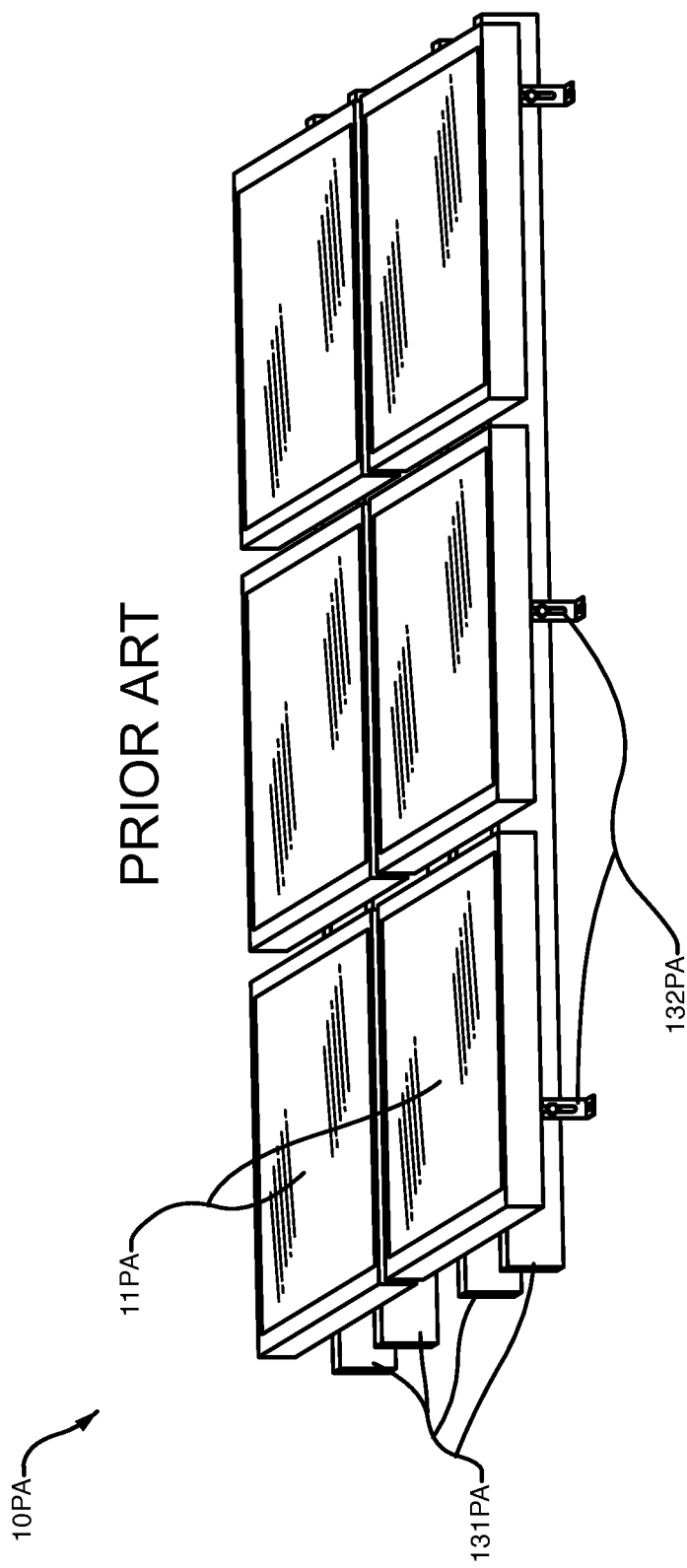
FIG. 9 shows a typical prior art PV array.

FIG. 8 shows a side view of the same PV array 10 from FIG. 7 at a larger scale. This figure helps to clarify the fact that PV array 10 is connected to roof 144R without the use of strut or other supports. Brackets 132 connect frames 12 directly to roof 144R, and couplings 50a interlock PV modules 11 together. In contrast, FIG. 9 shows a typical prior art PV array 10PA without the benefit of an interlocking system as disclosed herein. PV modules 11PA are first linked together by struts 131PA. Struts 131PA are then attached to a mounting surface (not shown) via brackets 132PA. As can be seen here strut 131PA is a device which is at least as wide as two PV modules 11PA and is designed to support the opposing sides of at least two PV modules 11PA. A coupling, on the other hand, only joins PV modules together at the seam between the two modules and therefore is not wider than a single module. The fact that struts 131PA are designed to span between modules 11PA means that a lot of extra material is required. The additional expense and installation time required to utilize strut 131PA is a significant drawback to prior art systems.

Figure 10:
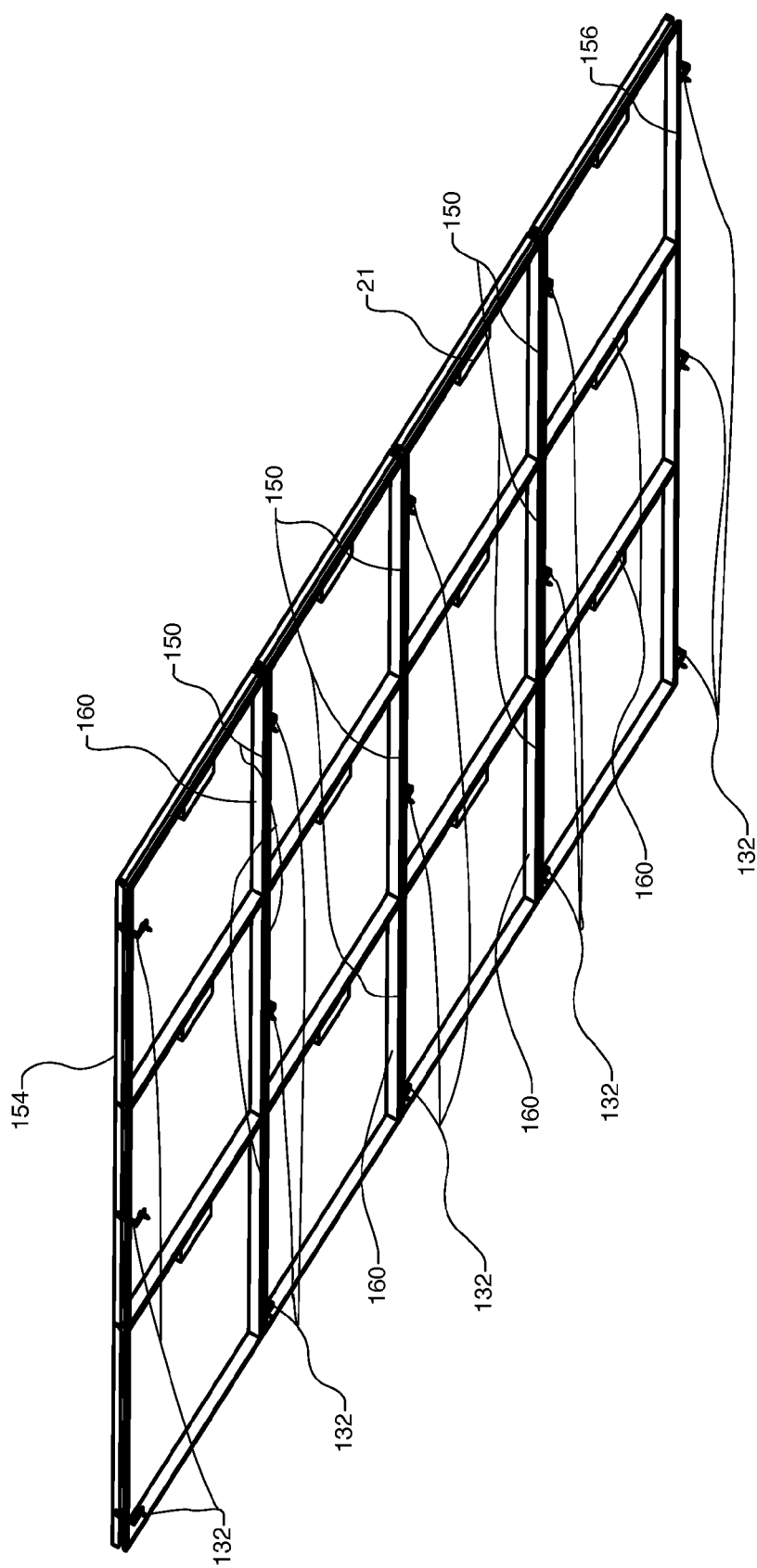
FIG. 10 is a perspective view of the PV array of FIG. 7 viewed from the back.

FIG. 10 shows a perspective view of the same PV array 10 from FIG. 7 except that array 10 is being viewed from the back (exactly 180 degrees around from the FIG. 7 view) with building 146 removed to reveal the back side of PV array 10. In this view it is now evident that a row of three brackets 132 is located along every horizontal seam 150 between PV modules 11 and along the top 154 and bottom 156 edges of array 10. This method of relatively evenly distributing brackets 132 across array 10 is not possible with prior art strutless systems which utilize series couplings (see discussion below).

Figure 11:
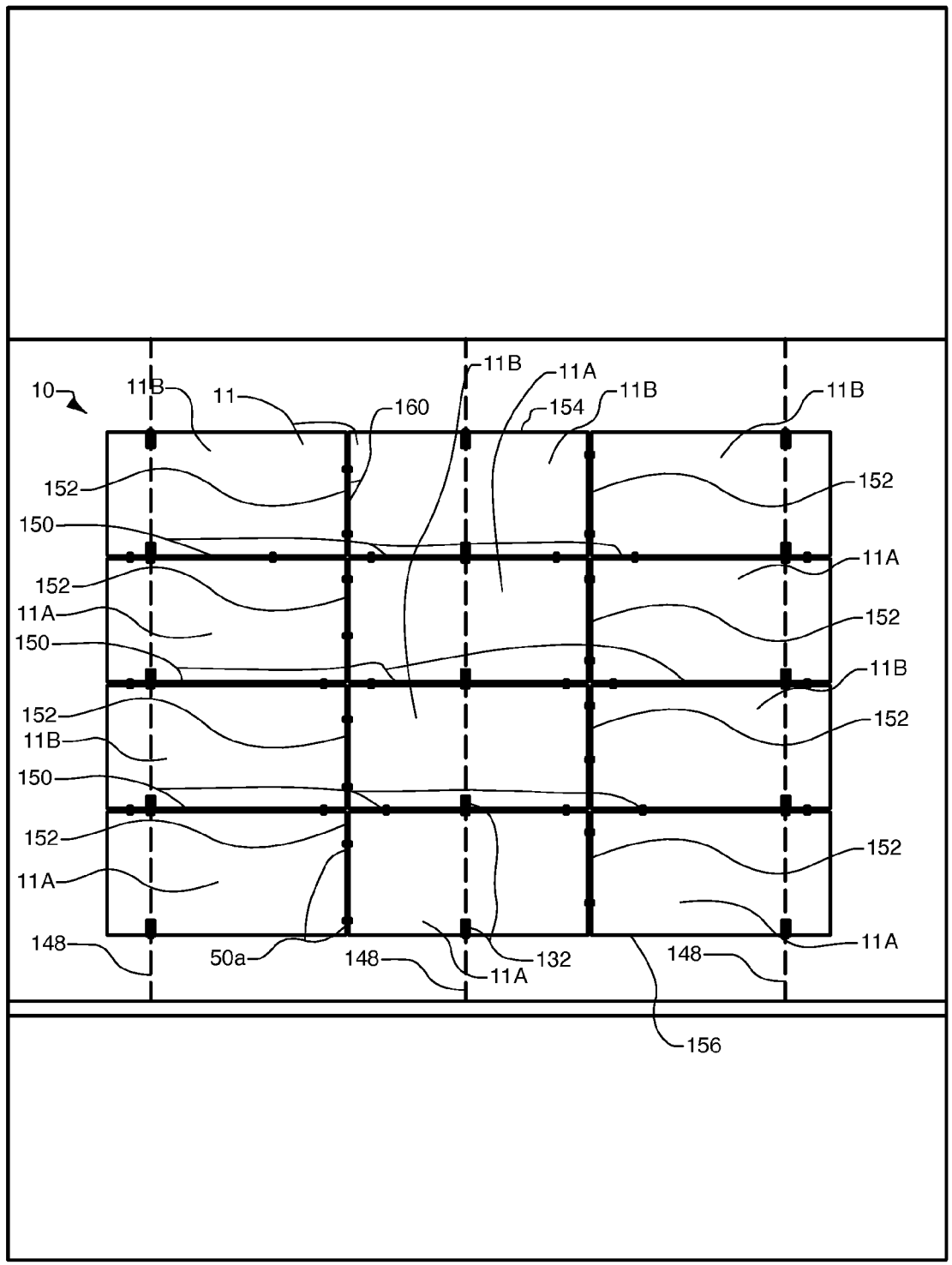
FIG. 11 is a cross-section cut through a PV array just above the couplings.

FIG. 11 shows a cross-section cut through PV array 10 (from FIG. 7) just above couplings 50a and looking perpendicular to array 10 thereby revealing the locations of couplings 50a and brackets 132 (roofing material not shown beneath array 10 for clarity). Couplings 50a are shown interlocking all PV modules 11 in array 10 at all horizontal 150 and vertical 152 seams between PV modules 11. In other embodiments couplings 50a are only utilized on either horizontal seams 150 or vertical seams 152. The arrangement of couplings as shown here creates a double structure or parallel interlock support system 160 for array 10 along both the x and y-axes as will be discussed below. Each frame 12 is referred to as a hybrid, strut-like frame because, unlike most prior art systems, it performs the following basic functions which are normally shared between a PV frame and a strut or similar structural support system: (a) holding and protecting the edges of PV laminate 20; (b) interconnecting modules 11 together with a structural support system (in order to increase structural integrity and minimize the number of required connection points to mounting surface 144); and (c) providing a means for attaching array 10 to mounting surface 144 via foot-type or bracket members.

First Embodiment—Series and Parallel Coupling Theory

FIG. 12 provides a simplified top view of two adjacent rectangular frames A and B. Lines C1, C2, C3, and C4 represent places along the seam between the two frames A and B where couplings can theoretically be placed. Couplings which connect at lines C1 and C2 are referred to as parallel couplings since a union of frames A and B at these points results in frames A and B being interlocked in parallel. It follows then that any point along the seam between A and B is theoretically capable of receiving a parallel coupling. However, the corner points K1 and K2 are special cases since prior art slots in the outside surfaces of frames do not extend all the way to the corner on both sides of a pair of orthogonal frame members. This problem arises from the nature of the aluminum extrusion process (which is how most PV frames are manufactured) and prevents the sliding of parallel couplings all the way to the end on at least two sides of a rectangular PV module. The corners are also a special case for a second reason. The corners K1 and K2 are the only places around the perimeter where a coupling can be inserted into the outside surface of a first frame member B4 and continue through into a second frame member B3 which is around the corner from the point of insertion. Thus, lines C3 and C4 are shown extending from parallel frame members A2, B4 into the orthogonal frame members B1, B3 and A1, A3. Since the ability to run a coupling into an orthogonal frame member clearly enhances the structural properties (z-axis loads can be distributed over a larger area), prior art couplings fall into two basic categories: parallel couplings which are optimized to connect to the side of a frame member substantially anywhere along the whole length of the member and series couplings which are optimized for the special case of connecting to the ends of frame members at the corner points K1, K2. Series couplings are so named because they link two frame members, such as A3 and B3, end to end.

In order to understand the operation of PV array 10 of the first embodiment, it is important to first understand how the forces that are presented to PV array 10 are distributed across it. Forces can act over the entire surface, such a wind pressure, or forces can be highly localized, such as someone stepping on it. In either case, these forces must find their way to the roof 144R or mounting surface 144 via brackets 132 that mount the PV system, and these brackets 132 may be some distance away from the point or area of application of the force. In many cases the force must pass across PV modules and the transitions between them in order to make it to mounting surface 144. A coupling device for interlocking frame members 13 provides an opportunity to further support frame members 13 by locking it to adjacent frame members 13. For an individual PV module 11 each frame member 13 acts as a separate structural entity which is supported by PV laminate 20 and connected to orthogonal frame members at the corner joints. Even in a hypothetical case of a framed PV laminate which comprises a frame constructed out of a single piece of material (no such example exists to our knowledge), each side of the frame is still a separate structural entity since the sides are mostly separated by the laminate and only connected by a small portion in the corners. Thus, it is important to discuss which frame member and where on the frame member a particular coupling is connected if one wants to understand the structural properties of the coupling. Assuming that PV module 11 comprises substantially straight frame members 13, then the possible shapes (in a top view) for flat-plate PV module 11 are a triangle, rectangle, pentagon, hexagon, etc. All such shapes are suitable for use.

FIGS. 13-14 show generic PV arrays 10P and 10S, comprising four PV modules 11A, 11B, 11C, 11D with adjacent frame members 13A1, 13B1; 13A2, 13C2; 13B2, 13D2; 13C1, 13D1 respectively. These two figures demonstrate the two basic types of couplings which are possible in a rectangular array: parallel couplings 50 and series couplings 62. When straight-sided PV modules 11A, 11B, 11C, 11D are assembled to form substantially rectangular PV arrays 10P and 10S, the result is a plurality of frame members 13 which are immediately adjacent to each other (within arrays 10P, 10S) and a plurality of frame members 13 around the perimeter of arrays 10P, 10S. FIG. 13 shows parallel couplings 50 that each connect two adjacent and substantially parallel frame members 13 side to side. FIG. 14 shows series couplings 62 that each connect two substantially collinear frame members 13 end to end.

As shown in FIG. 13, parallel couplings 50 allow a force F1 applied to PV module 11B to be distributed between the PV modules immediately adjacent to it, 11A and 11D, along paths P1, P2, P3, as well as out to the more remote PV module 11C along paths P4 and P5. This distribution of forces is enabled since parallel couplings 50 allow both the connection of frame members 13 end to end and side to side. For example, frame members 13B1 and 13A1 are interlocked in addition to the orthogonal pair of frame members 13B2 and 13D2. This connection of orthogonal pairs of frame members 13 enables the connection of each row of PV modules 11A, 11C, to the adjacent row 11B, 11D and allows force F1 to be distributed across all the PV modules in array 10P, thus strengthening the entire frame structure supporting PV laminates 20. However, series couplings 62, as shown in FIG. 14, will only allow forces to be distributed down the rows 11A, 11C and 11B, 11D which are attached in this way. The same force F1 presented to module 11B in this case can only take paths P10 and P11, thus preventing the distribution of loads to PV modules 11A, 11C.

While series couplings 62, as are known in the prior art, are clearly less advantageous than parallel couplings, some embodiments of the present invention, as will be discussed below, provide a means for adding a series coupling portion to a parallel coupling thereby creating a series-parallel coupling. There are distinct advantages to such a hybrid coupling since in theory a series coupling may provide more opportunity for enhancing the z-axis strength of frame 12 (though such potential is not realized in prior art couplings).

Parallel interlock support system 160 operates as follows. The specialized slot 26 allows couplings 50*a* to securely connect the sides of each immediately adjacent and parallel pair of frame members 13. It is common for installation technicians to step on a PV laminate 20 during installation. This action provides a localized load such as would generate force F1. In prior art strutless systems, force F1 is translated to the frames which are nearest to the point of loading, and each frame member 13 is acting mostly independently since there are no securely connected additional supporting members nearby. In the first embodiment of the present invention, however, force F1 presented to the top of PV laminate 20 is shared by frame 12 which surrounds PV laminate 20 as well as the four frame members 13 which are coupled to the loaded PV laminate 20. Thus, it can be seen that a support grid is created by the simple and rapid connection of couplings 50*a* to adjacent frames 12. This grid is evenly distributed in the x and y directions throughout array 20, and the doubled support members run beneath the edges of each PV laminate 20. The result is a PV array 10 which can be mounted to a roof or other mounting surface 144 without the need for costly and heavy strut (or other structural members). Furthermore, the increased spanning capabilities provided by the parallel interlock support structure 160 significantly reduce the number of connection points (and therefore brackets 132) for a given size array 10 on a given mounting surface 144 as compared to prior art strutless systems.

FIG. 15 shows a prior art strutless PV array 210PA with PV modules 211PA, brackets 232PA, and series couplings 250PA. As discussed above, series couplings must be connected at the corners and therefore they cannot be used to connect two adjacent rows together. Thus, brackets between rows must be doubled up (as shown) or specialized (and difficult to install) double brackets must be utilized. And, as mentioned above, the total number of brackets 232PA is also increased relative to the inventive device of the first embodiment because spans between brackets 232A cannot be as long.

First Embodiment—Coupling Modes

The unique structure of the framing and coupling systems of the first embodiment enables three distinct modes of operation: positioning mode, locked mode, and sliding mode. In the first embodiment these different modes may be easily accessed via rotation of coupling 50*a* into one of the three discrete positions 91, 92, 93 as discussed above. Other embodiments access these modes via different means as will be discussed below.

Positioning mode is primarily utilized during installation and removal of PV modules 11 in PV array 10. Positioning mode secures coupling 50*a* to one PV module 11 of a pair of PV modules 11 to be interlocked. Since the positioning of PV modules can be difficult, particularly on sloped roofs, positioning mode insures that coupling 50*a* will stay in position as the two modules are guided together. Thus, in positioning mode coupling 50*a* is either firmly secured or loosely attached to one PV module 11.

Locked mode is the mode that all couplings are left in once array 10 is fully installed. Locked mode securely interlocks two adjacent PV modules 11 together thereby forming a parallel interlock support system 160 as discussed above. In locked mode coupling 50*a* is firmly secured to two adjacent PV modules. This mode also automatically grounds the two interlocked modules 11 to each other and forces them into proper alignment and spacing. The automatic grounding feature of the first embodiment of the present invention provides a substantial improvement over prior art systems because PV modules are electrically grounded to each other both within rows of modules 11 and between rows. Thus a complete x-y grounding matrix results so that only one ground wire needs to be run from PV array 10 to the grounding equipment for the site.

Sliding mode is primarily used during installation and removal of PV modules 11 in array 10. Sliding mode partially decouples two interlocked PV modules so that coupling 50*a* may be repositioned or slid all the way down slot 26 and over into slots 26 for an adjacent PV module pair in array 10. This allows removal of an individual PV module 11 that is surrounded by adjacent PV modules 11 installed on all sides. Thus in sliding mode coupling 50*a* is loosely attached to two adjacent PV modules. Prior art systems do not teach or imply a PV array coupling and framing system capable of achieving all three of these coupling modes (positioning, sliding, and locked).

First Embodiment—Coupling Process

Figure 16:
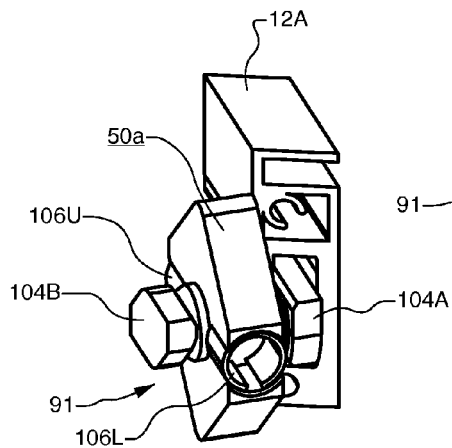
FIG. 16 is a perspective view of a coupling.
Figure 17:
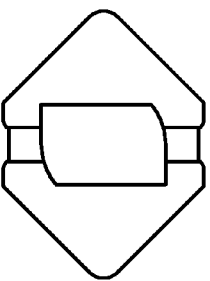
FIGS. 17-18 are front and back side views respectively of a coupling in a first position.
Figure 18:
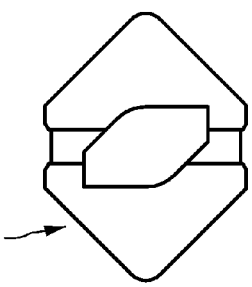
Figures 20, 21:
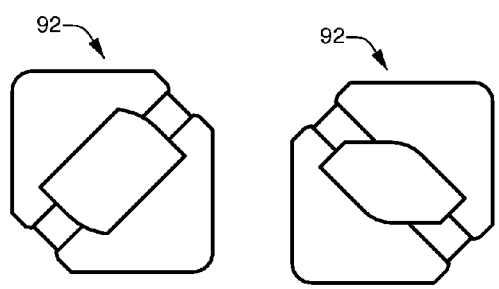
FIGS. 20-21 are front and back side views respectively of a coupling in a second position.
Figure 19:
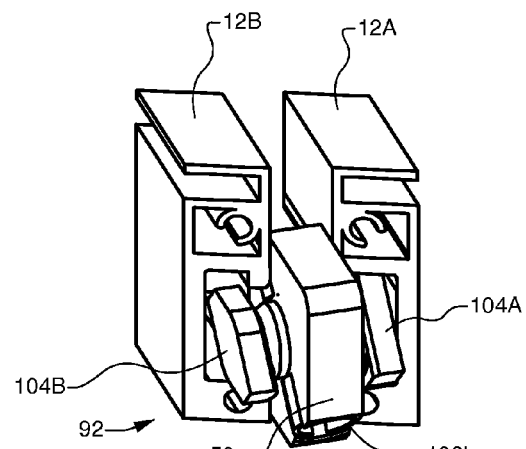
FIG. 19 is a perspective view of a coupling.
Figure 22:
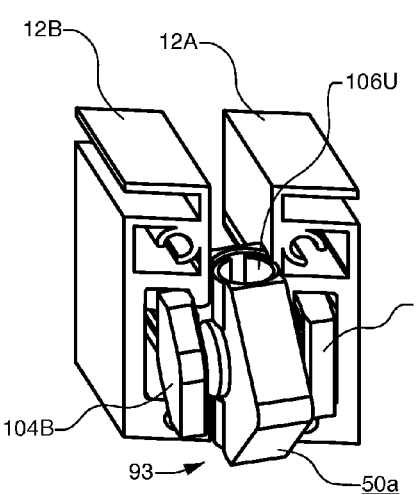
FIG. 22 is a perspective view of a coupling.
Figure 23:
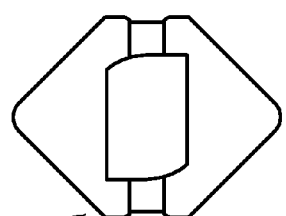
FIGS. 23-24 are front and back side views respectively of a coupling in third position.
Figure 24:
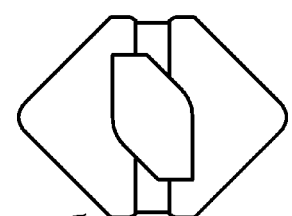

FIGS. 16, 19, and 22 depict a perspective view of coupling 50*a* in each of its three discrete positions 91, 92, 93 respectively as it is utilized to interlock two adjacent frames 12A, 12B together (only a portion of frames 12A, 12B are shown so that locking portions 104A, 104B are revealed). Please note that since coupling 50*a* may be installed in either frame first, FIGS. 16, 19, and 22 show frames 12A, and 12B in opposite positions than in FIG. 3. FIGS. 17-18 show front and back side views respectively of coupling 50*a* in first position 91. FIGS. 20-21 show front and back side views respectively of coupling 50*a* in second position 92. FIGS. 23-24 show front and back side views respectively of coupling 50*a* in third position 93. The following description also references FIGS. 2-3 since some parts are easier to see in closer views.

The process of interlocking two adjacent frames 12A, 12B is as follows. First, coupling 50*a* is oriented in first position 91, which aligns the length of locking portion 104A with the length of slot 26A, then inserted at substantially any point along frame 12A into slot 26A. While inserting, the direction of travel is substantially parallel with the plane of laminate 20A and substantially perpendicular to the length of slot 26A. Coupling 50*a* is inserted until locking portion 104A hits the back of slot 26A or rotating portion 100 contacts outside surface 16A of frame 12A. FIG. 16 shows coupling 50*a* in first position 91 and fully inserted. For convenience, we contemplate alignment of rotating portion flat faces 116 at 45 degrees to the plane of laminate 20 when in first position 91: this way the corner point of rotating portion 100 is pointing straight up and is therefore easy to align by eye. Of course other orientations for flat faces 116 will work just as well. Springs 106U, 106L are oriented such that they are not touching frames 12 in first position 91 (since they line up with opening 27A, 27B of slot 26A, 26B). Therefore, a return to first position 91, even after the complete array 10 has been installed, will enable sliding mode since it is not locked onto either frame and since springs 106U, 106L are not compressed.

The second step is to rotate coupling 50*a* into second position 92 in order to enable positioning mode as is depicted in FIGS. 19-21. Though lighter duty springs may be used, we contemplate the use of relatively stiff springs for springs 106U, 106L since movement of the modules 11 in array 10 may be undesirable once the installation is complete. Springs with a full deflection rating of 100 to 500 pounds may work well, but other spring rates are also suitable. Thus, in order to move coupling 50*a* from first position 91 to second position 92, a wrench is applied to rotating portion 100 to rotate it approximately 45 degrees clockwise. In this position locking portion 104A is locked onto frame 12A and springs 106U, 106L are partially compressed. Please note that during the first part of the 45 degree rotation from first position 91 to second position 92, tapered surfaces 105AU, 105AL engage with flanges 108AU, 108AL to pull the locking portion further into the slot. By guiding locking portion 104A into place, tapered surfaces 105AU, 105AL also enable an increased range of acceptance angles for initial alignment of locking portion 104A and therefore increase the flexibility and ease of use of coupling 50*a* since it doesn't have to be "dead on" in order to rotate. As coupling 50*a* is being rotated from first 91 to second 92 position, teeth 112 AU, 112AL begin to bite into flanges 108AU, 108AL when the end of tapered surfaces 105AU, 105AL is reached. From this point on through the rest of the full 90 degree throw, the surfaces of locking portion 104A which are in contact with flanges 108AU, 108AL remain relatively parallel with flanges 108AU, 108AL. Therefore, the force applied by springs 106U, 106L effectively squeezes coupling 50*a* about flanges 108AU, 108AL and it is held in a stable position if the wrench is removed from rotating portion 100. Thus, second position 92, as shown in FIG. 19, is a stable discrete position with coupling 50*a* attached only to frame 12A. The second frame 12B can now be moved into or out of position without knocking coupling 50*a* out of position. Unlike some prior art systems which require both PV modules 11A, 11B (not shown, appearing in FIG. 3 and others) to be in place and aligned before a coupling can be connected, the inventive device of the first embodiment allows free positioning of modules with coupling 50*a* connected to one of them in positioning mode. For example, in some cases it may be advantageous to insert couplings into some PV modules 11 on the ground before taking them up to a roof to be mounted. In other cases couplings 50*a* may be locked onto PV modules 11 at the factory prior to shipping. Also, when interlocking a free PV module to an already mounted PV module, coupling 50*a* may be attached to either the free PV module or the already mounted PV module. Positioning mode is enabled since locking portion 104B is shaped such that it only begins to lock itself onto frame 12B when coupling 50*a* is being rotated from second position 92 to third position 93.

FIGS. 22-24 depict coupling 50*a* in third position 93, securely attached to frames 12A, 12B in locked mode. The process of rotating from second position 92 to third position 93 is basically the same as that from first 91 to second 92. A wrench is used to rotate rotating portion 100. Tapered surfaces 105BU, 105BL guide locking portion 104B into slot 26B and teeth 112BU, 112BL begin to bite into flanges 108BU, 108BL when the end of tapered surfaces 105BU, 105BL is reached. Arrival at third position 93 is signaled by locking portion stops 120AU, 120AL contacting upper 122AU and lower 122AL inside surfaces of slot 26A respectively and 120BU, 120BL contacting upper 122BU and lower 122BL inside surfaces of slot 26B respectively. Locking portion stops 120AU, 120AL, 120BU, 120BL provide a solid, hard stop which prevents rotation of the wrench any further, therefore significantly simplifying the installation procedure and increasing the quality thereof by eliminating the possibility of over or under-torqued bolts.

The above discussion of the coupling process clearly shows how a rotation of coupling 50*a* from first position 91 to third position 93 causes locking portion 104A to bear against inside surfaces 109AU, 109AL of slot 26A and rotating portion 100 via springs 106U, 106L to bear against an opposing frame surface, outside surface 16A. Since springs 106U, 106L act to transfer forces from rotating portion 100 to frames 12A, 12B, they are also referred to as force transfer portions. Likewise locking portion 104B bears against inside surfaces 109BU, 109BL of slot 26B and rotating portion 100 via springs 106U, 106L bears against an opposing frame surface, outside surface 16B. Thus it is clear that coupling 50*a* securely interlocks PV modules 11A and 11B together by bearing against opposing surfaces on each frame 12A, 12B upon rotation of rotating portion 100.

Please note that this method of interlocking is quite different from prior art systems which interlock adjacent PV modules by means of a coupling that bears against the frame and a strut, a mounting rail, a bracket, or other structural member which is sandwiched between opposite ends of the coupling. This basic structural difference enables the forming and mounting of PV arrays 10 without requiring the use of separate structural support members (such as strut, mounting rails, and the like) which attach directly to and span between multiple PV modules in a formed PV array 10.

First Embodiment—Installation Methods

Referring to FIGS. 7-8 and FIGS. 10-11, the basic steps involved in the forming and mounting of PV array 10 according to the second embodiment of the present invention may be as follows:

Step 1: Secure a first PV module 11 to roof 144R with at least one bracket 132.

Step 2: Interlock a second PV module 11 to the first PV module 11 with at least one parallel coupling 50*a* which interlocks the sides of two adjacent frame members 13 together in parallel.

Step 3: Attach second PV module 11 to roof 144R with at least one bracket 132.

Step 4: Repeat steps 2 and 3 for all remaining PV modules 11 in PV array 10, successively interlocking each new PV module 11 to the side of a mounted PV module 11 and attaching at least one bracket 132 to each module.

The details of Step 2 above may be as follows: insert coupling 50*a* into slot 26 of the mounted PV module 11, rotate rotating portion 100 to second position 92 with a wrench thereby enabling positioning mode, mate second PV module 11 with coupling 50*a*, rotate coupling 50*a* to third position 93 thereby enabling locked mode. The wrench is operated from above by sliding wrench between the two modules 11 (which may be as close as approximately ¼" apart). Alternately coupling 50*a* may be placed on the free module 11 for positioning mode instead of the mounted module 11.

The details of Step 3 may be as follows: install bracket flashing or mounting plate, loosely install bracket 132 on mounting plate, attach bracket 132 to PV module 11 at any point along the side where it lines up with required bracket placement, secure bracket 132 to mounting plate. Since there are many types of mounting surfaces, there, of course numerous ways that brackets 132 can be installed. Thus, the inventive system of the first embodiment provides slot 26 and height adjustable bracket 132 in order to provide maximum flexibility in adapting to almost any mounting situation.

Parallel couplings 50*a* may be used at substantially any point in any horizontal 150 or vertical 152 seam between adjacent PV modules. Each seam 150, 152 may include one, multiple, or no couplings 50*a* depending on the installation requirements. Substantially all brackets 132 may be attached by sliding channel nuts 134 into slots 26 from the end, aligning with bracket 132, and screwing bolt 136 into channel nut 134 to capture bracket 132.

Final tightening of each coupling 50*a* and bracket 132 connection is flexible and does not necessarily coincide with initial placement in array 10 of that module 11. This flexibility allows PV modules 11 to be temporarily positioned in the array while others are positioned or while wiring or other installation issues are handled. Since all couplings 50*a* are capable of being tightened from the top, PV modules 11 can be moved into locked mode at any time. The 2-axis nature of the couplings in the embodiment under discussion means that PV modules 11 can be installed in any order and in substantially any shape for PV array 10 as long as each new PV module 11 is interlocked to a mounted PV module 11, and all new modules 11 are added to a mounted module which has a portion of a frame member 13 free (not already interlocked to another PV module). It is possible, for example, to mount PV modules in a generally rectangular shape, but then leave out modules 11 in the middle to avoid vents or other obstructions. In another example, each row of PV modules 11 may be displaced by a specific amount for architectural reasons or to match a roof line.

If a module 11 needs to be removed from the middle of a formed array for servicing, the required steps may be as follows. First, move all couplings 50*a* which are connected to it back into first position 91 with a wrench from above thereby enabling sliding mode for each. Then slide all loosened couplings 50*a* over to neighboring modules 11. In some cases a bracket 132 may prevent sliding in one direction but not both. Brackets 132 are typically installed with one per module, so there is normally at least one direction to slide. If two brackets 132 are required, then couplings 50*a* are not used in between the two brackets 132. Next, loosen bolts 136 which connect brackets 132 to frames 12 on the effected module 11 and lift it straight up and out of array 10 (disconnecting wires before moving it too far). In this way an individual PV module 11 that is installed in the middle of array 10 may be removed without requiring the removal of the surrounding modules 11, thereby substantially saving time during troubleshooting and maintenance as compared to prior art systems.

In another embodiment PV modules 11 comprise non-rectangular shapes such as triangular or hexagonal and the coupling system works in the same manner as described above. In another embodiment PV modules 11 are small enough to not require one bracket 132 per module. In this embodiment multiple modules are interlocked together and then one of the group is attached to roof 144R with bracket 132. In yet another embodiment PV array 10 is mounted to a ground-mounted rack system instead of roof 144R with no change in the basic installation method outlined above except that brackets 132 are attached to the rack instead of roof 144R. In still another embodiment groups of standard-sized PV modules 11 are interlocked together via couplings 50*a* on the ground and then hoisted to a roof where brackets 132 are used to secure them in place.

First Embodiment—Advantages

The first embodiment of the present invention provides numerous advantages over prior art systems. Inventive features of the present apparatus include, but are not limited to the following:

Parallel coupling action—parallel coupling is attachable to substantially the whole length of all four sides of a PV module and securely locks the outside surfaces of parallel frame members together in a side to side arrangement, thereby increasing the structural performance of the PV array.

Three mode design—Parallel coupling is shiftable with a wrench into three modes of operation: positioning mode, sliding mode, and locked mode. A positive stop is provided when locked mode is reached.

Locking portion—Parallel coupling provides two specially shaped locking portions which are insertable into slots on the outside surfaces of adjacent frame members. Locking portions enable discrete positions of device and provide a positive stop for locked position.

Dual bearing action—Parallel coupling interlocks adjacent frame members together by bearing against opposing surfaces on each frame upon rotation of a rotating portion. Locking portion bears against an inside surface of the slot and the coupling bears against an opposing surface.

Twist-lock action—Parallel coupling provides a rotating portion which shifts from an unlocked position to a locked position in approximately 90 degrees of rotation.

Top accessible—Parallel coupling is accessible from the top even after PV array has been formed. Coupling can be rotated with a wrench from above to shift from locked mode to sliding mode so that coupling can be slid into the slots of neighboring PV modules. In this way a single PV module can be removed from the middle of a formed PV array.

One-piece—Parallel coupling is deployable in the field as a one-piece unit.

Automatic alignment—Parallel coupling forces interlocked PV modules into alignment along both the x and y axes of PV array. Spacing between modules and height of modules is automatically set upon rotation into locked mode.

Automatic grounding—Rotation of parallel coupling into locked mode causes integral teeth to bite into frame members thereby enabling reliable x-y matrix grounding for the whole PV array. Only one wire is required to ground the whole PV array and the ground connection is uncompromised by the removal of a PV module from the PV array.

Tolerance compensation—Parallel coupling minimizes alignment problems due to variable tolerances within PV array via an integral spring. Spring also resists unlocking of mechanism over time and helps to minimize grounding problems by maintaining a known amount of force on ground connection.

Multifunction frame—A frame is provided which supports PV laminates and eliminates the need for a strut system which links modules together in a PV array. Each frame member comprises a specially shaped slot which enables the connection of parallel couplings and mounting brackets to substantially the whole length of all four sides of a PV module. Furthermore each slot comprises flanges which enable high-strength interlocking and the connection of snap-on options such as cosmetic flashings and debris screens.

The above features provide many useful benefits including, but not limited to: strutless design, minimal attachment points, accessible yet hidden wiring, flexible mounting options, three dimensional adjustability, rapid formation of PV array, better load distribution, better airflow, more flexible wiring options, low part count, improved aesthetics due to lower profile and better alignment, and increased flexibility for orientation (landscape or portrait o.k.).

When removing the strut from a PV mounting system, significant structural challenges are revealed. We will now discuss in more detail the structural advantages of the first embodiment relative to prior art strutless systems.

First, coupling 50a maximizes structural integrity relative to size by operating on frame 12 in a direction substantially perpendicular to outside surface 16 (instead of parallel to it). This fact enables the cost-effective creation of flanges 108AU, 108AL, 108BU, 108BL in frame 12 extrusion which provide a thick and very strong surface that coupling 50a utilizes as a wall for holding the ends of locking portions 104A, 104B. This arrangement results in a very high pull-out strength as compared to the press-fit resistance provided by prior art systems. The flanges 108AU, 108AL, 108BU, 108BL are described as cost-effective since they run longitudinally in the same direction that an extrusion process would run in order to extrude frame members 13 in a typical manufacturing process. Creation of equivalent flanges running at 90 degrees to flanges 108AU, 108AL, 108BU, 108BL as required by prior art systems requires additional machining operations.

Second, the major part of the coupling can be located in the gap between modules instead of inside the frame member, thereby reducing the required size for the frame.

Third, attaching coupling 50a to outside surface 16 of frame 12 with locking portions that engage positively inside both the top and bottom frame member flanges 108AU and 108AL, allows coupling 50a to resist forces that would separate the opposing frame outside surfaces 16, especially in comparison to prior art systems. Furthermore, because it is these separating forces that are the primary forces that we need to overcome with such a coupling, and it intrinsically does this in an effective manner, it can be designed smaller than prior art solutions, and will therefore involve lower material costs.

Fourth, teeth 112AU, 112AL, 112BU, 112BL enhance the longitudinal holding strength of coupling 50a since they are circular to facilitate biting into frame 12 as rotating portion 100 is rotated to lock coupling 50a. These teeth therefore resist being dragged along the longitudinal axis.

In addition to the structural advantages discussed above, the grounding system provided by the first embodiment of the present invention also has unique benefits. The system is more reliable than the prior art since the amount of force supplied to the grounding means is dependent on the stiffness of springs 106U, 106L. Once the correct spring size is determined, all couplings will supply a consistent amount of force to the ground connection and this force will not be dependent on how hard a technician tightens the coupling.

It follows from the above discussion that the first embodiment of the present invention provides significant advantages over prior art systems.

Second Embodiment—Structure

FIGS. 25-31 depict a second embodiment of the present invention. This embodiment is similar to the first embodiment described above except that it includes minor changes to the framing and coupling systems in order to lower manufacturing costs and simplify installation.

Figure 25:
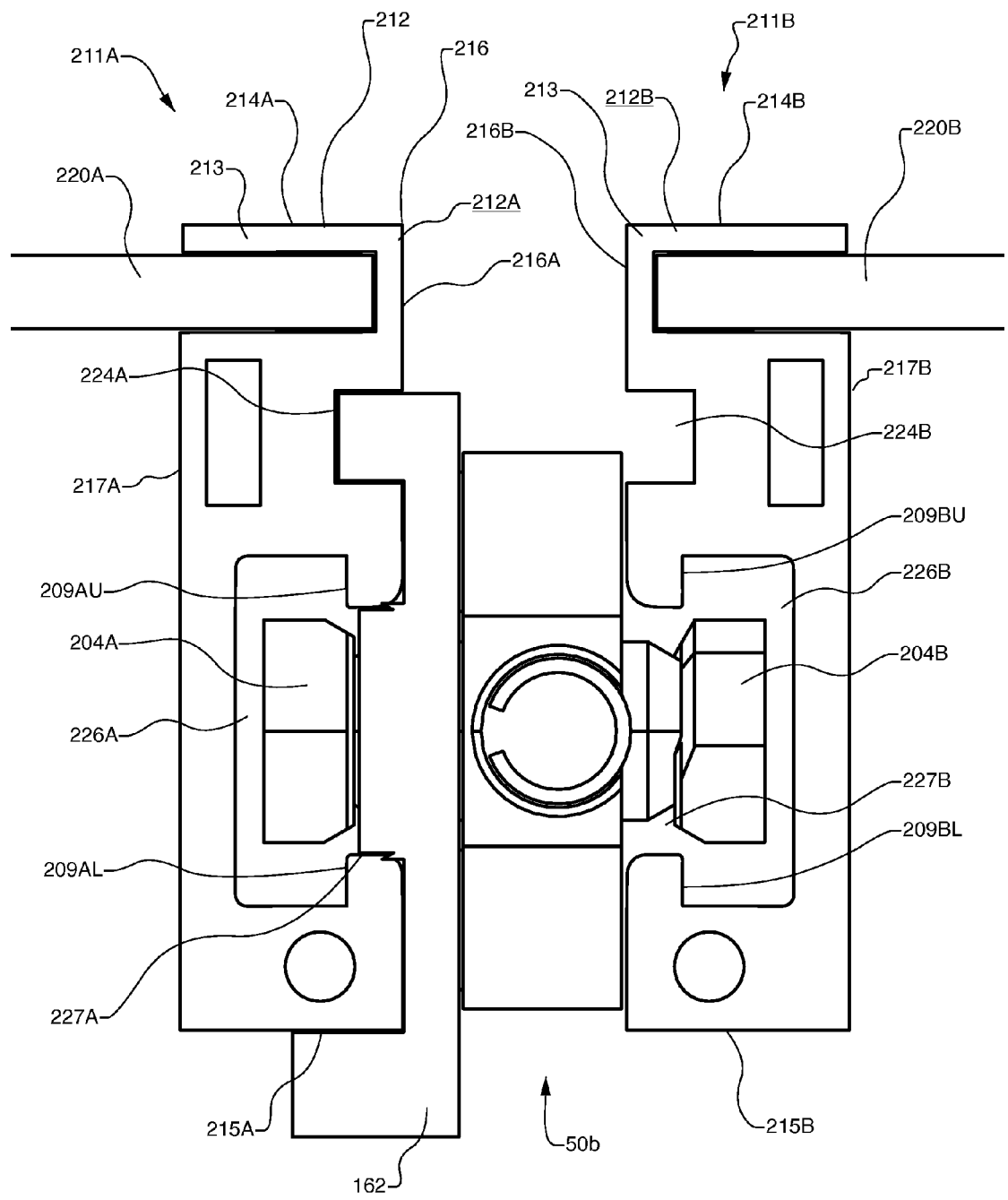
FIGS. 25-31 depict a second embodiment of the present invention.
Figure 26:
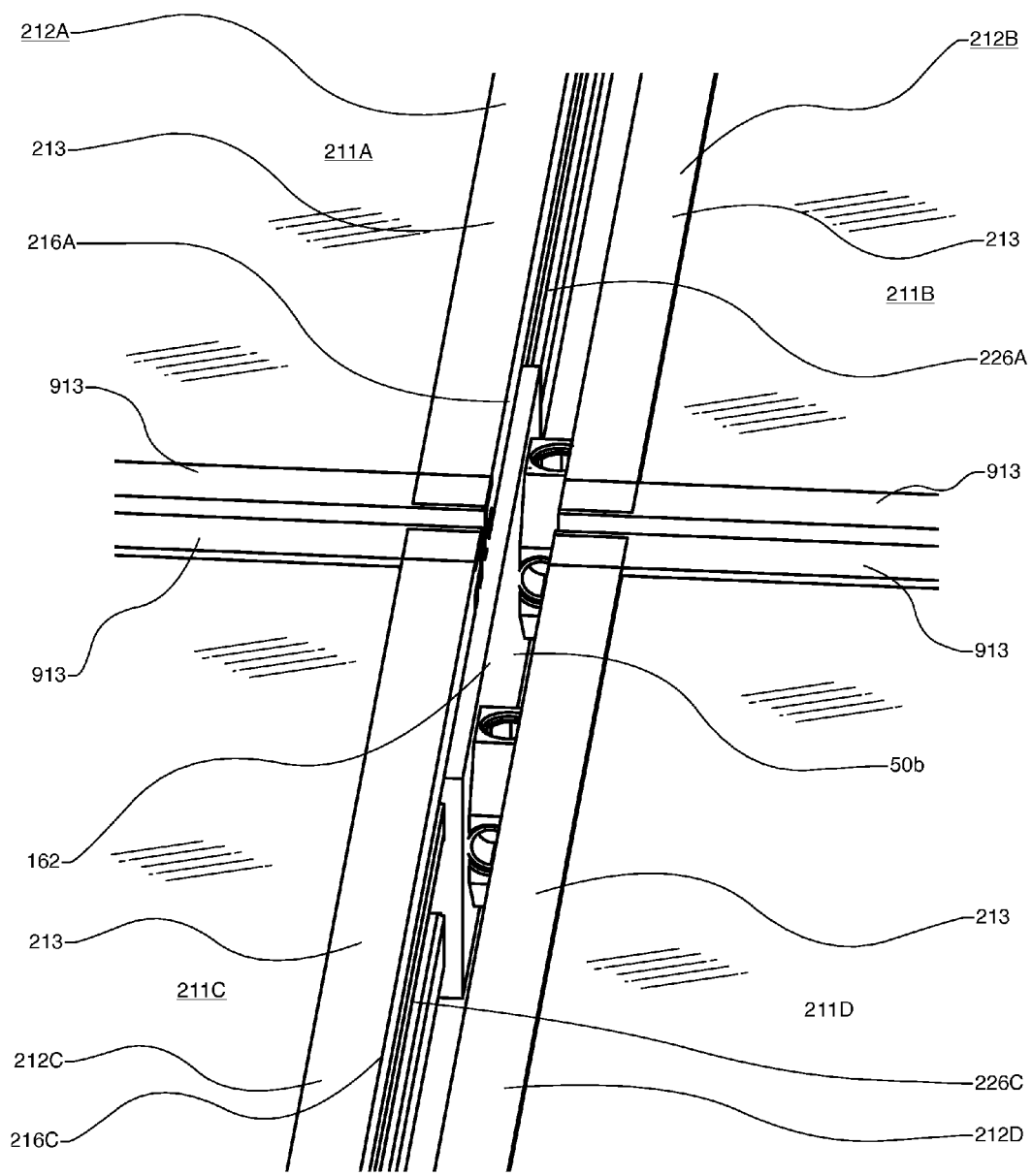

FIGS. 25-26 present a cross sectional view of two interlocked modules 211A, 211B and a perspective view of four interlocked PV modules 211A, 211B, 211C, 211D respectively. Slot 26A, 26B is removed from two opposing frame members 13 yielding a hybrid, strut-like frame 212 with two un-slotted frame members 913 and two slotted frame members 213. Un-slotted frame members 913 may be smaller and lighter weight than slotted frame members 213. In another embodiment un-slotted frame members 913 are made from a lightweight plastic material and are primarily used to protect laminate 20 edges (instead of providing structural support). In another embodiment frame members 913 are not used at all.

Frames 212A, 212B, 212C, 212D each comprise an outside surface 216A, 216B, 216C, 216D; an inside surface 217A, 217B, 217C, 217D; a top surface 214A, 214B, 214C, 214D; and a bottom surface 215A, 215B, 215C, 215D (not all surfaces viewable in these drawings). Four interlocked PV modules 211A, 211B, 211C, 211D are oriented such that slots 226A, 226B with openings 227A, 227B parallel each other and slots 226C, 226D with openings 227C, 227D parallel each other. The two modules 211A, 211B comprise slot inside surfaces 209AU, 209AL, 209BU, 209BL (modules 211B, 211C comprising like surfaces which are not labeled). Thus, all slotted frame members 213, except those around the perimeter of array 10, may be located immediately adjacent to other slotted frame members 213, and all un-slotted frame members 913, except those around the perimeter of array 10, may be located immediately adjacent other un-slotted frames sides 913. The designation PV module 211 refers to any PV module in array 10 and the designation 212 refers to any PV module 211 frame in array 10. Likewise a slot 226 refers to any slot 226A, 226B, 226C, 226D within array 10.

In order to maintain structural linking in both the x and y directions, as is shown in the first embodiment described above, the second embodiment of the present invention replaces coupling 50a with a parallel coupling 50b in some locations. In other locations a parallel coupling 50j is utilized in place of coupling 50a. In locations where two frame members 13 have been changed to un-slotted frame members 913 there are no couplings since there is no slot 26 for coupling connection. Parallel coupling 50b is also referred to as a double coupling or series-parallel coupling 50b because it further comprises a series coupling portion 162 which is utilized to provide a series coupling connection to a second pair of adjacent PV modules. Thus parallel coupling 50b interlocks four PV modules 211A, 211B, 211C, 211D instead of two as is typical in prior art systems. A more detailed description of the layout of couplings 50b and 50j is provided below. All couplings 50j and 50b are shown here in horizontal seams 150, but other embodiments provide all couplings 50j and 50b in vertical seams 152. In still other embodiments frame members 13 are substantially similar on all four sides and therefore couplings 50*j* and 50*b* are located in both the horizontal 150 and vertical seams 152.

Figure 27:
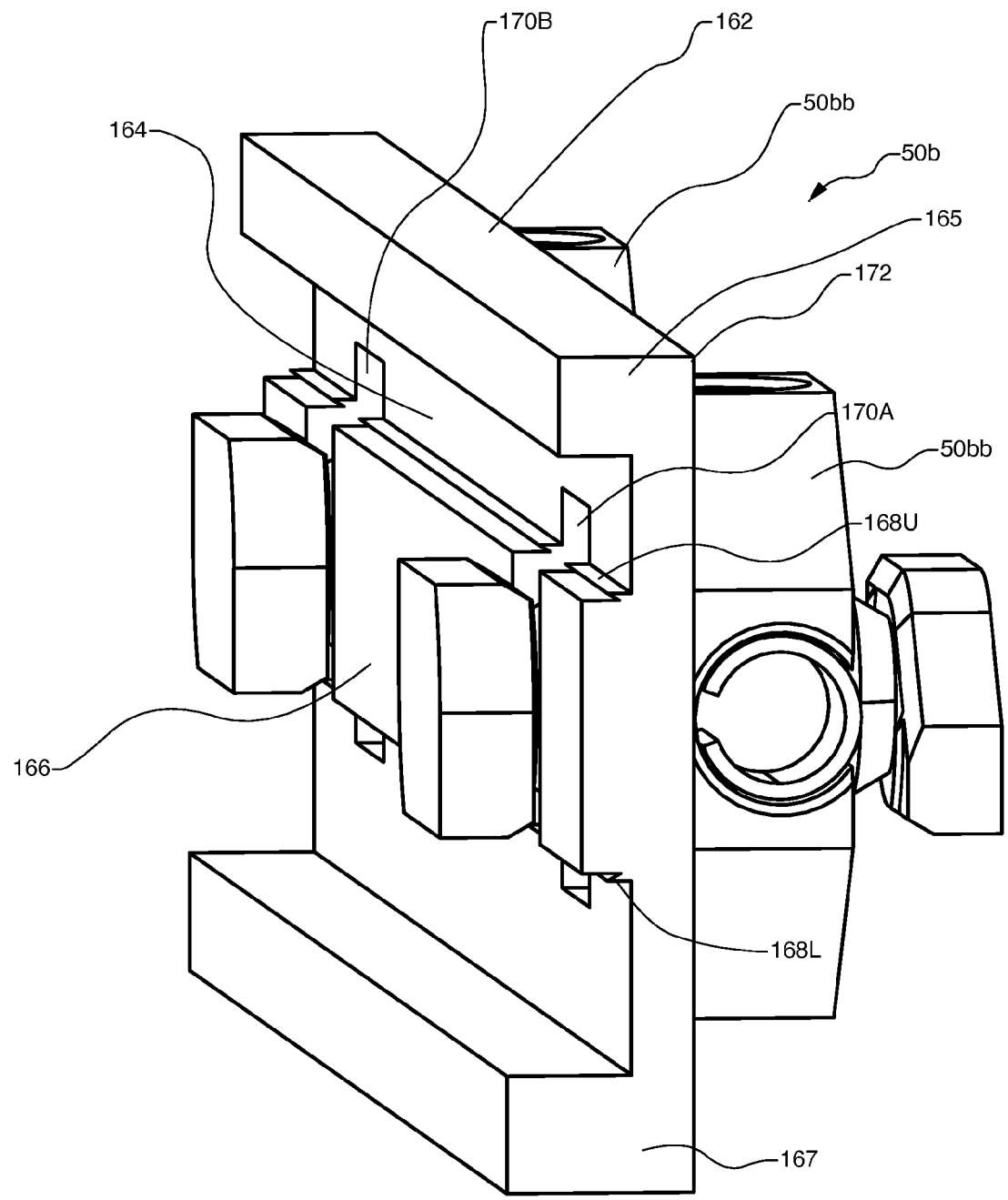

FIG. 27 depicts a perspective view of a generally rectangular-shaped parallel coupling 50*b*. Coupling 50*b* comprises two parallel coupling portions 50*bb* and a series coupling portion 162. Parallel coupling portions 50*bb* are similar to couplings 50*j* (described below) except that they may be shaped slightly differently in order to work well with series coupling portion 162. For example, in one embodiment parallel coupling portions 50*bb* are similar to couplings 50*j* except that they further comprise retainer portions which enable them to be movably secured to series coupling portion 162, thereby allowing coupling 50*b* to be deployed as a one-piece unit in the field. In the present embodiment under discussion coupling portions 50*bb* are the same as couplings 50*j* thus allowing coupling 50*b* to be a three piece unit comprising two parallel coupling portions 50*bb* and one series coupling portion 162. In another embodiment more than two coupling portions 50*bb* are utilized for additional strength. In still another embodiment series coupling portion 162 comprises retainer portions which enable parallel coupling portions 50*bb* to be movably secured to series coupling portion 162, thereby resulting in a one-piece coupling 50*b*.

Referring to FIGS. 25-27, series coupling portion 162 comprises a first side 164 adapted to mate with outside surfaces 216A, 216C of the four interlocked PV modules 211A, 211B, 211C, 211D. First side 164 comprises three male protrusions which mate with frames 212A, 212C to increase the strength of frames 212A, 212C at the point of coupling. Male protrusion 165 is adapted for insertion into auxiliary slots 224A, 224C in frames 212A, 212C and may be tapered slightly to insure a snug fit is maintained despite tolerance issues. Male protrusion 166 is adapted for insertion into slots 226A, 226C in frames 212A, 212C and comprises teeth 168U, 168L which bite into frames 212A, 212C to insure solid electrical ground contact and to enhance the structural connection between PV modules 211A, 211C. Male protrusion 166 may be tapered. Male protrusion 167 is adapted to slide just beneath frames 212A, 212C and may be tapered as well. In other embodiments male protrusions 165, 166, 167 may not be tapered. Series coupling portion 162 further comprises at least two slots or holes 170A, 170B which allow insertion of parallel coupling portions 50*bb* as discussed below and a second side 172 which faces away from PV modules 211A, 211C when series coupling portion 162 is installed. In another embodiment teeth 168U, 168L are replaced by teeth on a different surface of series coupling portion 162 or a different portion of coupling 50*b*. In other embodiments series coupling portion 162 has various numbers of male protrusions. In still another embodiment there are no male protrusions on series coupling portion 162. We contemplate making series coupling portion 162 in a length of approximately 3-12" and out of a rigid material such as aluminum or steel, though other materials and lengths are possible.

Figure 28:
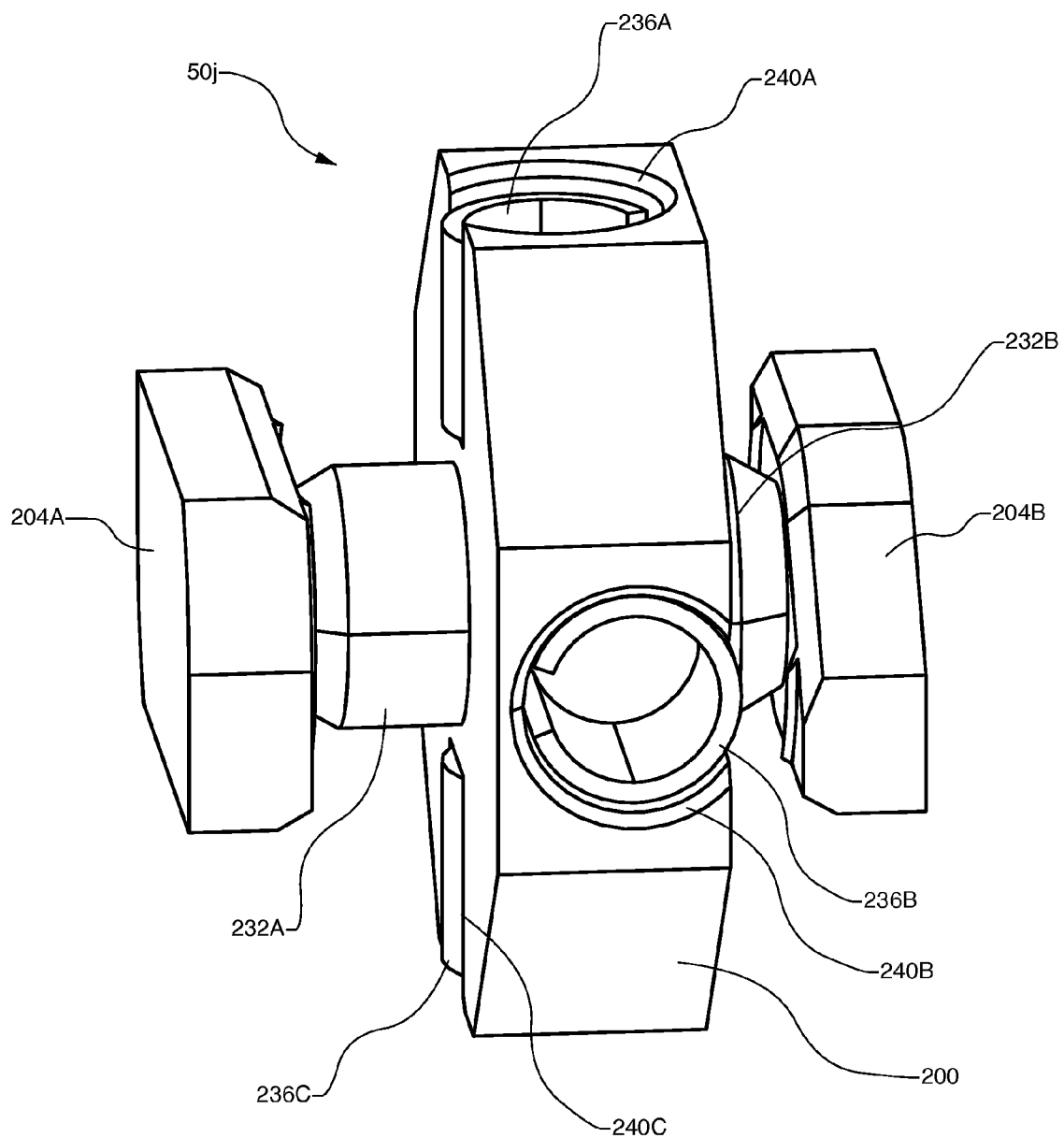

FIG. 28 shows a perspective view of parallel coupling 50*j* which comprises all of the same portions as coupling 50*a* except the following. First, shaft portion 102A, designated here as 232A, has been extended by approximately the width of bracket 132. Second, rotating portion 100 has been replaced by rotating portion 200 comprising four springs 236A, 236B, 236C, 236D, (not all viewable here), two for each side of coupling 50*j* oriented approximately 180 degrees apart. And third, spring bores 110U, 110L have been replaced by spring bores 240A, 240B, 240C, 240D to correspond with new springs 236A, 236B, 236C, 236D. Coupling 50*j* further comprises locking portions 204A, 204B which function the same as locking portions 104A, 104B. All remaining portions of coupling 50*j* are the same as coupling 50*a* and are thus not specifically designated here. Parallel coupling portion 50*bb* in this second embodiment is the same as coupling 50*j* and thus also references the same designations.

Figure 29:
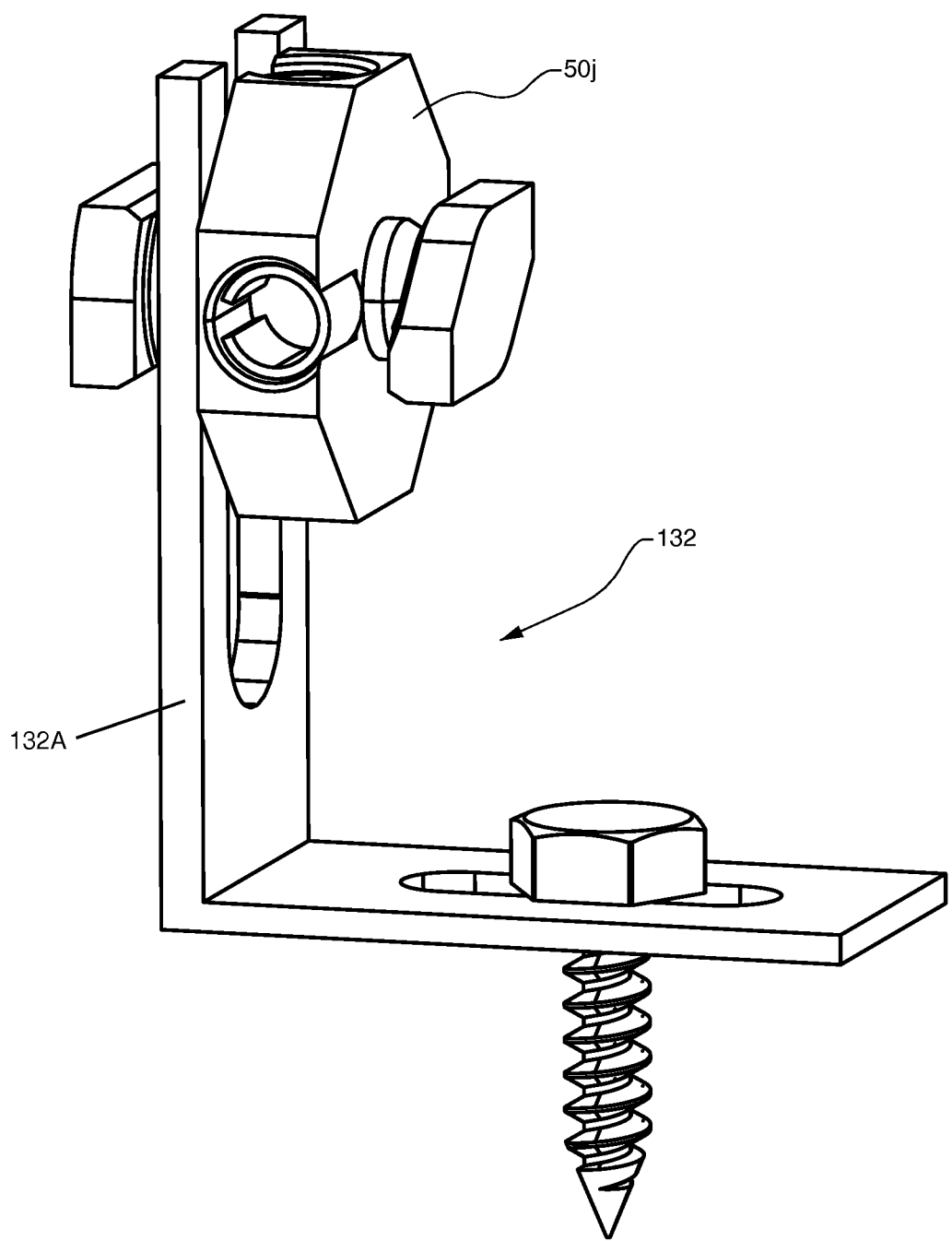

FIG. 29 shows a perspective view of height adjustable bracket 132 and parallel coupling 50*j*. Another advantage of the second embodiment of the present invention is that extended shaft portion 132A allows coupling 50*j* to perform a dual function of interlocking adjacent PV modules together as discussed above while also attaching bracket 132 to PV module 11. This feature substantially reduces installation time when compared to prior art systems that require the tightening of separate fasteners for couplings and brackets. Vertical adjustment slot 140 in bracket 132 is approximately perpendicular to slot 26A, 26B, and that springs 236A, 236B, 236C, 236D are oriented so that in first position 91 all four springs are free and uncompressed in the same way as coupling 50*a*. Many other spring variations are possible.

Figure 30:
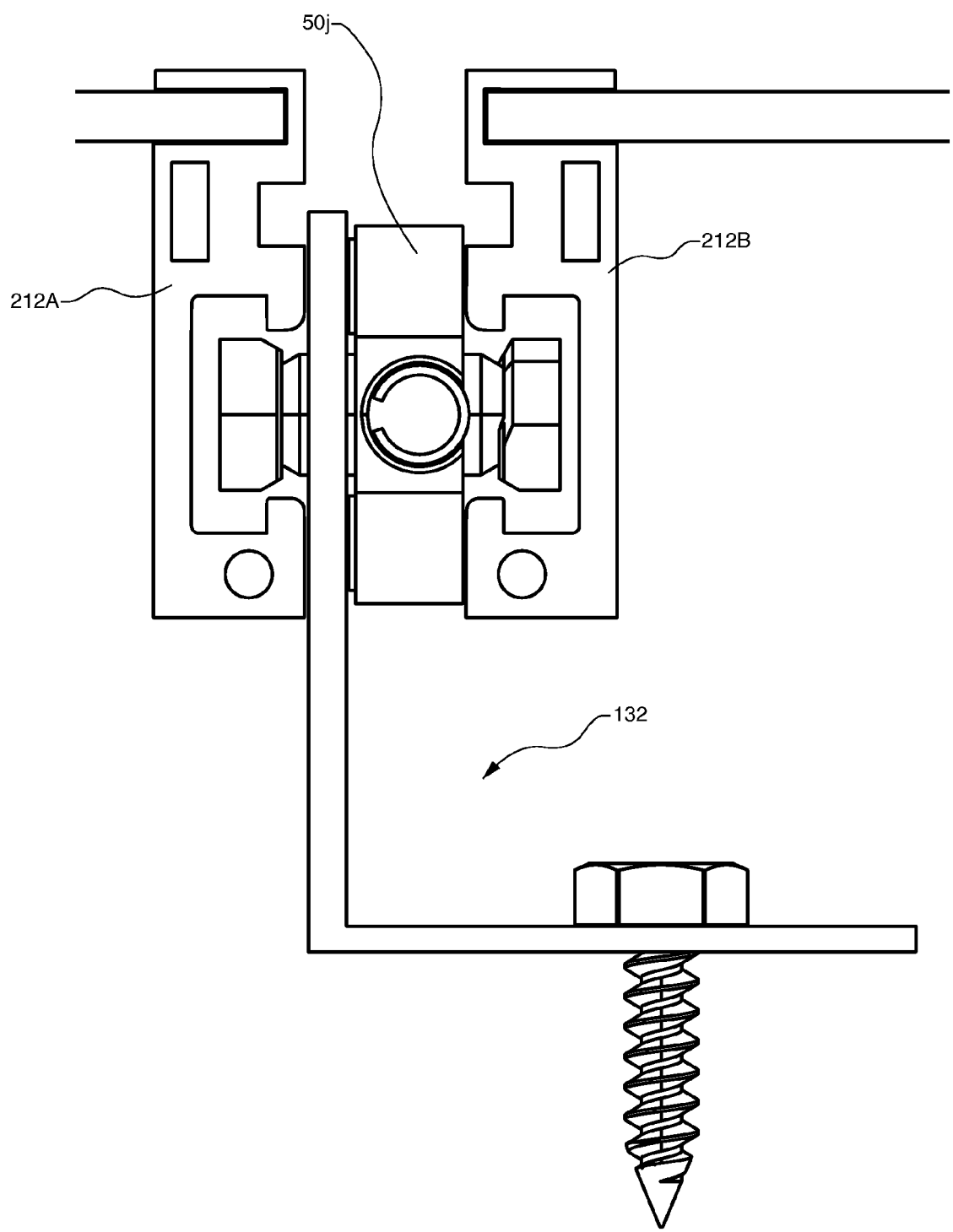

FIG. 30 provides a cross-section showing two adjacent PV modules 212A, 212B which are interconnected with coupling 50*j*. Coupling 50*j* is shown in first position 91 as discussed above. When rotated approximately 90 degrees, coupling 50*j* interlocks frames 212A and 212B together and simultaneously compresses bracket 132 against frame 212A. Thus, channel nut 134 and channel bolt 136 are no longer needed.

Second Embodiment—Operation

Figure 31:
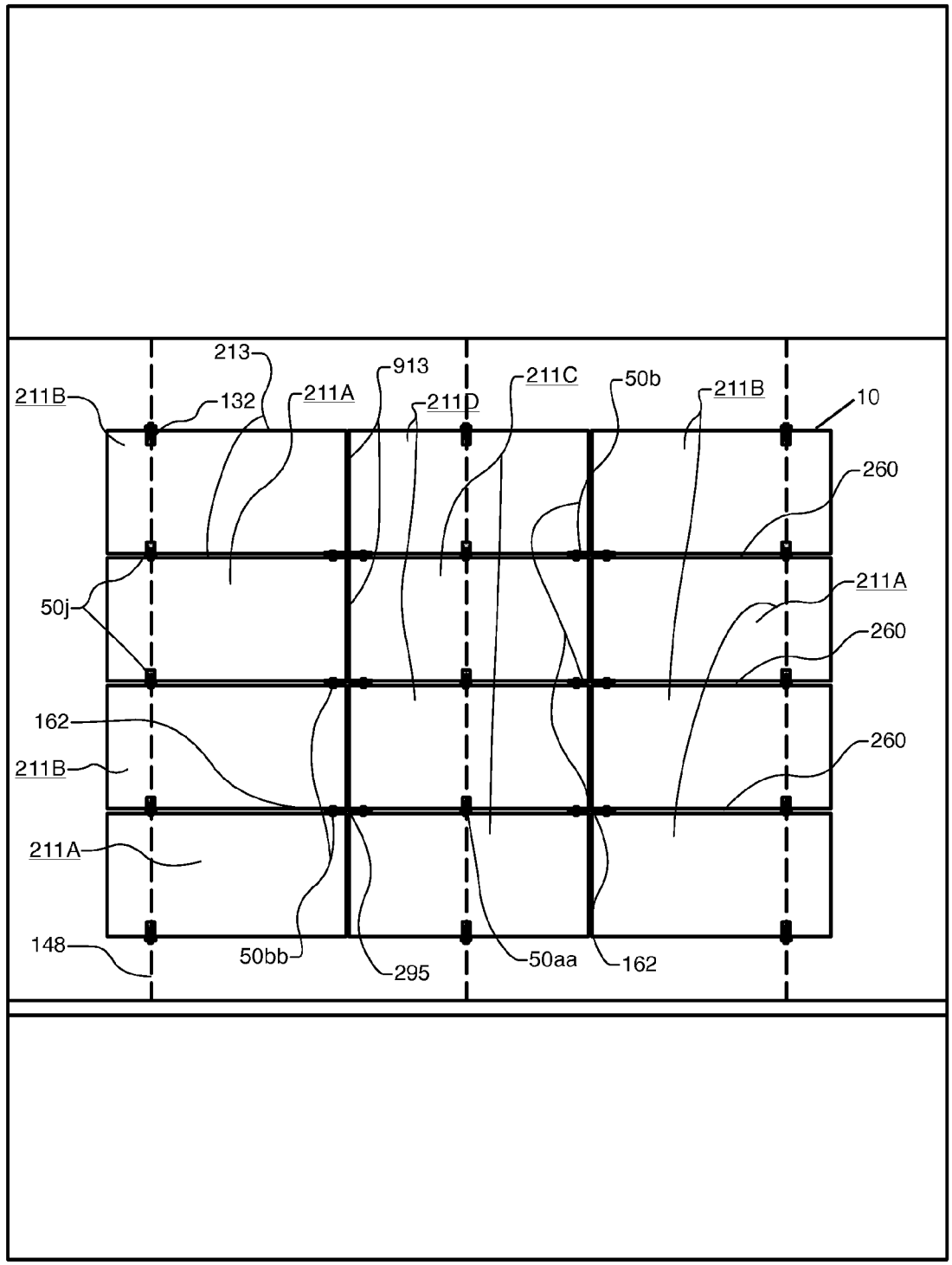

FIG. 31 is the same as FIG. 11 except that PV array 10 utilizes the framing and coupling system of the second embodiment. Brackets 132 are shown in the same locations except now they are connected to frames 212A, 212B, 212C, 212D via couplings 50*j*, thereby reducing total part count and installation time required for PV array 10. Series-parallel couplings 50*b* bridge the corner points where the four corners of PV modules 211A, 211B, 211C, 211D meet. For example, a coupling 50*b* is shown bridging a corner point 295 where four PV modules 211A, 211B, 211C, 211D meet. Parallel coupling portions 50*bb* interlock modules 211A, 211B and 211C, 211D while series coupling portion 162 interlocks modules 211B, 211D and 211A, 211C. Please note that a second series coupling portion between 211A, 211C is possible but not required since parallel coupling portions 50*bb* lock frame 212A to frame 212B and frame 212C to frame 212D along with series coupling portion 162.

Thus, the two axis parallel interlock support system 160 from the first embodiment is replaced by a single axis parallel interlock support system 260 which may run along the x-axis or y-axis. As shown in FIG. 31, parallel coupling portions 50*bb* and parallel couplings 50*j* lock adjacent frame members 213 side to side in parallel which creates vertical rows of paired frame members 213 along the y-axis. Series coupling portions 162 interlock frame members 213 longitudinally along the x-axis, thereby connecting the vertical rows and increasing the overall strength of the system. Series coupling portion 162 is located between rotating portion 100 and outside surface of frames 216. And since parallel coupling portion 50*bb* is rotatable relative to series coupling portion 162, a rotation of rotating portion 100 firmly compresses series coupling portion 162 into frames 212A, 212C. This action serves to substantially increase the strength of frames 212A, 212C relative to a z-axis load (such as wind) in the region of coupling 50*b* since z-axis loads are distributed longitudinally down frames 212A, 212C. While some prior art couplings do also provide increased z-axis strength due this same effect, series coupling portion 162 may be substantially stronger for the following reasons: (a) since series coupling portion 162 is not fully contained within a slot or internal cavity of frames 212A, 212C, it is able to be much taller in the z-direction thereby increasing strength; (b) coupling portion 162 is secured to frames 212A, 212C by a compressive force about a portion of frames 212A, 212C which increases strength instead of a tensile force which tends to deform the frame and decrease strength; (c) coupling portion 162 comprises upper 165 and lower 167 male protrusions which tend to prevent deformation of frames 212A, 212C under load since they prevent widening of opening 227A as seen in FIG. 25; and (d) coupling portion 162 has no fixed center point and therefore may be slid in slots 226A, 226C to match up with high load areas.

Accordingly, a rotation of parallel coupling portion 50*bb* from first position 91 to third position 93 causes locking portion 204A to bear against inside surfaces 209AU, 209AL of slot 226A and rotating portion 200 via springs 236A, 236C to bear against series coupling portion 162 which in turn bears against an opposing frame surface, outside surface 216A. In this case the bearing action of rotating portion 200 is transferred through springs 236A, 236C and series coupling portion 162 to frame 212A. Therefore springs 236A, 236C and series coupling portion 162 are also referred to as force transfer portions. Since there is no series coupling portion 162 between rotating portion 200 and frame 212B, this portion of the coupling process proceeds the same as discussed above for module 12B. That is, locking portion 204B bears against inside surfaces 209BU, 209BL of slot 226B and rotating portion 100 via springs 236B, 236D bears against an opposing frame surface, outside surface 216B. Thus, PV frames 212A and 212B are locked to coupling 50*b* via rotation of rotating portion 200 from first position 91 to third position 93. The other half of coupling 50*b* operates in the same way to lock frames 212C and 212D to coupling 50*b*. Thus it is clear that coupling 50*b* securely interlocks PV modules 211A, 211B, 211C, and 211D together by bearing against opposing surfaces on each frame 212A, 212B, 212C, 212D upon rotation of rotating portions 200. In other embodiments devices which are removable from a mounted PV module 211 along with coupling 50*b*, such as washers, pressure distribution plates, and springs, are placed between coupling 50*b* and frame 212. In these cases such devices are sometimes referred to as force transfer portions and are considered to be part of coupling 50*b* in the same way that series coupling portion is so incorporated. On the other hand, brackets and struts which span between PV modules 211 and/or are attached to a mounting surface are not considered to be a part of coupling 50*b* since they are not removable with coupling 50*b*.

As shown in FIG. 30, the second embodiment of the present invention provides a means for reducing parts and labor costs by combining the function of attaching bracket 132 with the function of interlocking two adjacent PV modules 211A, 211B. Thus, the installation of PV array now has one less step. To our knowledge there are no prior art systems which teach a combined functionality coupling which can both couple the sides of two adjacent PV modules together in parallel and simultaneously secure a height adjustable bracket to the side of frame 212A.

The basic steps involved in the forming and mounting of PV array 10 according to the second embodiment of the present invention may be as follows:

Step 1: Secure a first PV module 211 to a mounting surface 144 with at least one bracket 132.

Step 2: Interlock a second PV module 211 to the first PV module 211 with at least one parallel coupling 50*b* or 50*j* which interlocks the sides of two adjacent frame members together in parallel.

Step 3: Attach second PV module 211 to mounting surface 144 with at least one bracket 132.

Step 4: Repeat steps 2 and 3 for all remaining PV modules 211 in PV array 10, successively interlocking each new PV module 211 to the side of a mounted PV module 211 and attaching at least one bracket 132 to each module.

Parallel couplings 50*b* may be used at substantially all corner points 295 where four PV modules 211 meet. Substantially all brackets which are mounted in the seams between PV modules 211 may be attached via couplings 50*j*. Final tightening of each coupling 50*b*, 50*j* and bracket 132 connection is flexible and does not necessarily coincide with initial placement in array 10 of that module 211. This flexibility allows PV modules 211 to be temporarily positioned in the array while others are positioned or while wiring or other installation issues are handled. Since all couplings 50*b* and 50*j* are capable of being tightened from the top, PV modules 211 can be moved into locked mode at any time. The 2-axis nature of the couplings in the embodiment under discussion means that PV modules 211 can be installed in any order and in substantially any shape for PV array 10 as long as each new PV module 211 is interlocked to a mounted PV module 211, and all new modules 211 are added to a mounted module which has a portion of a frame member 213 free (not already interlocked to another PV module). Stepped arrays as discussed above are not possible when using couplings 50*b*.

In another embodiment which is similar to the first embodiment discussed above, couplings 50*j* replace couplings 50*a* thereby enabling the capture of brackets 132 with couplings 50*j*, while also retaining the benefits of an all-parallel coupling installation as discussed.

Third Embodiment

Figures 32, 33:
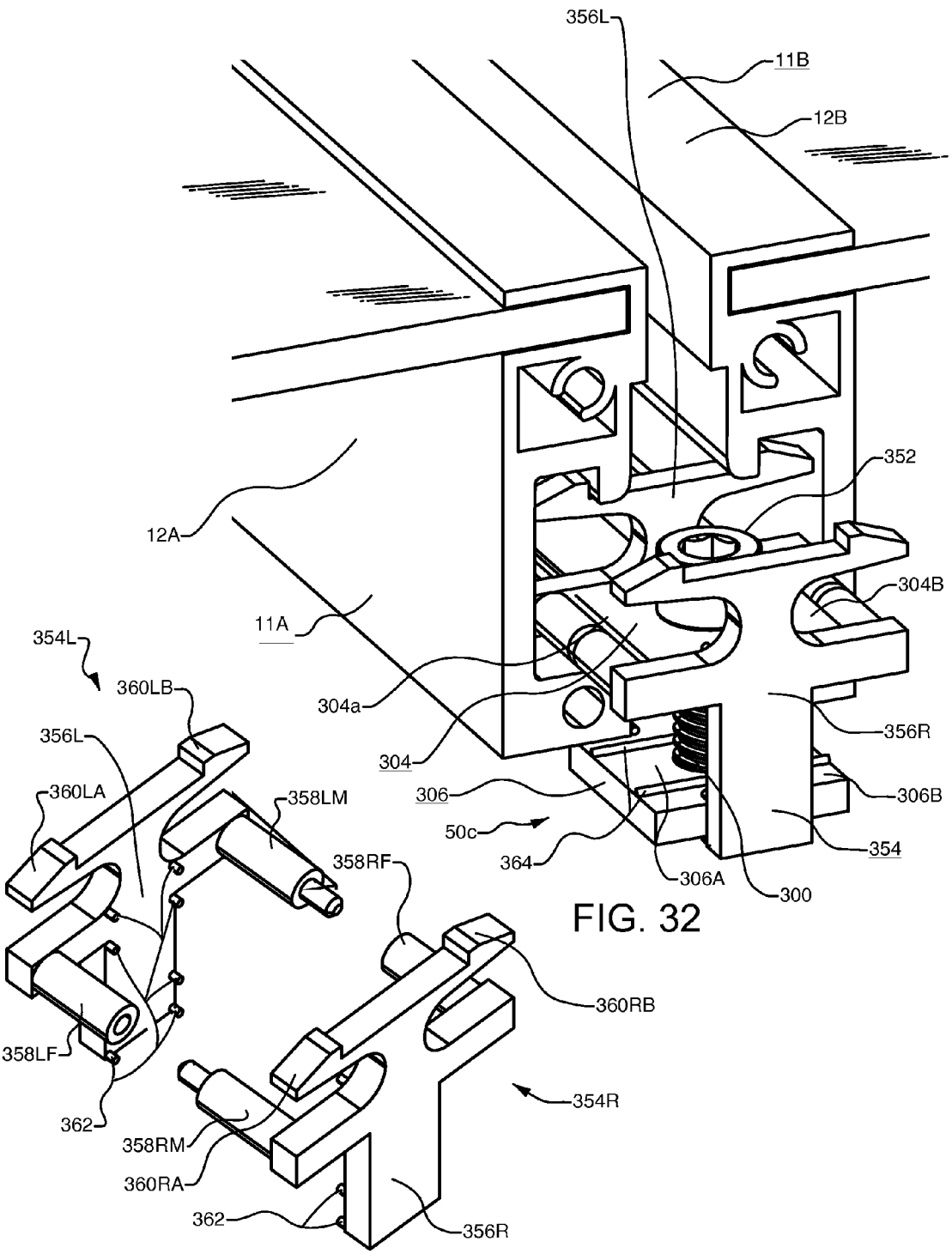
FIGS. 32-34 depict a third embodiment of the present invention.
Figure 34:
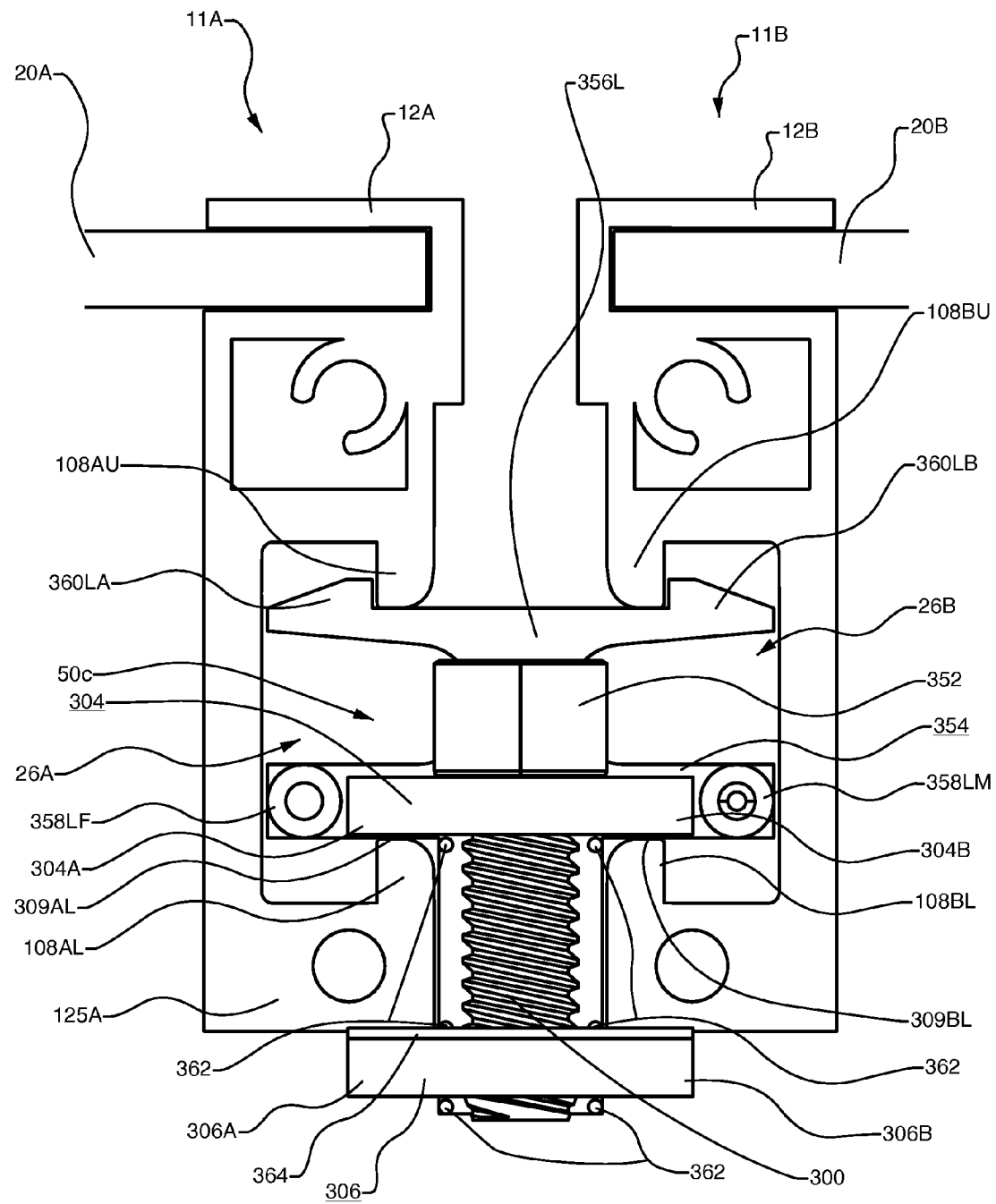

FIGS. 32-34 depict a third embodiment of the present invention. This embodiment is similar to the first embodiment described above except that the orientation of the coupling action of coupling 50*a* has been altered and a retaining element has been added. Instead of bearing against vertically oriented opposing surfaces on frame 12, a parallel coupling 50*c* is provided to bear against horizontally oriented opposing surfaces on frame 12.

FIG. 32 shows a perspective view of parallel coupling 50*c* which has been installed into slots 26A, 26B of two adjacent PV modules 11A, 11B but not fully tightened down. Frames 12A, 12B have been cut away so that coupling 50*c* shows in this view. FIG. 33 provides an exploded view of the two sides of a retainer portion 354L, 354R. FIG. 34 provides a cross-section view cut through two adjacent PV modules 11A, 11B which are coupled together with parallel coupling 50*c*. The cross section is cut partially through coupling 50*c* as indicated.

Referring to FIGS. 32-34, coupling 50*c* comprises retainer portion 354 which holds a locking portion 304 and a nut portion 306 via position tabs 362. Locking portion 304 may comprise a first side 304A for locking with frame 12A and a second side 304B for locking with frame 12B. Nut portion 306 may comprise a first side 306A for securing to frame 12A and a second side 306B for securing to frame 12B. Retainer portion 354 may comprise two substantially identical halves 356L, 356R which mate together via male and female arm pairs 358LM, 358RF and 358LF, 358RM. Two halves 356L, 356R capture locking portion 304 and nut portion 306 and hold them in position as coupling 50*c* is inserted into slots 26A, 26B. During insertion, snap-lock portions 360LA, 360LB, 360RA, 360RB flex downward then snap back up into position once inserted past flanges 108AU, 108BU. We contemplate making retainer portion 354 out of a plastic material, though many other semi-flexible materials are also suitable. A bolt or threaded rotating portion 300 comprises a head 352 which accepts a tool from above and is used to tighten and loosen coupling 50c about frames 12A, 12B. Locking portion 304 comprises a hole for rotating portion 300 which is larger than the outside diameter of rotating portion 300 and is not threaded. Nut portion 306 is drilled and tapped for the threads on rotating portion 300 and comprises teeth 364 for biting into frames 12A, 12B when coupling 50c is tightened, thereby providing electrical ground continuity between modules 11A, 11B and enhancing the structural connection of coupling 50c. We contemplate making locking portion 304, and nut portion 306 out of a rigid material such as aluminum or steel, though other materials are also suitable.

Operation of the apparatus of the third embodiment is similar to the first embodiment except for the operation of coupling 50c. Coupling 50c may be pre-assembled in a factory by mating halves 356L, 356R about locking portion 304 and nut portion 306 so that coupling 50c may be deployed as a one-piece unit ready for installation in the field. To install, coupling 50c is inserted at substantially any point along slot 26A in PV module 11A. Coupling 50c is inserted with snap-lock portions 360LA, 360RA pointing towards opening 27A in slot 26A and with a direction of travel which is substantially parallel with the plane of laminate 20A and substantially perpendicular to the length of slot 26A. Coupling 50c is inserted until snap-lock portions 360LA, 360RA clear flange 108AU and snap into place. Coupling 50c is now in positioning mode and ready to be coupled to PV module 11B. With coupling 50c being held in place by retainer portion 354, PV modules 11A and 11B are free to be moved independently from each other. Thus, this embodiment provides the same independent movement capability in positioning mode as discussed above for the first embodiment, but coupling 50c is held in position during this phase by retainer portion 354 instead of locking portions 104A, 104B. To complete the coupling operation, coupling 50c is inserted into slot 26B until it snaps in place as described above. Then a driver is used to engage rotating portion head 352 and rotate rotating portion 300 which pulls nut portion 306 toward slots 26A, 26B and pushes locking portion 304 away from slots 26A, 26B.

More specifically, rotation of rotating portion 300 causes locking portion 304 and nut portion 306 to move closer together which in turn causes locking portion 304 to bear against inside surfaces 309AL, 309BL of slots 26A, 26B and nut portion 306 to bear against opposing surfaces, bottom surfaces 15A, 15B of frames 12A, 12B. Thus it is clear that coupling 50c securely interlocks PV modules 11A and 11B together by bearing against opposing surfaces on each frame 12A, 12B upon rotation of rotating portion 300. As locking portion 304 and nut portion 300 tighten about frames 12A, 12B position tabs 362 bend or break since they are overpowered by the force delivered by the driver to rotating portion 300. Once rotating portion 300 is tight, coupling 50c is now in locked mode. Sliding mode can be accessed at any time by loosening rotating portion 300, which is still accessible from the top even after array 10 has been formed. As with the first embodiment, sliding mode allows sliding of coupling 50c over to a neighboring seam 150 or 152 so that a module can be removed from the middle of a formed PV array 10.

In other embodiments a surface area of contact between locking portion 304 and frames 12A, 12B is increased by widening or removing altogether flanges 108AL, 108BL. Another embodiment extends locking portion 304 and nut portion 306 with series coupling portions so that they reach over to the next pair of modules, thereby creating a four module coupling similar the second embodiment above. In another embodiment locking portion 304 comprises a spring element for bearing against an inside surface of slot 226. In yet another embodiment retainer portion 354 is shaped differently so that it comprises spring elements for the top and bottom flanges.

Fourth Embodiment

FIGS. 35-38 depict a fourth embodiment of the present invention. This embodiment is similar to the second embodiment as described above except that locking portions 204A, 204B and rotating portions 200 have been altered slightly.

Figure 35:
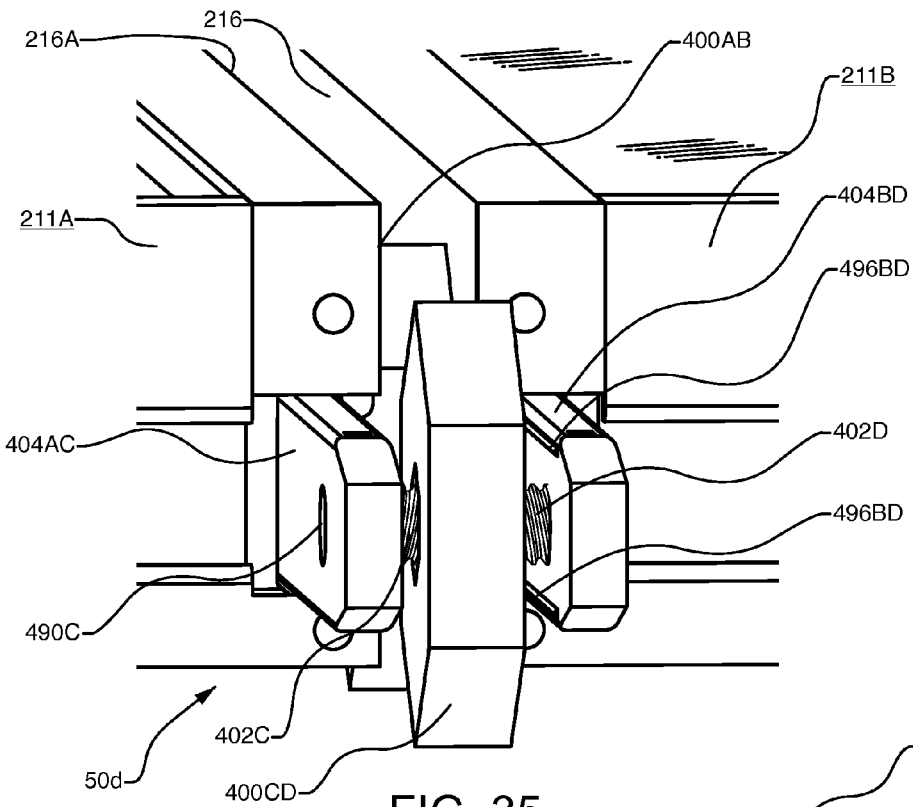
FIGS. 35-38 depict a fourth embodiment of the present invention.
Figure 36:
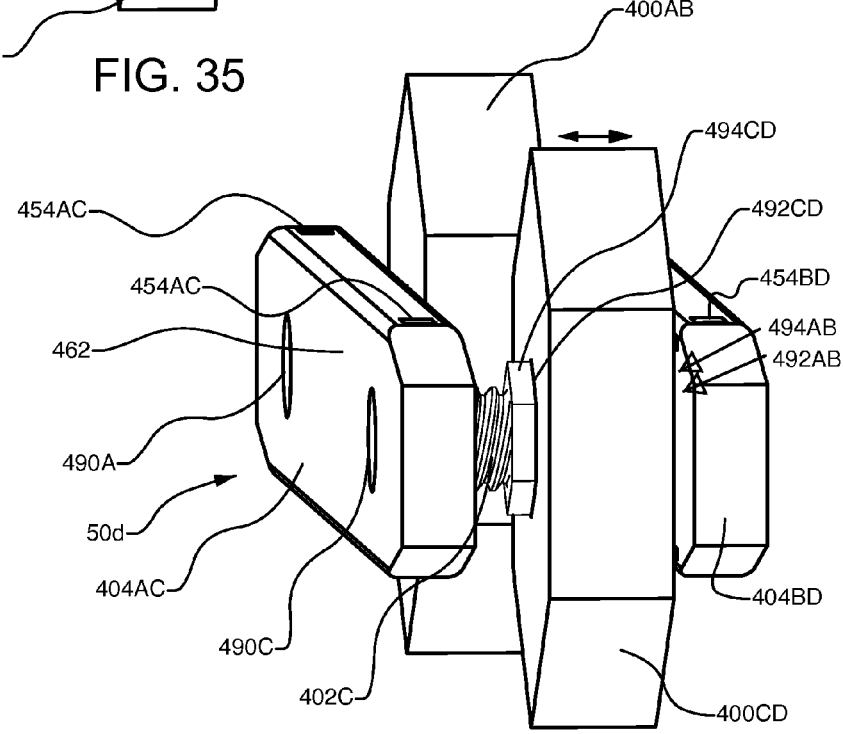
Figure 37:
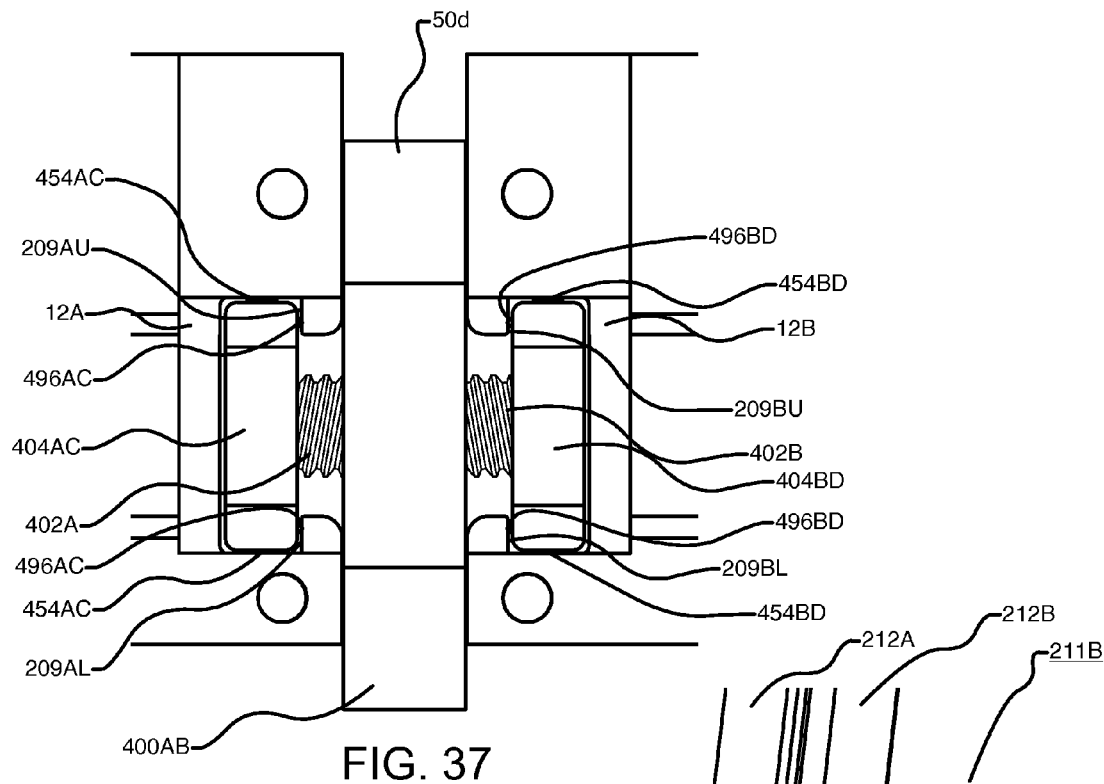
Figure 38:
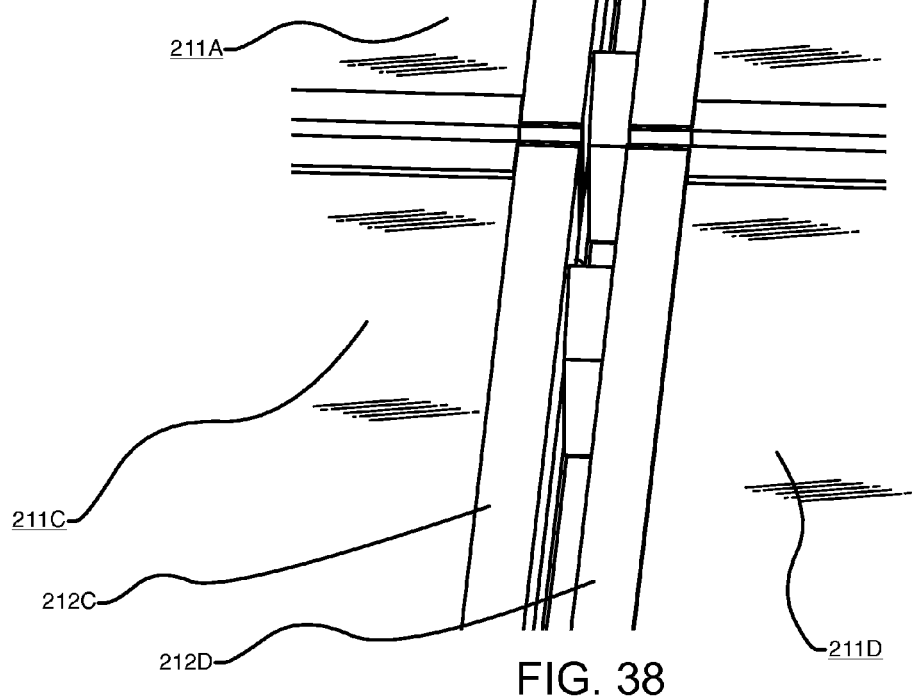

FIG. 35 depicts a perspective view of a parallel coupling 50d installed in two adjacent PV modules 211A, 211B and FIG. 36 presents a perspective view of coupling 50d with a rotating portion 400CD which has been slid over to the right (see below for explanation). FIG. 37 provides a cross section cut through a seam between four PV modules 211A, 211B, 211C, 211D which have been interlocked together with coupling 50d, and FIG. 38 depicts a perspective view of four interlocked PV modules 211A, 211B, 211C, 211D. Parallel coupling 50d comprises locking portions 404AC, 404BD and rotating portions 400AB, 400CD which serve to compress frames 212 upon movement of coupling 50d into locked mode. Locking portions 404AC, 404BD differ from locking portions 104A, 104B in that they have been elongated with series coupling portions 462 to bridge between the two pairs of PV modules 211A, 211C and 211B, 211D; thus enabling coupling 50d to interlock four adjacent PV modules in a similar manner to the second embodiment except without requiring a separate series coupling portion 162. Coupling 50d is deployable in the field as a one-piece unit which is capable of interlocking four PV modules 211A, 211B, 211C, 211D together. Instead of utilizing two parallel coupling portions 50bb plus series coupling portion 162 as discussed for the second embodiment, this embodiment substantially allows two coupling members to share two locking portions 404AC, 404BD thereby creating a "double coupling" device. Since locking portions 404AC, 404BD can no longer rotate within slots 26A, 26B, 26C, 26D to tighten coupling 50d, threaded shaft portions 402A, 402B, 402C, 402D (not all visible) replace shaft portions 232A, 232B and thread into threaded holes 490A, 490B, 490C, 490D (not all visible) in locking portions 404AC, 404BD. Opposite ends of shaft portions 402A, 402B and 402C, 402D are provided with opposite handed threads so that rotation of shaft portions 402A, 402B, 402C, 402D causes locking portions 404AC, 404BD to move horizontally in opposite directions from each other according to the arrow shown in FIG. 36. Rotating portions 400AB, 400CD replace rotating portions 100 and function the same except that rotating portions 400AB, 400CD are decoupled from shaft portions 402A, 402B, 402C, 402D allowing them to move horizontally independently from shaft portions 402A, 402B, 402C, 402D according to the arrow shown on FIG. 36. Rotating portions 400AB, 400CD, however, cannot rotate independently from their respective shaft portions 402A, 402B and 402C, 402D as they are provided with hexagonal bores 492AB, 492CD to match hexagonal portions 494AB, 494CD which may be rigidly connected or formed from shaft portions 402A, 402B and 402C, 402D respectively. In other embodiments hexagonal parts are provided with other shapes to achieve the same functionality.

Referring specifically to FIG. 37, it is evident that a rotation of rotating portion 400AB with a wrench in a first direction causes locking portions 404AC, 404BD to pull frames 212A, 212B towards each other. Since rotating portion 400AB is slidable, it slides along hexagonal shaft portion 494AB until it is contacting both outside surfaces 216A, 216B of PV modules 211A, 211B. Additional rotation in the first direction after both frames 212A, 212B have contacted rotating portion 400AB causes locking portion 404AC to bear against inside surfaces 209AU, 209AL of slot 226A and rotating portion 400AB to bear against an opposing frame surface, outside surface 216A. Likewise, rotation of rotating portion 400AB causes locking portion 404BD to bear against inside surfaces 209BU, 209BL of slot 226B and rotating portion 400AB to bear against an opposing frame surface, outside surface 216B. Thus, PV frames 212A and 212B are locked to coupling 50d via rotation of rotating portion 400AB. The other half of coupling 50d operates in the same way to lock frames 212C and 212D to coupling 50d. Thus it is clear that coupling 50d securely interlocks PV modules 211A, 211B, 211C, and 211D together by bearing against opposing surfaces on each frame 212A, 212B, 212C, 212D upon rotation of rotating portions 400AB, 400CD.

Once both rotating portions 400AB and 400CD have been rotated into their fully tightened positions, coupling 50d is in locked mode as discussed earlier. Rotation of rotating portion 400AB in a second direction which is opposite the first direction decouples PV modules 211A and 211B. If both rotating portions 400AB and 400CD are rotated so as to decouple PV modules 211A, 211B and 211C, 211D respectively, then coupling 50d is shifted into sliding mode and is therefore free to slide completely over into the slots of either PV modules 211A, 211B or 211C, 211D.

FIGS. 35 and 37 also reveal raised portions or teeth 496AC and 496BD on locking portions 404AC, 404BD which bite into frames 212A, 212B, 212C, 212D when coupling 50d is tightened thereby providing a reliable electrical ground connection between all four PV modules 211A, 211B, 211C, 211D and enhancing the structural properties of coupling 50d. These drawings also show optional retainer portions 454AC, 454BD on the top and bottom of locking portions 404AC, 404BD. Retainer portions 454AC, 454BD may comprise a flexible material which allows insertion of coupling 50d into a pair of slots 226A, 226B from the end but prevents coupling 50d from falling back out on its own or from sliding around prior to being shifted into locked mode. Another embodiment is the same as the fourth embodiment except only comprises one rotating portion and is approximately half as long. This embodiment functions the same but is optimized to interlock two PV modules 211 together instead of four.

The fourth embodiment provides several advantages relative to some of the other embodiments discussed herein. The sliding capability of rotating portion eliminates the need for springs 236A, 236B, 236C, 236D; incorporation of a series coupling portion 462 into locking portions 404AC, 404BD eliminates the need for series coupling portion 162; and manufacturing costs may be reduced. However, series coupling portion 462 is not as strong as series coupling portion 162 since it must be contained within slots 226A, 226B.

Additional Embodiments

FIGS. 39-40 depict a perspective view and a cross section cut between two interlocked PV modules 211A, 211B respectively for an alternate embodiment which is similar to the fourth embodiment as shown in FIGS. 35-38. This embodiment, which helps to lower manufacturing costs, provides a parallel coupling 50e in which rotating portions 400AB, 400CD have been eliminated in favor of a plurality of rotating portions 500. This arrangement enables the attachment of coupling 50e to frames 212 via a bearing action against two opposing surfaces which are both inside of slot 226 instead of one internal and one external as shown for the fourth embodiment. Locking portions 504AC, 504BD are almost the same as before, but now retainer portions 454AC, 454BD and teeth 496AC, 496BD have been eliminated. Locking portions 504AC, 504BD are rigidly joined together by y-axis spacer block 574 with x-axis spacer screw 576. Spacer screw 576 is in place as shown during initial installation so that each module can be slid up to screw 576. But if a module needs to be removed from array 10 after compete installation, spacer screw 576 is removed and coupling 50e is slid completely over to the next horizontal seam 150. Locking portions 504AC, 504BD also comprise series coupling portions 562 as before. Rotating portions 500 comprise shaft portions 502 which may be threaded and further provided with a cupped end for biting into frames 212 to insure reliable electrical ground and to enhance the structural properties of coupling 50e. Thus, rotating portions 500 comprise a portion which resides inside of slots 226 and a portion which resides outside of frames 212. The external portion of rotating portions 500 may also comprise a hexagonal or other shaped head portion 503 which allows rotation from above similar to rotating portions 400AB, 400CD.

Referring to FIG. 40 and the coupling process between PV modules 211A, 211B, a rotation of rotating portions 500 causes them to bear against inside surfaces 507A, 507B of slots 226A, 226B thereby forcing locking portions 504AC, 504BD to bear against opposing inside surfaces 509AU, 509AL, 509BU, 509BL, thereby securely coupling the sides of adjacent PV modules 211A and 211B together. Since coupling 50e, like coupling 50d, is designed to connect four adjacent PV modules together, the coupling of modules 212C and 212D utilizes the same process as just discussed for PV modules 212A and 212B. Thus it is clear that coupling 50e securely interlocks PV modules 211A, 211B, 211C, and 211D together by bearing against opposing surfaces on each frame 212A, 212B, 212C, 212D upon rotation of rotating portions 500.

In another embodiment similar to the previous the half of locking portions 504AC, 504BD that interlock PV modules 211C, 211D together is eliminated along with series coupling portion 562. This leaves a two-module parallel coupling which is possibly suitable for use in PV array 10 along with couplings 50e (like at the ends of rows). In another embodiment a coupling is formed out of a single locking portion 504AC along with associated rotating portions 500 from coupling 50e. While this embodiment is similar to prior art series couplings, it differs significantly in that the coupling action results from a bearing on two opposing surfaces of slot 226 (for increased strength). Furthermore, there is no press-fit action and the grounding is provided by rotating portions 500. Another embodiment is similar to the embodiment of FIGS. 39-40 except that spacer block 574 is slidably held between locking portions 504AC, 504BD via pins between locking portions and is taller than slot opening 227A. This variation works similarly to the fourth embodiment except that instead of rotating portions sliding to set the spacing between modules, it is the spacer block which slides. In still another embodiment multiple spacer blocks are utilized.

FIGS. 41-42 depict a cross section cut between two interlocked PV modules 11A, 11B (not shown, appearing in FIG. 3 and others) and a perspective view respectively for an alternate embodiment which is similar to the first embodiment as shown in FIGS. 1-24, but may lower manufacturing costs. This embodiment provides a coupling 50f with locking portions 604A, 604B which are threaded into rotating portion 600 via shaft portions 602A, 602B instead of being rigidly connected thereto. Rotating portion 600 has also been trimmed down in size so that coupling 50f can not only be slid into the slots 26A, 26B of a neighboring pair of PV modules (in sliding mode), but so that it can also "turn the corner" and move from an x-axis direction slot into a y-axis direction slot and vice versa. This feature enables removal of a PV module even when the slots within the PV array are not aligned in one direction. This may occur in some cases by accident, or in other cases due to tolerance issues, or for architectural reasons. Springs 606U, 606L on rotating portion 600 are smaller than before but function the same. Shaft portions 602A, 602B are provided with opposite threading so that rotation of rotating portion 600 causes locking portion 604A to bear against inside surface 109AU, 109AL of slot 26A and rotating portion 600 to bear against an opposing surface, outside surface 16A of frame 12A. Likewise, locking portion 604B bears against inside surface 109BU, 109BL of slot 26B and rotating portion 600 bears against an opposing surface, outside surface 16B of frame 12B. Thus it is clear that coupling 50f securely interlocks PV modules 11A, 11B together by bearing against opposing surfaces on each frame 12A, 12B upon rotation of rotating portion 600.

In another embodiment similar to the previous one discussed, locking portion 604A and shaft portion 602A is replaced by locking portion 104A and shaft 102A from the first embodiment.

FIGS. 43-44 depict a perspective view and a cross section cut between two interlocked PV modules 11A, 11B (not shown, appearing in FIG. 3 and others) respectively for an alternate embodiment which is similar to the third embodiment as shown in FIGS. 32-34. This embodiment lowers the amount of installation time required by replacing rotating portion 300 with a shaft 750 and cams 780A, 780B on a parallel coupling 50g. Cams 780A, 780B are rigidly connected to rotating portion 700 which is rotatable about axle 788 with a wrench from above. Shaft 750 comprises a flat, narrow portion 774 with a hole (not visible) that shaft 788 runs through, a medium diameter portion 775, a larger diameter portion 776, and a head portion 752. A washer portion 706 with sides 706A, 706B is positioned on shaft portion 776 and comprises a bore (not viewable) larger than shaft portion 776 but smaller than a diameter of head portion 752. A locking portion 704 with sides 704A, 704B is positioned on shaft portion 775 and comprises a bore (not viewable) larger than shaft portion 775 but smaller than shaft portion 776. Locking portion 704 comprises thicker portions 785A, 785B and is pushed down onto ledge 788 by retainer springs 756A, 756B (in direction of arrow) when not installed.

To operate, cams 780A, 780B are rotated so that they are not touching locking portion 704. Then coupling 50g is snapped onto frame 12A. We contemplate making springs 756A, 756B out of a flexible material such as rubber or similar so that they allow locking portion 704 and washer portion 706 to open up when pushed onto frame 12A. Thicker portions 785A, 785B in conjunction with springs 756A, 756B prevent coupling from falling off, thus enabling positioning mode. Frame 12B and coupling 50g are wedded in the same fashion. Once coupling 50g is loosely positioned onto both frames 12A, 12B, then a wrench is used to rotate rotating portion 700 which in turn rotates cams 780A, 780B, which force locking portion 704 and washer portion 706 to move toward each other. This movement causes locking portion 704 to bear against inside surfaces 309AL, 309BL of slots 26A, 26B and washer portion 706 to bear against opposing surfaces, bottom surfaces 15A, 15B of frames 12A, 12B. Thus it is clear that coupling 50g securely interlocks PV modules 11A, 11B together by bearing against opposing surfaces on each frame 12A, 12B upon rotation of rotating portion 700. Raised teeth 764 bite into frames 12A, 12B upon tightening, thereby ensuring ground contact and enhancing structural properties as described earlier. In another embodiment springs 756A, 756B comprise a resting position as depicted and therefore do not push locking portion down onto ledge 788 when not installed. Another embodiment provides a cam shape which sets the straight-up position as free, then rotating one direction moves to positioning mode and rotating the other way enables locked mode. And another embodiment provides a handle connected to rotating portion 700.

FIGS. 45-46 depict a perspective view and a cross section cut between two interlocked PV modules 11A, 11B (not shown, appearing in FIG. 3 and others) respectively for an alternate embodiment which is similar to the third embodiment as shown in FIGS. 32-34. This embodiment may provide a lower manufacturing cost by replacing retainer portion 354 with retainer springs 856A, 856B between a locking portion 804 and a nut portion 806. Similar to the previous embodiment, a coupling 50h comprises retainer springs 856A, 856B which pull a locking portion 804 with sides 804A, 804B down onto a ledge 888 when not installed (in direction of arrow). Coupling 50h is snapped onto frame 12A and temporarily held in place during positioning mode by springs 856A, 856B and thicker portions 885A, 885B of locking portion 804. Thicker portions 885A, 885B may also be sized to provide a positive engagement for lateral loads. Rotation of rotating portion 300 causes the coupling to shift to locked mode as described for the third embodiment. Another variation of this embodiment provides springs 856A, 856B which are in their resting state as shown so that ledge 888 is not needed. Yet another variation replaces thicker portions 885A, 885B with teeth that interlock with frame and another provides grounding spikes on locking portion 804.

FIGS. 47-48 depict a cross section cut between two interlocked PV modules 11A, 11B (not shown, appearing in FIG. 3 and others) and a perspective view respectively for an alternate embodiment which is similar to the first embodiment as shown in FIGS. 1-24. The primary distinction of the present embodiment, which describes a coupling 50i, is that locking portions 104A, 104B have been replaced by pairs of locking portions 904AU, 904AL and 904BU, 904BL respectively. The paired locking portions 904AU, 904AL and 904BU, 904BL are provided with ridged camming surfaces 982AU, 982AL, 982BU, 982BL which are adapted to bear against inside surfaces 909AU, 909AL, 909BU, 909BL when a rotating portion 900 is rotated. Rotating portion 900 is rigidly connected to locking portions 904AU, 904AL, 904BU, 904BL via a pair of shafts (not visible) which run through retainer portions 954A, 954B. Retainer portions 954A, 954B may be made of a flexible material so that insertion of retainer portions 954A, 954B into slots 26A, 26B deforms or bends retainer portion enabling positioning mode. Ridges on ridged camming surfaces 982AU, 982AL, 982BU, 982BL bite into frames 12A, 12B upon rotation thereby securing ground contact and increasing the strength of coupling 50*i*. Locking portions 904AU, 904AL, 904BU, 904BL comprise flattened portions 980A, 980B which enable insertion when properly aligned with slots 26A, 26B since they reduce the overall width to less than opening 27A, 27B. Thus, insertion of locking portions 904AU, 904AL, 904BU, 904BL into slots 26A, 26B followed by a rotation of nut portion 900 causes locking portions 904AU, 904AL, 904BU, 904BL to bear against opposing surfaces 909AU, 909AL, 909BU, 909BL, thereby securely coupling the sides of adjacent PV modules 11A and 11B together. In another embodiment locking portions 904AU, 904AL, 904BU, 904BL are rotated 90 degrees from the orientation shown so that rotation of rotating portion 900 causes a camming action between the back of slot 26 and inside surfaces 109AL, 109AU. In another embodiment retainer portions 954A, 954B are eliminated in favor of an offset cam arrangement similar to the first embodiment where one cam is insertable in both first position 91 and second position 92.

FIGS. 49-50 depict an embodiment which is similar to the second embodiment discussed above except that a spacer block 274 has been added. FIG. 49 is the same as 26 except spacer block 274 is shown installed onto series coupling portion 162 via a slot 276 on the bottom side. FIG. 50 provides a perspective view of spacer block 274 which further reveals slot 276 and a bottom mounted wire clip 285 for securing PV module 11 output wires 22neg, 22pos. Securing wiring in this way is a substantial improvement over prior systems since wire clip 285 provides a means of preventing wires from unsightly and unsafe drooping onto roof surfaces. Furthermore, the horizontal seam 150 between PV modules 211A, 211B and 211C, 211D is set for this embodiment slightly wider than the width of wiring plugs 24neg, 24pos; therefore troubleshooting and maintenance of PV array 10 wiring systems is greatly simplified since one can easily snap spacer block 274 up and off from the top and pull wires 22neg, 22pos right up through seam 150 for inspection and repair. No decoupling of PV modules 11A, 11B is required in order to maintain the wiring system between them. In another embodiment a wire clip comprises a spring clip which snaps into slot 26A thereby allowing the strapping of wires substantially along the whole length of frame 26A. In still another embodiment a hinged wire clip 285 snaps into slot 26A and swings underneath module 11 to hide it, then back up into the gap between modules 11 to allow access.

Figure 51:
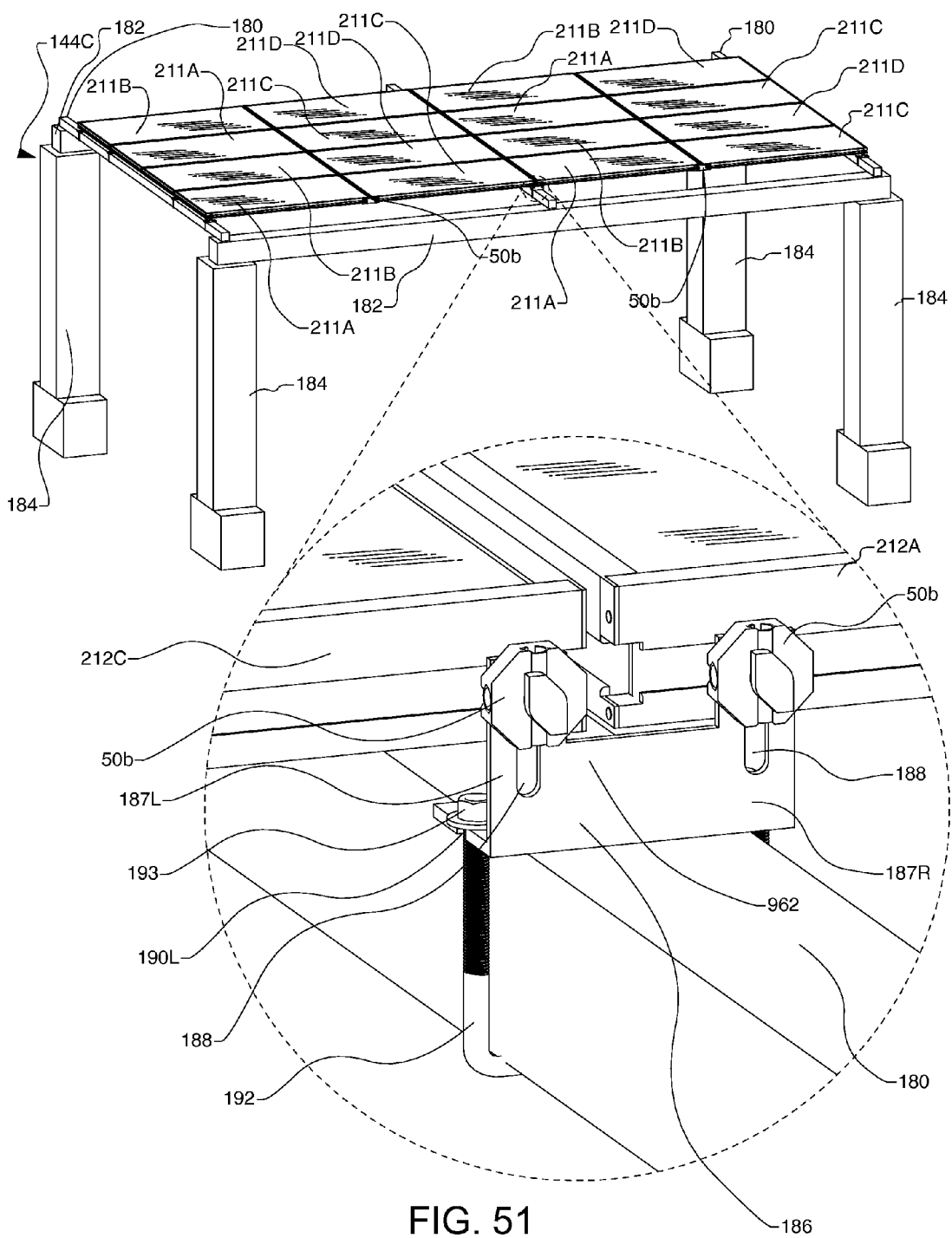
FIGS. 51-52 depict a further alternate embodiment as installed on an open canopy structure.
Figure 52:
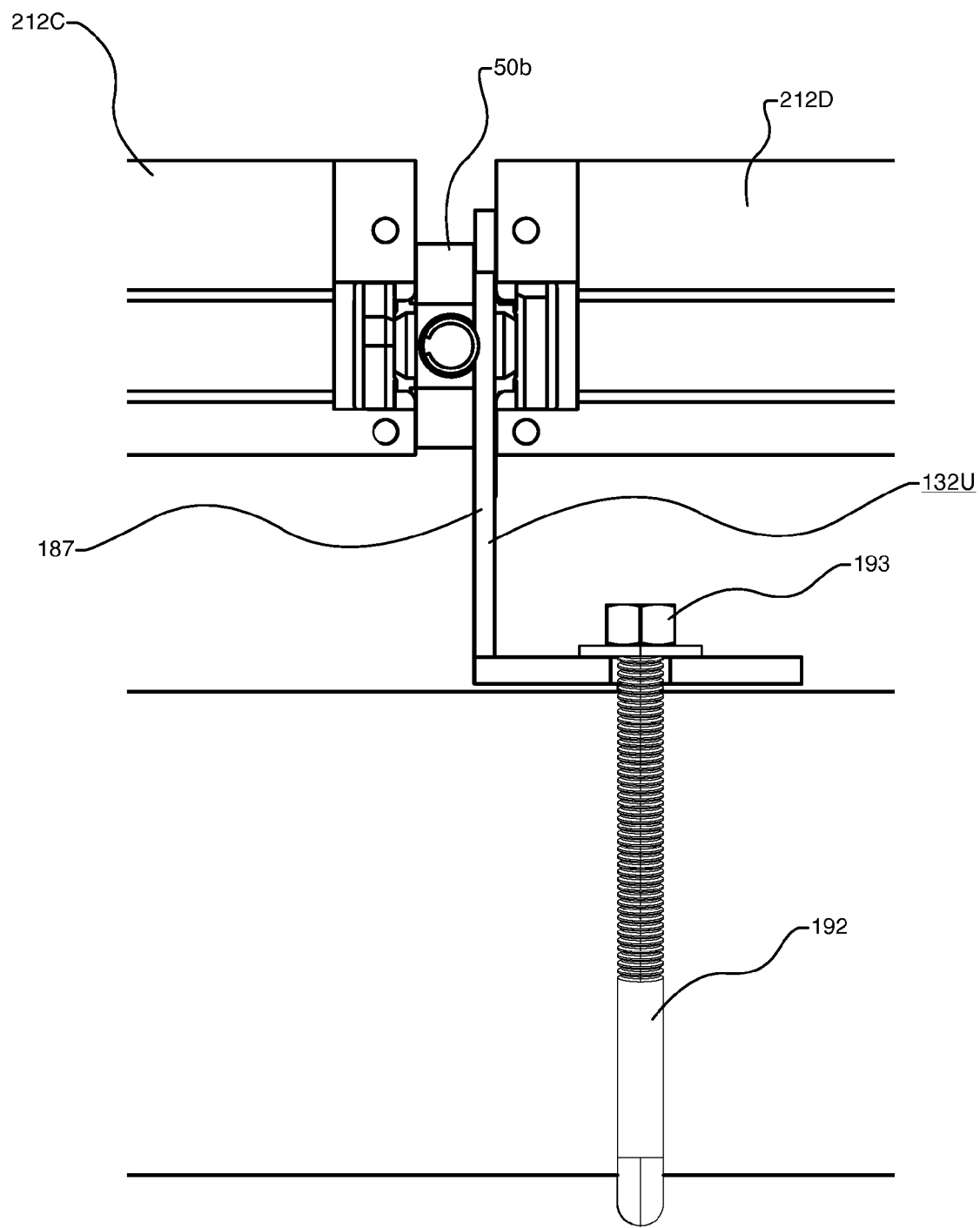

FIGS. 51-52 depict an embodiment of the present invention which is similar to the second embodiment discussed above except that PV array 10 is installed on an open canopy structure 144C instead of roof 144R. Installation on a different mounting surface 144 for PV array 10 requires minor changes to brackets 132 and series coupling portions 162 as will be discussed below.

FIGS. 51 and 52 depict a perspective view and a side view respectively of PV array 10 installed on canopy structure 144C. Canopy 144C comprises purlins 180 which are supported by girders 182 which in turn are supported by vertical columns 184. We contemplate vertical columns 184 of approximately the same height for this embodiment in order to demonstrate that substantially any tilt angle (from flat to vertical) for PV array 10 is suitable. For example, many prior art systems require a specific slope to a PV array in order for the interlocking or mounting systems to function properly, but the coupling and framing systems described herein do not place any such limitations on PV array 10. PV array 10, as shown in FIG. 51, comprises a total of sixteen PV modules which are mechanically interlocked in groups of four with couplings 50*b* in the same manner described in FIGS. 25-28. Use of a different mounting surface 144 in this embodiment requires slight changes to the brackets and the layout of series coupling portions 162. The detail in FIG. 51 shows a double bracket 186 which is utilized to directly connect two frames 212 to purlins 180 in the central vertical seam 152 where the groups of four PV modules 211A, 211B, 211C, 211D come together. Double bracket 186 comprises vertical portions 187L, 187R with vertical adjustment slots 188 for connecting to frames 212 in the same way as bracket 132 only this bracket connects to two adjacent PV modules 211. Each horizontal row along the central vertical seam 152 comprises one double bracket 186, but not all are visible here. Double bracket 186 further comprises U-bolt slots 190L, 190R (not all visible), U-bolt 192, nut and washer 193 for securing double bracket 186 to purlin 180, and a series coupling portion 962. PV modules 211 are secured to the other two purlins by means of a bracket 132U which is similar to double bracket 186 except that there is only one vertical portion 187 since this is the last row of PV modules 211.

Regarding the present embodiment under discussion, it is also important to note that there are no strut or PV frame support members required as would be the case for most prior art systems. For example, PV array 10 as shown in FIG. 51 would normally require an additional layer of PV frame support members 131PA between purlins 180 and PV frames 212 or as an alternative some prior art systems allow increasing the number of purlins shown to 8 (two per row) instead of adding another layer of structural support (thus the purlins become the PV frame support members). The inventive system of this embodiment however creates a parallel interlock support system 160 which only requires connection of PV frames 212 to the three purlins 180 as shown. In other embodiments it is desired to minimize the size of frames 212, therefore additional purlins may be used, but still not as many prior art systems require. In other embodiments brackets 132 are formed in different shapes to facilitate connection to the shape of mounting surface 144. For example, some are shaped to compress a portion of an I-shaped beam whereas others are adapted for connection to circular pipe. Still others are formed as "legs" to allow tilting up one side of an array 10. There are many different types of brackets which may make up the entire scope of the inventive device. Thus, any bracket which has one portion shaped to optimize connection to a mounting surface 144 and another portion which is shaped to optimize connection to at least one PV frame 212, is a suitable bracket 132 for use with the present invention.

Figure 53:
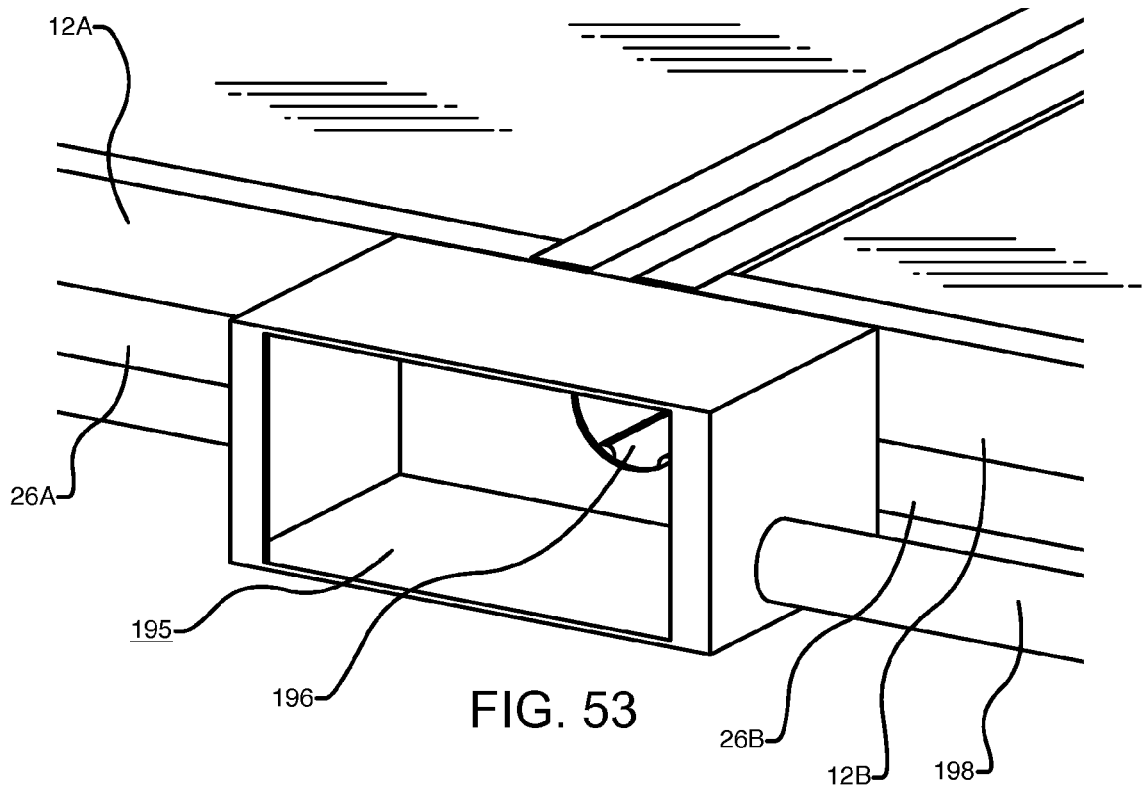
FIGS. 53-54 show an alternate embodiment of a PV array with a snap-in conduit box.
Figure 54:
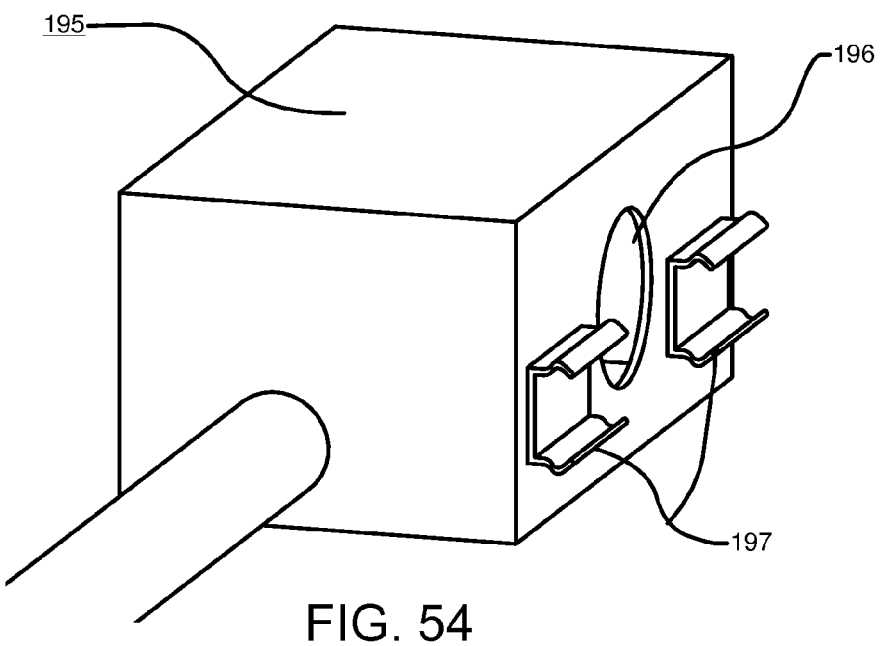

FIGS. 53-54 show an alternate embodiment of PV array 10 which further comprises a snap-in conduit box 195. FIG. 53 depicts a perspective view of two interlocked PV modules 12A, 12B which are at the end of a row. FIG. 54 shows a perspective view of conduit box 195.

Conduit box 195 snaps into slots 26A, 26B via spring clips 197. Hole 196 in the rear of conduit box 195 allows wiring from array 10 to pass into box 195, then out through conduit 198 connected to box 195. An optional cover plate for conduit box 195, as are typical in the art, is not shown here. Use of conduit box 195 along with PV array 10 greatly simplifies wiring since all wiring can be routed through gaps between PV modules 12, then into conduit box 195 and out through conduit 198 to inverters or other system equipment. PV installers commonly fashion means for connecting junction boxes to PV array support structures via strut and other materials. However, a ready-made box saves time in cutting strut and custom rigging for each job. Conduit box 195 may also enhance the aesthetics of array 10 since it may be manufactured to match PV modules frames. In other embodiments conduit box 195 is more firmly attached to frames 12A, 12B by connecting it via bolts or couplings 50*j* instead of spring clips 197, in a similar way to the connection of series coupling portions as shown in the second embodiment above. In still other embodiments conduit box is replaced by a simple plate for receiving a strain relief or conduit coupling.

FIG. 55 depicts a perspective view of an alternate embodiment of PV module 11 as shown in FIG. 1. A PV module 411 with a PV laminate 420 and a frame 412 is shown. Frame 412 comprises two frame members 413 with slots 426 on opposite sides of a laminate back plane or base 409. Devices such as base 409, as are known in the art, may serve to insulate a roof or provide structural support to PV laminate 20 or both. Base 409, however, is not rigid enough to fully support PV laminate 420, and thus frame members 413 are glued, fastened, or otherwise adhered to base 409 or laminate 420 or both in order to provide structural support to PV module 411 and to provide a means for interlocking the sides of an array of PV modules 411 together. Base 409 may be adhered to the underside of PV laminate 420. Since PV laminate 420 is supported by frame members 413 and base 409, it may overhang frame members 413 as shown. In another embodiment frame members 413 enclose base 409.

Other embodiments add different features. For example, one embodiment adds a ball and detent to locking portion 104A, 104B to prevent locking portion 104A, 104B from disengaging or working its way free and provide a position location stop. Another provides a quick-release handle attached to rotating portion 100. The handle is tucked just lower than laminate 20 height when in locked mode and can be rapidly rotated by use of a finger-hold. Such a feature may be of use to firemen in an emergency. Another embodiment provides a locking portion which comprises an expansion bolt. Other embodiments provide various devices which snap into or connect to slot 26 such as: tool holders, tools, string line holders, lights, fasteners, cosmetic flashings, architectural features, snow guards, debris screens, rodent screens, signs, cable clips, bird deterrents, and electrical connector housings.

Figure 56:
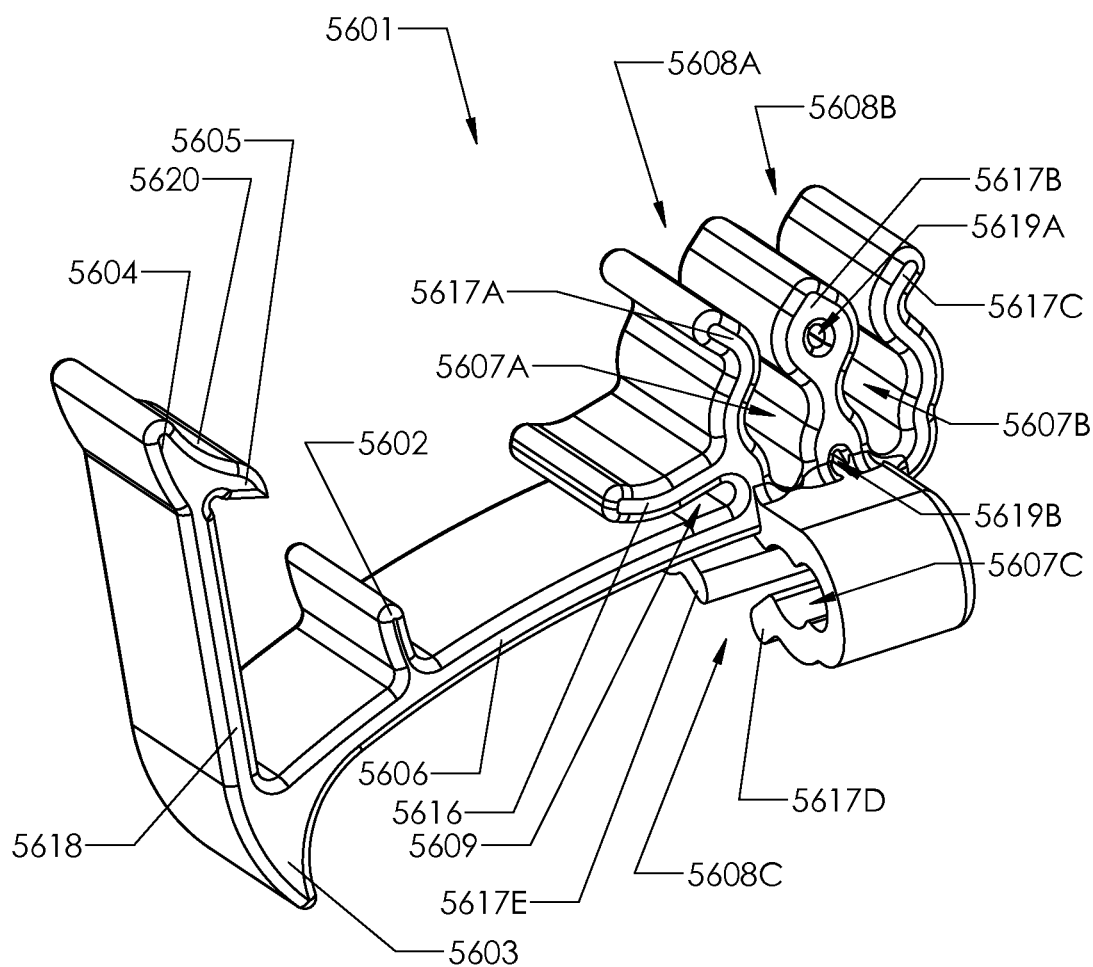
FIG. 56 is a perspective view of an embodiment of a wire clip.

Referring now to FIG. 56, a wire clip, such as wire clip 5601 is shown. Wire clip 5601 may include arm 5606 with brace 5602 that meets trigger 5603 connecting to panel 5618 that terminates in tab 5604 with inside surface 5620 and catch 5605. Brace 5602 may extend outward from arm 5606 and serve as a fulcrum over which arm 5606 flexes or otherwise pivots or deforms to engage a PV module frame, as described more fully below. Trigger 5603 may be formed at or near the intersection of arm 5606 and panel 5618, and may appear as a downward concave curve extending from arm 5606 that then rises as a convex upward curve toward the panel 5618, or may take a different form. Tab 5604 may extend from the top of panel 5618 such that it rises up and away from catch 5605. Catch 5605 may extend from panel 5618 at an angle of less than ninety degrees Inner surface 5620 may be the surface of catch 5605 closest to slot 5609. Wire clip 5601 may further include slot 5609, flange 5616, one or more gathers 5617A-5617E (any of which may include one or more eyelets such as eyelets 5619A-5619B), and one or more wire channels 5607*a*, 5607*b* and 5607*c* with apertures 5608*a*, 5608*b* and 5608*c*, as also shown in FIG. 56 and further described below. Arm 5606 may extend from the trigger 5603 to the opposite end of wire clip 5601 containing the gathers 5617A-5617E. Arm 5606 may be able to flex or otherwise deform to enable engagement with a groove to, without limitation, connect to the frame of a PV Module, as described more fully below. Wire channels 5607A-5607C may appear as the space formed between gathers 5617A-5617E. Wire channel 5607A-5607C may hold and orient cables, wires, cord, or similar components, as described more fully below, and may hold one or more of the foregoing. Wire channel 5607A-5607C may be parallel to arm 5606, perpendicular to arm 5606, or be formed at some other angle with respect to arm 5606. Apertures 5608A-5608C may be the space formed between and at the outward ends of gathers 5617A-5617E. Wires may enter wire channels 5607A-5607C through apertures 5608A-5608C, as discussed more fully below. Slot 5609 may be the space formed between arm 5606 and flange 5616. The bottom panel of a frame may enter the slot 5609 when a wire clip 5601 connects to a frame, as discussed more fully below. Flange 5616 may extend from a portion of wire clip 5601 near gathers 5617A-5617E above arm 5606 and toward panel 5618. Gathers 5617A-5617E may extend up or down from arm 5606, may be curved or linear, and may be oriented parallel to, perpendicular to, or at an angle to arm 5606. A gather such as gather 5617B may be formed with one or more eyelets 5619A-5619B. Gathers 5617A-5617E may guide, lead in, flex or deform to help or encourage a wire or similar component to enter wire channel 5607A-5607C through aperture 5608A-5608C, as discussed more fully below. Eyelets 5619A-5619B may be the space formed in the hollow portions of gather 5617B, or another gather. A panel 5618 may extend vertically from trigger 5603 to tab 5604 and catch 5605. Panel 5618 may flex, pivot, rotate, or deform to enable engagement with a groove in a frame of a PV module, as described more fully below. Wire clip 5601 may be fabricated or constructed from various materials, such as plastic, metal, or another non-conductive or conductive material(s). A wire clip embodiment constructed or fabricated with conductive material(s) may include teeth, grips, tabs, hooks, or other components that cut, puncture, or otherwise pierce the surface of a frame to provide a grounding connection between the wire clip and the frame. Eyelets 5619A-5619B may be used to maintain a uniform thickness of material in various embodiments of wire clip 5601. Various embodiments of a wire clip may hold wires or the like in more than one orientation, for example the embodiments of FIGS. 64A-64B, discussed in detail below, show wires held both parallel and perpendicular to the frame member, at two vertical levels. However, various other embodiments are hereby explicitly disclosed including two or more sets of wires or the like oriented at various degrees of deflection from the length of the frame, such as 5-15 degrees, 15-30 degrees, 30-45 degrees, 45-60 degrees, 60-75 degrees, 75-90 degrees or 90-180 degrees. Wires may also be held at different vertical levels; for instance FIGS. 64A-64B, discussed in detail below, shows wires held at two vertical levels. Other embodiments are hereby explicitly disclosed including embodiments with two, three, four, or more levels of wire channels which may be above or below the frame member, or a combination of the two; such different vertical levels may also hold wires at various orientations. Other embodiments are hereby explicitly disclosed including embodiments with one, two, three, four, five or more wire channels, where panels or wire clips may extend in the same direction or different directions, appear in one level or multiple levels, and consist of the same substance(s) or different substances.

Figure 57:
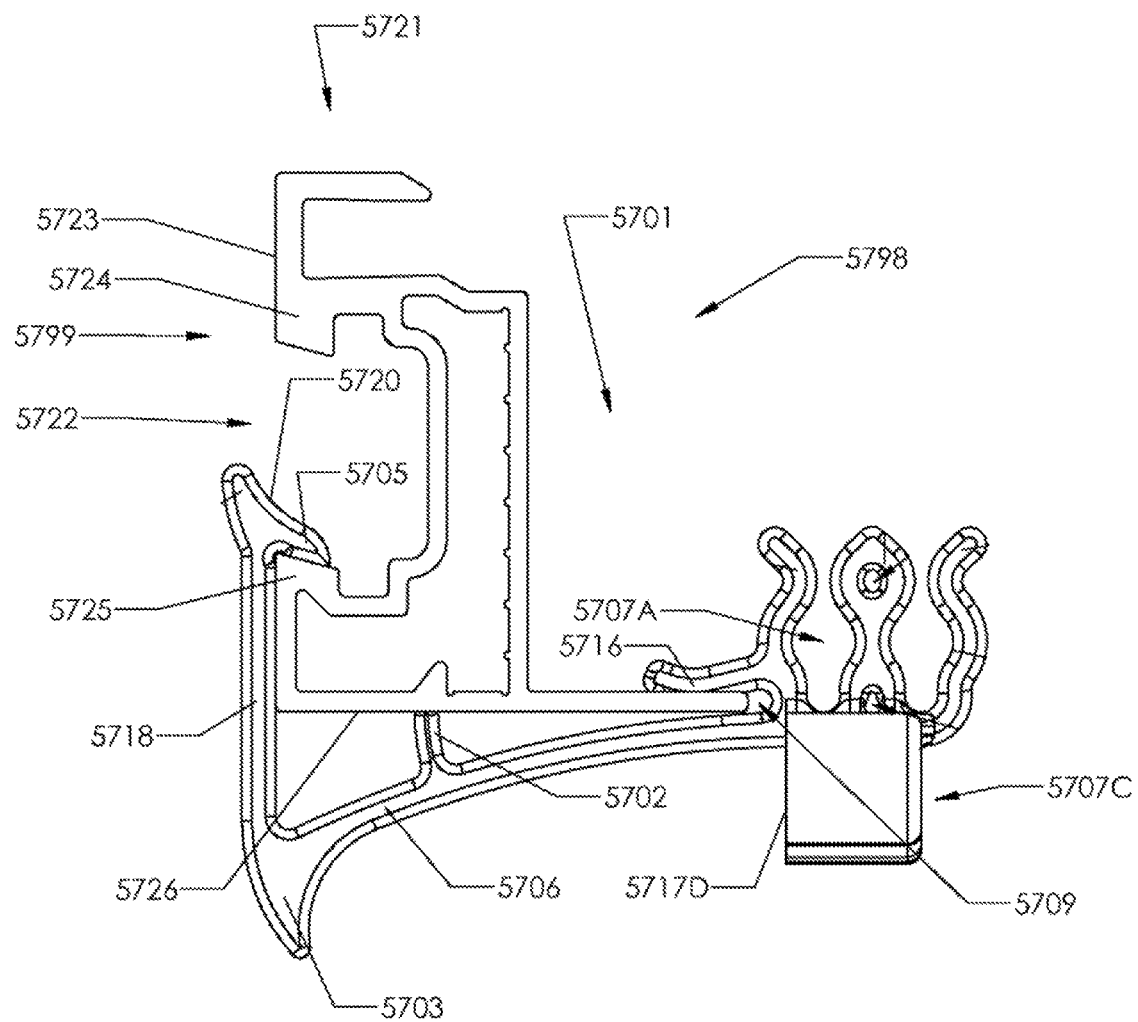
FIG. 57 is a side view of an embodiment of a wire clip connected to a frame.

Referring now to FIG. 57, a cut away view of a wire clip such as wire clip 5701 is shown, connecting to a PV module frame such as frame 5721. Wire clip 5701 may be similar to wire clip 5601 as shown and described regarding FIG. 56 and others, and to other wire clips. Frame 5721 may include (i) an inner portion (alternatively designated as an inside portion) 5798 comprising the portion of the frame 5721 substantially beneath a photovoltaic laminate but excepting the groove 5722 and (ii) an outer portion (alternatively designated an outside portion) 5799 comprising that portion of frame 5721 generally accessible from a position adjacent to frame 5721, in particular but without limitation the groove 5722 and the outer surface 5723. Frame 5721 may further include an outer surface 5723, an upper lip 5724, a lower lip 5725, and a bottom panel 5726. As shown in FIG. 57, wire clip 5701 may be partially inserted into and may lock into groove 5722 of frame 5721. Wire clip 5701 may also engage groove 5722 as shown in FIG. 57. Wire clip 5701 may act as a guide to orient a wire or other cable-like material along a frame or among frames, as discussed above and further discussed below. Wire clip 5701 may connect to frame 5721 as follows. Bottom panel 5726 (alternatively designated as a flange) may enter slot 5709. Bottom panel 5726 may or may not contact the end of the slot 5709 depending on various dimensions. Brace 5702 contacts bottom panel 5726. Trigger 5703 may be pulled away from slot 5709 and upward. The pulling force against trigger 5703 may cause arm 5706 to pivot about and/or bend over brace 5702, which may function as a fulcrum, such that catch 5705 rises above lower lip 5725 (in the position as shown in FIG. 57). Catch 5705 may then snap into place against lower lip 5725, thus securing wire clip 5701 to frame 5721. Wire clip 5701 may also disconnect from, or disengage from, frame 5721 as follows. Force may be applied to inner surface 5720 of catch 5705. This may cause (i) arm 5706 and panel 5718 to flex and (ii) catch 5705 to slide up lower lip 5725 and away from groove 5722 until it "unsnaps" from lower lip 5725, thus disengaging the wire clip 5701 from the groove 5722. Wire clip 5701 may be adjustably positioned along the groove 5722 by sliding laterally. In some embodiments wire clip 5701 may be more easily slid laterally when partially installed such that flange 5726 is inserted into slot 5709 but catch 5705 has not been snapped onto lower lip 5725 yet. In other embodiments wire clip 5701 may be attached to a non-grooved PV module frame by snapping catch 5705 over the top of the frame (instead into groove 5722).

Figure 57A:
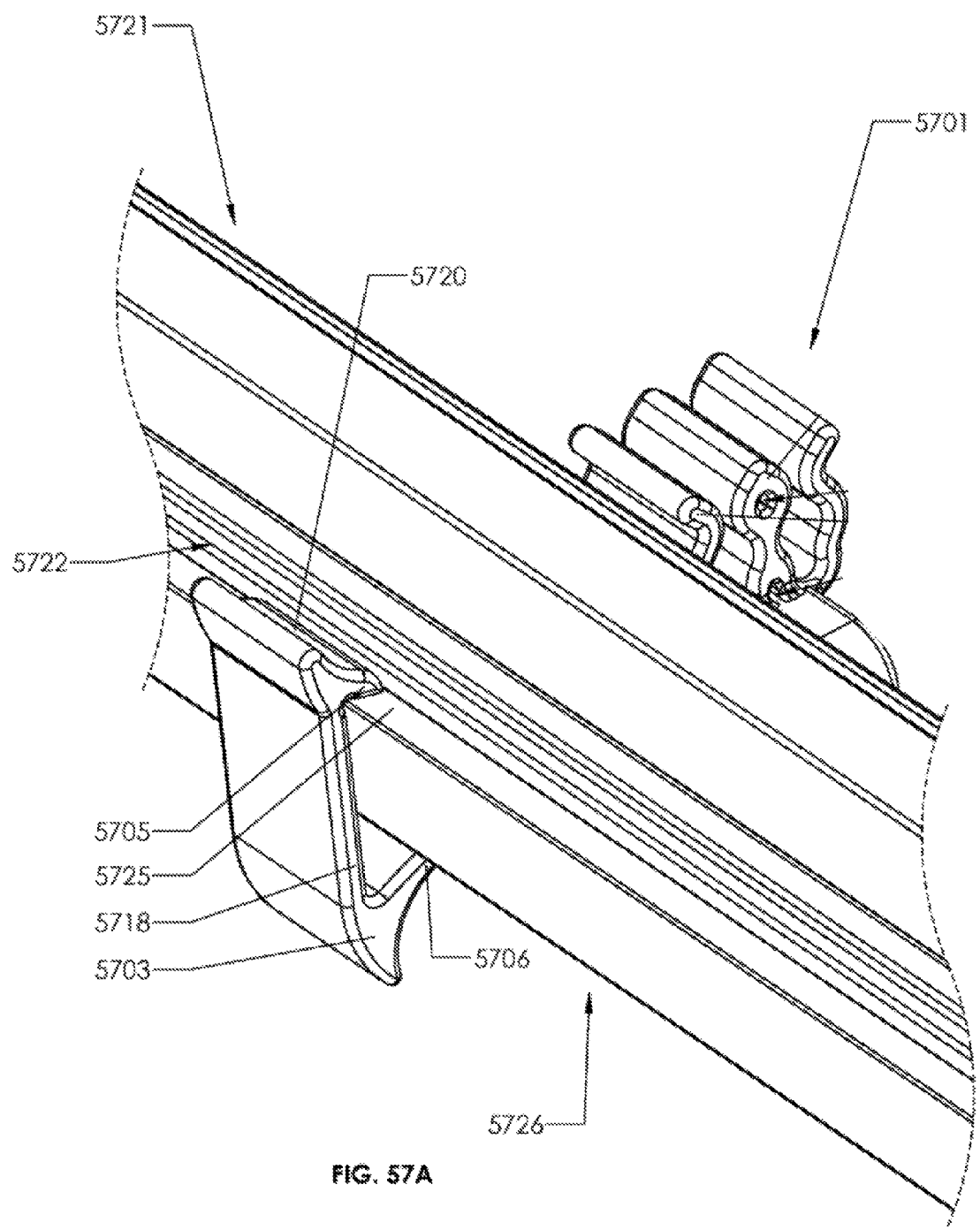
FIG. 57A is a perspective view of a wire clip connected to a frame.

Referring now to FIG. 57A, a perspective view of wire clip 5701 is shown connected to frame 5701, as also shown in cut away view in FIG. 57. It should be noted that in some embodiments catch 5705 and panel 5718 can be collectively referred to as an engagement feature.

Figure 58:
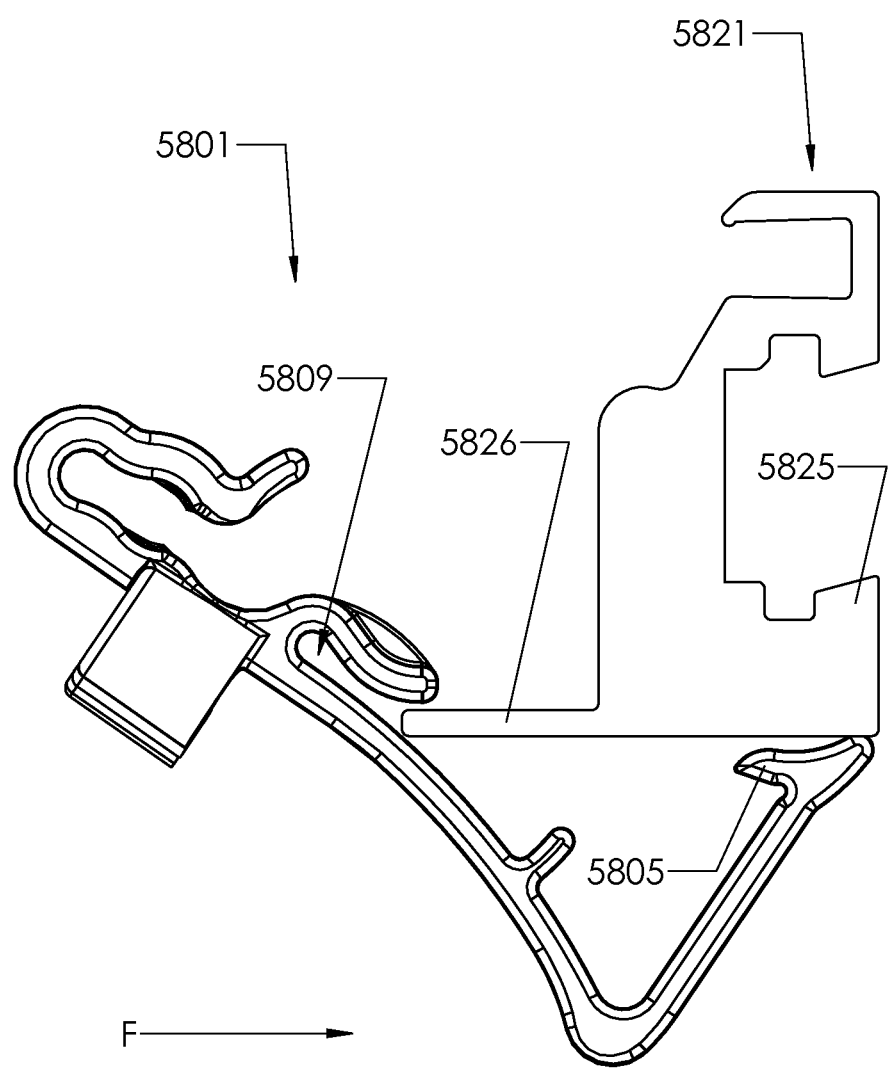
FIG. 58 is a side view of a wire clip connecting to a frame.

Referring now to FIG. 58, a wire clip is shown being connected to a frame. A wire clip such as wire clip 5801 is similar to wire clip 5601 as shown and described in FIG. 56 and others, to wire clip 5701 as shown and described in FIG. 57 and others, and to other wire clips. Frame 5821 is similar to frame 5721 as shown and described in FIG. 57, and to other frames. As shown in FIG. 58, wire clip 5801 may be oriented such that slot 5809 aligns with the lower flange 5826 of frame 5821. Force may then be applied in the direction of force F such that lower flange 5826 enters slot 5809 and catch 5805 extends above lip 5825 and engages lip 5825, as shown (fully installed) in FIG. 57.

Figure 59:
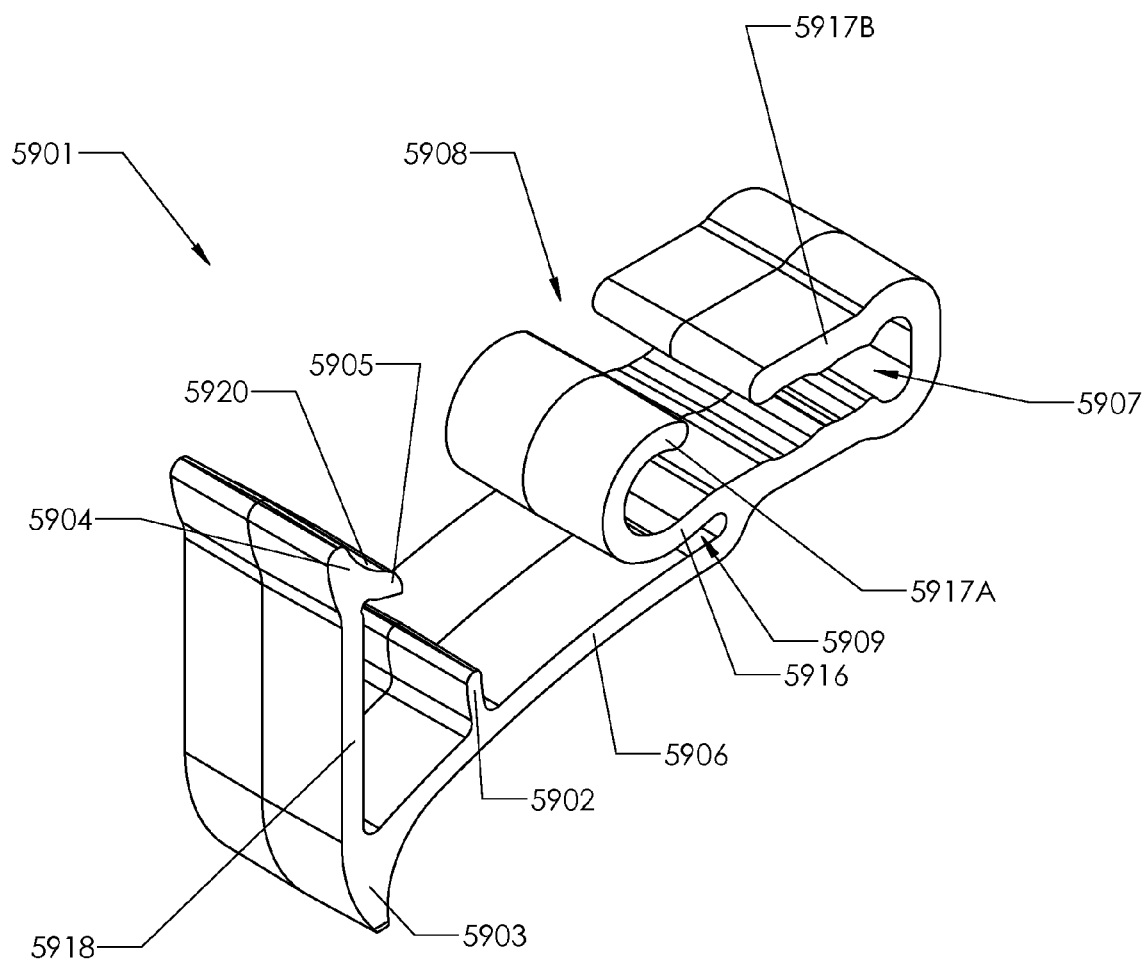
FIG. 59 is a perspective view of an embodiment of a wire clip.

Referring now to FIG. 59, another embodiment of a wire clip such as wire clip 5901 is shown. Wire clip 5901 is similar to (i) wire clip 5601 as shown and described regarding FIG. 56 and others, and (ii) wire clip 5701 as shown and described regarding FIG. 57 and others, and to other wire clips. Wire clip 5901 may include a brace 5902, a trigger 5903, a tab 5904 with an inner surface 5920, and a catch 5905 as shown and described regarding FIG. 59. Wire clip 5901 may further include an arm 5906, a slot 5909, a flange 5916, two or more gathers 5917A-B, a panel 5918, and one or more wire channels 5907 with one or more apertures 5908.

Figure 60:
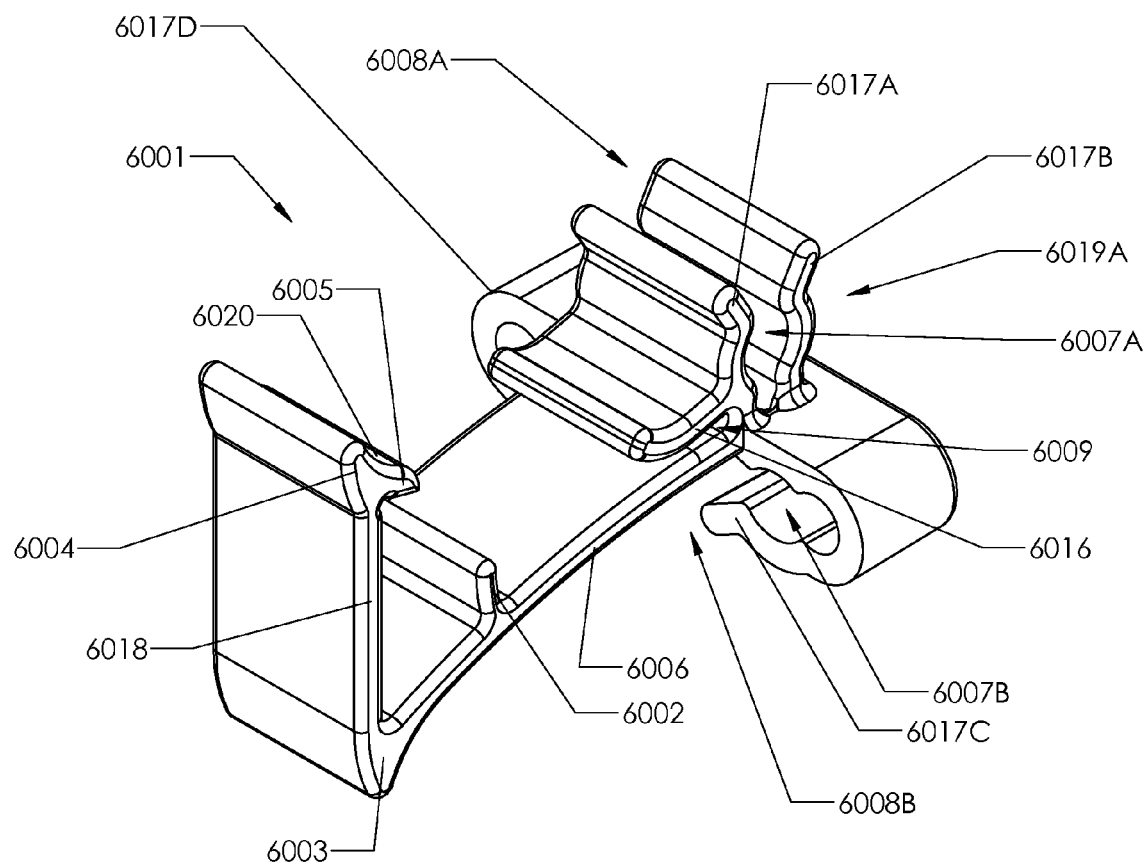
FIG. 60 is a perspective view of another embodiment of a wire clip.

Referring now to FIG. 60, another embodiment of a wire clip such as wire clip 6001 is shown. Wire clip 6001 is similar to (i) wire clip 5601 as shown and described regarding FIG. 56 and others, (ii) wire clip 5701 as shown and described regarding FIG. 57 and others, and (iii) wire clip 5901 as shown and described regarding FIG. 59 and others, and to other wire clips. Wire clip 6001 may include a brace 6002, a trigger 6003, a tab 6004 with an inner surface 6020, and a catch 6005 as shown and described regarding FIG. 60. Wire clip 6001 may further include an arm 6006, a slot 6009, a flange 6016, four or more gathers 6017A-5917D, a panel 6018, and one or more wire channels 6007A-B with one or more apertures 6008A-B.

Figure 61:
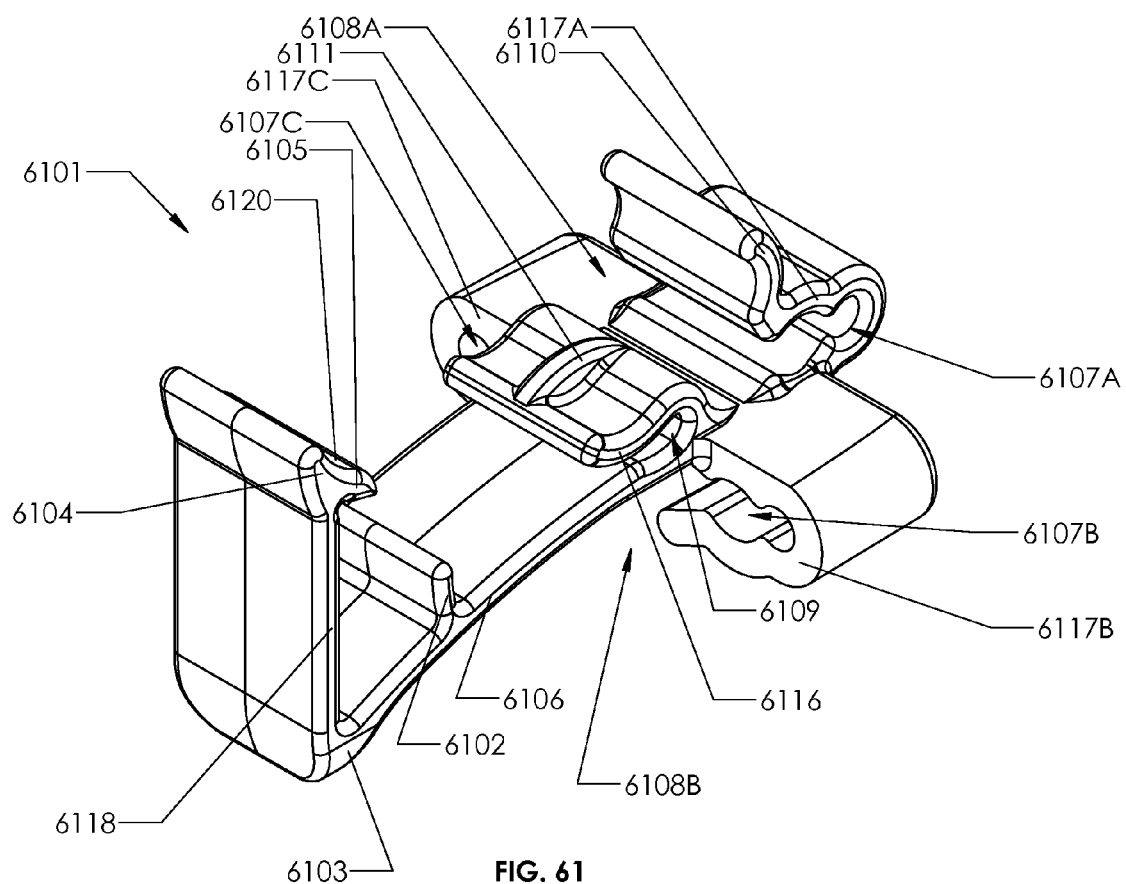
FIG. 61 is a perspective view of yet another embodiment of a wire clip.

Referring now to FIG. 61, another embodiment of a wire clip is shown. A wire clip such as wire clip 6101 is similar to (i) wire clip 5601 as shown and described regarding FIG. 56 and others, (ii) wire clip 5701 as shown and described regarding FIG. 57 and others, (iii) wire clip 5901 as shown and described regarding FIG. 59 and others, (iv) wire clip 6001 as shown and described regarding FIG. 60 and others, as well as to other wire clips. Wire clip 6101 may include a brace 6102, a trigger 6103, a tab 6104 with an inner surface 6120, and a catch 6105 as shown and described regarding FIG. 61. Wire clip 6101 may further include an arm 6106, a slot 6109, a flange 6116, three or more gathers 6117A-6117C, a panel 6118, and one or more wire channels 6107A-B with one or more apertures 6108A-B. Wire clip 6101 may further include panel 6118, scoop 6110, bumper 6111, and wire channels 6107A-C. Wire clip 6101 may function similarly to other wire clips, and additionally the scoop 6110 may be used to catch, trap, and otherwise capture cables or similar content such that when wire clip 6101 is installed, the bumper 6122 guides the cables or similar content into the wire channel 6107A.

Figure 62:
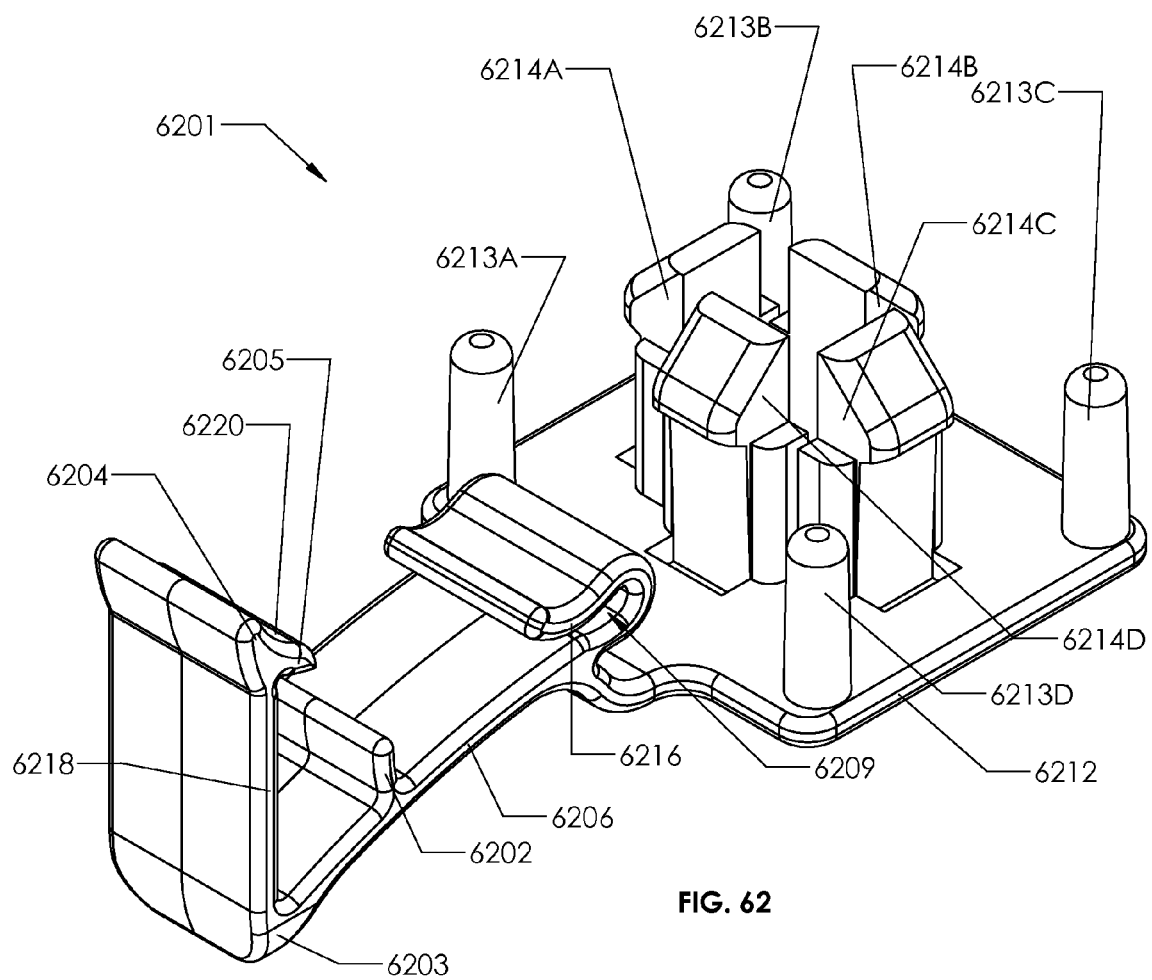
FIG. 62 is a perspective view of still another embodiment of a wire clip.

Referring now to FIG. 62, another embodiment of a wire clip such as wire clip 6201 is shown. Wire clip 6201 is similar to (i) wire clip 5601 as shown and described regarding FIG. 56 and others, (ii) wire clip 5701 as shown and described regarding FIG. 57 and others, (iii) wire clip 5901 as shown and described regarding FIG. 59, (iv) wire clip 6001 as shown and described regarding FIG. 60 and (v) wire clip 6101 as shown and described regarding FIG. 61, as well as to other wire clips. Wire clip 6201 may include a brace 6202, a trigger 6203, a tab 6204 with an inner surface 6220, and a catch 6205. Wire clip 6201 may further include an arm 6206, a slot 6209, and a panel 6218. Wire clip 6201 also includes a flange 6216, a platform 6212, pins 6213A-6213D, and hooks 6214A-6214D. Platform 6212 may extend from the arm 6206 in the opposite direction as the trigger 6203. Platform 6212 may be formed into a triangular, quadrilateral, circular, or other regular or irregular geometric shape. Pins 6213A-6213D may extend upward from the platform 6212 and may be arranged such that from a top down view the pins may define the four corners of a square or rectangle approximately centered on platform 6212. The pins 6213A-6213D may be the same size or varying sizes, so various embodiments may include pins of different heights, angles, and/or diameters. Hooks 6214A-6214C are arranged in a square or rectangle in the center of the platform 6212 such that they may face outward toward the perimeter of the platform 6212. Hooks 6214A-6214C may flex or otherwise deform to hold a wire, as discussed in greater detail below.

Wire clip 6201 may engage a PV module frame in the same fashion as wire clip 5701 and others as described above. Like wire clip 5601 and others, wire clip 6201 may orient, organize, retain, and restrict wires and/or other components, but may do so as follows. A hook 6214D may be pressed toward the center of the platform and held. A wire may then be placed on the platform such that one side of the wire contacts the hook 6214D and the other side of the wire, at different locations along its length, contacts an inner surface of pin 6213C and 6213D. Hook 6214D may then be released. Friction may prevent the wire(s) from moving laterally, and the overhang of hook 6214D prevents the wire from moving vertically out of wire clip 6201.

Figure 62A:
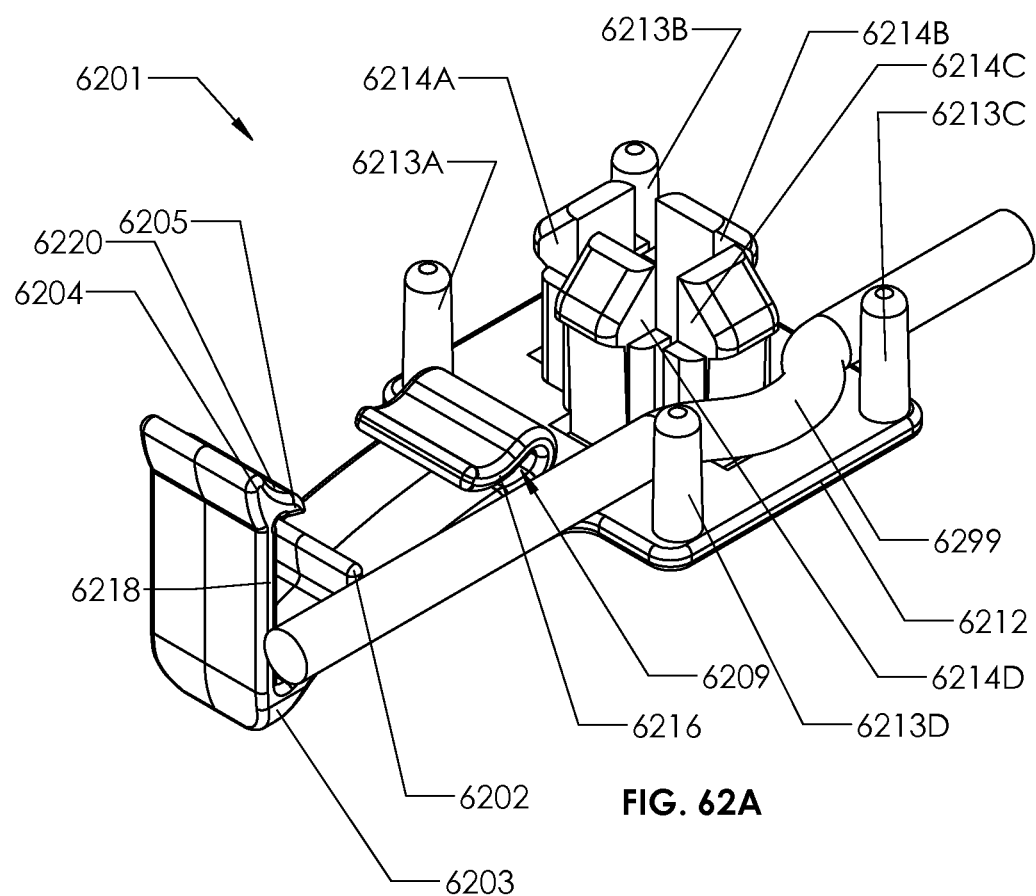
FIG. 62A is a view of the wire clip in FIG. 62 holding a wire.

Referring now to FIG. 62A, wire clip 6201 is shown with a wire, such as wire 6288, installed.

Figure 63:
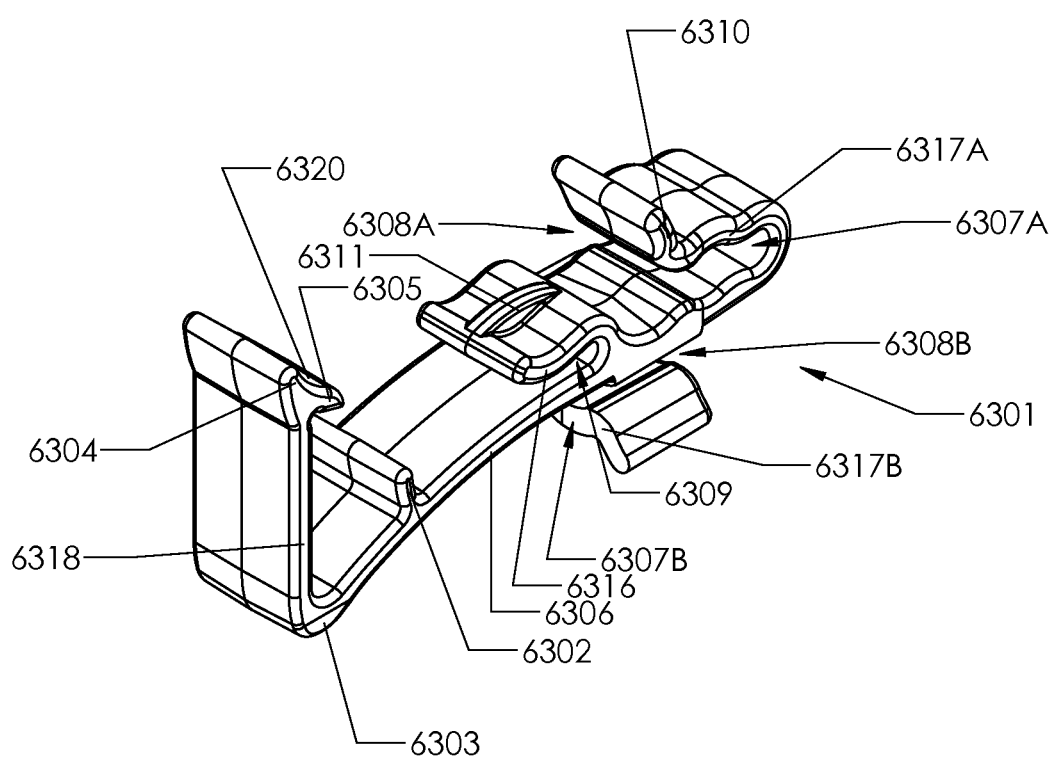
FIG. 63 is a perspective view of another embodiment of a wire clip.

Referring now to FIG. 63, another embodiment of a wire clip is shown. A wire clip such as wire clip 6301 is similar to wire clip 5601 as shown and described regarding FIG. 56 and others, to wire clip 5701 as shown and described regarding FIG. 57 and others, to wire clip 5901 as shown and described regarding FIG. 59 and others, to wire clip 6001 as shown and described regarding FIG. 60 and others, to wire clip 6101 as shown and described regarding FIG. 61 and others, to wire clip 6201 as shown and described in FIG. 62 and others, and to other wire clips. Wire clip 6301 may include brace 6302, trigger 6303, tab 6304, catch 6305, arm 6306, wire channels 6307A and 6307B, apertures 6308A and 6308B, slot 6309, scoop 6310, bumper 6311, flange 6316, gathers 6317A and 6317B, panel 6318, and inner surface 6320. Wire clip 6301 may hold (a) a first wire in wire channel 6307A such that the first wire runs in a direction substantially parallel to a length of frame 5721 (i.e. running alongside and parallel to PV module 1101) and (b) a second wire in wire channel 6307B such that the second wire runs substantially perpendicular to and in a different plane than the first wire in the location where they cross. Such an arrangement may provide advantages since wires in PV arrays frequently need to be routed in different directions and having a single wire clip that handles two directions may reduce the number of parts required to install the system and may reduce the time required to install the system. In other embodiments wire channels 6307A, 6307B may be oriented at other angles relative to each other, including 0°, 30°, and 60°. In still other embodiments wire channels 6307A, 6307B may provide a press-fit or friction fit to hold wires and in other embodiments wire channels 6307A, 6307B may loosely hold wires. Wire channel 6307A may hold a wire in a position above flange 5726 so that it does not droop too much beneath a PV module (for aesthetic and/or safety reasons). Wire channel 6307B may hold a wire in a position beneath yet generally shaded by flange 5726 such that UV exposure of the wire is minimized.

Figure 64:
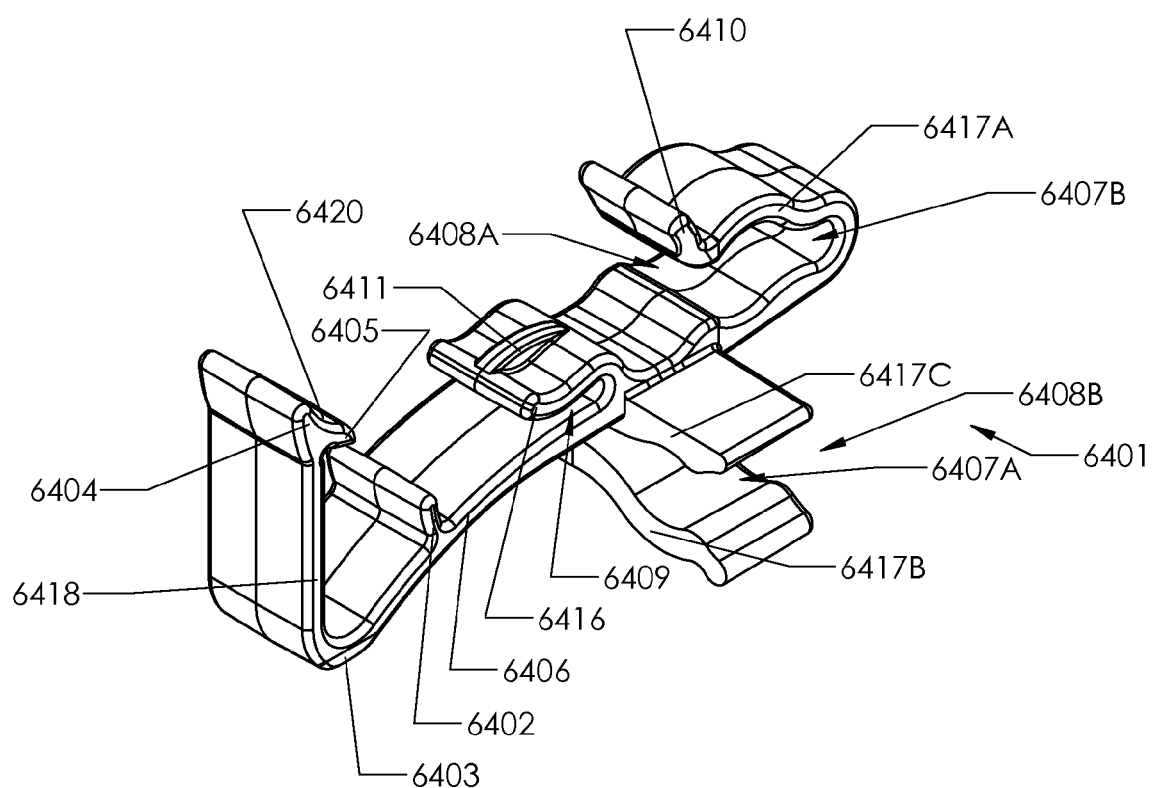
FIG. 64 is a perspective view of another embodiment of a wire clip.

Referring now to FIG. 64, another embodiment of a wire clip is shown. A wire clip such as wire clip 6401 is similar to wire clip 5601 as shown and described regarding FIG. 56 and others, to wire clip 5701 as shown and described regarding FIG. 57 and others, to wire clip 5901 as shown and described regarding FIG. 59 and others, to wire clip 6001 as shown and described regarding FIG. 60 and others, to wire clip 6101 as shown and described regarding FIG. 61 and others, to wire clip 6201 as shown and described in FIG. 62 and others, to wire clip 6301 as shown and described in FIG. 63 and others, and to other wire clips. Wire clip 6401 may include brace 6402, trigger 6403, tab 6404, catch 6405, arm 6406, wire channels 6407A and 6407B, apertures 6408A and 6408B, slot 6409, scoop 6410, bumper 6411, flange 6416, gathers 6417A-6417C, panel 6418, and inner surface 6420. Wire channel 6407A may be positioned off to the side (as shown in FIG. 64) to enable a wire held in wire channel 6407A to avoid conflict with trigger 6403.

Referring now to FIGS. 65A and 65B, an embodiment of a wire clip is shown connected to wires. A wire clip such as wire clip 6501 is similar to wire clip 5601 as shown and described regarding FIG. 56 and others, to wire clip 5701 as shown and described regarding FIG. 57 and others, to wire clip 5901 as shown and described regarding FIG. 59 and others, to wire clip 6001 as shown and described regarding FIG. 60 and others, to wire clip 6101 as shown and described regarding FIG. 61 and others, to wire clip 6201 as shown and described in FIG. 62 and others, to wire clip 6301 as shown and described in FIG. 63 and others, to wire clip 6401 as shown and described in FIG. 64 and others, and to other wire clips. Wire clip 6501 may include brace 6502, trigger 6503, tab 6504, catch 6505, arm 6506, wire channels 6507A and 6507B, apertures 6508A and 6508B, slot 6509, scoop 6510, bumper 6511, flange 6516, gathers 6517A-6517B, panel 6518, and inner surface 6520. Wires such as wires 6515 may be pressed through apertures 6508A and 6508B, temporarily deforming gathers 6517A and 6517B, into wire channels 6507A and 6507B where they may be held in place by gathers 6517A and 6517B as they return toward their original form and as a result press against wires 6515. Wires 6515 may be held by wire channels 6507A, 6507B such that wires 6515 run approximately perpendicular to each other as shown The foregoing does not limit the number of wires or similar components and the like that may enter any wire channel 6507A-6507C. Wire channels such as wire channels 6507A-6507B may hold wires or similar components. Where wire channels 6507A-6507B hold wires, those wires may be wires for alternating current (AC), direct current (DC) or another form of transmission. Furthermore, the trigger 6503, panel 6518, and scoop 6510 may assist regarding wire attachment. An installer may, without limitation, place a thumb against panel 6518 and a finger around the concave portion of trigger 6503 and then move the wire clip beneath the PV module. An installer may then catch wires 6515 or other components against the scoop 6510 and pull them back toward the frame for subsequent installation.

Figure 65C:
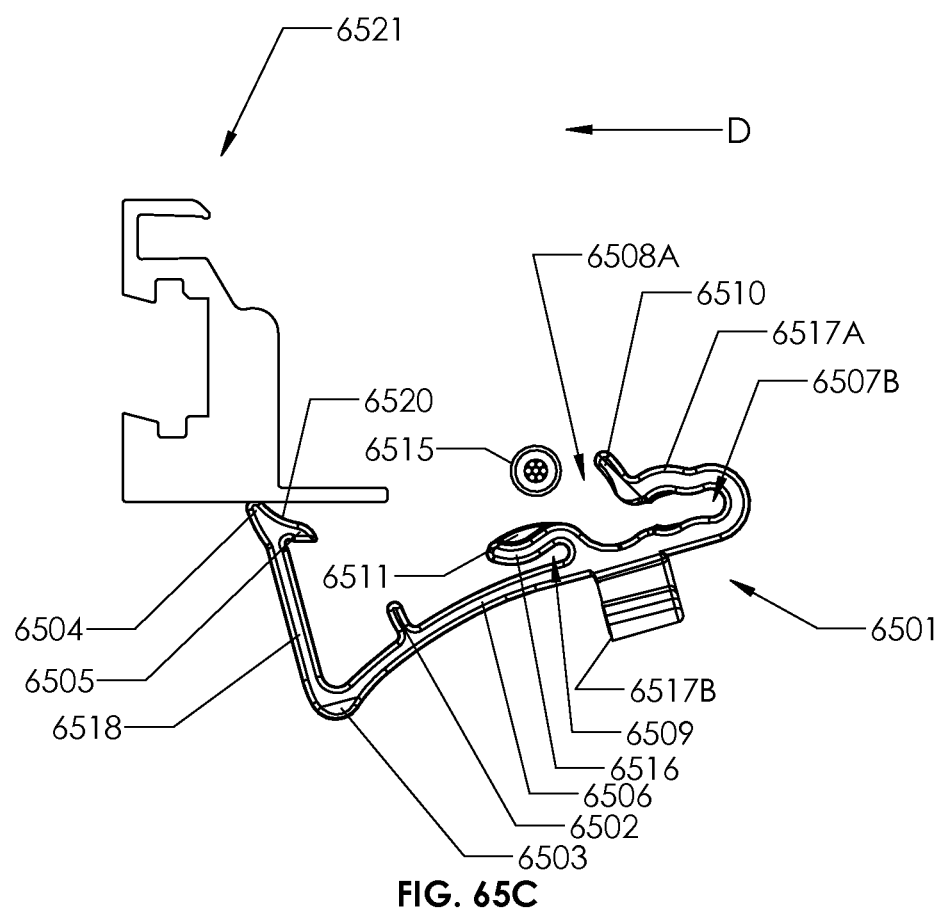
FIG. 65C is a side view of a wire clip "scooping" a wire toward a frame.

Referring now to FIG. 65C, wire clip 6501 is shown scooping a wire 6515 with its scoop 6510 toward a frame 6521, as described above. Frame 6521 is similar to frame 5721 as shown and described in FIG. 57 and others, to frame 5821 as shown and described in FIG. 58 and others, and to other frames. Wire clip 6501 may be moved in direction D such that scoop 6510 contacts wire 6515 and moves it toward frame 6521.

Figure 65D:
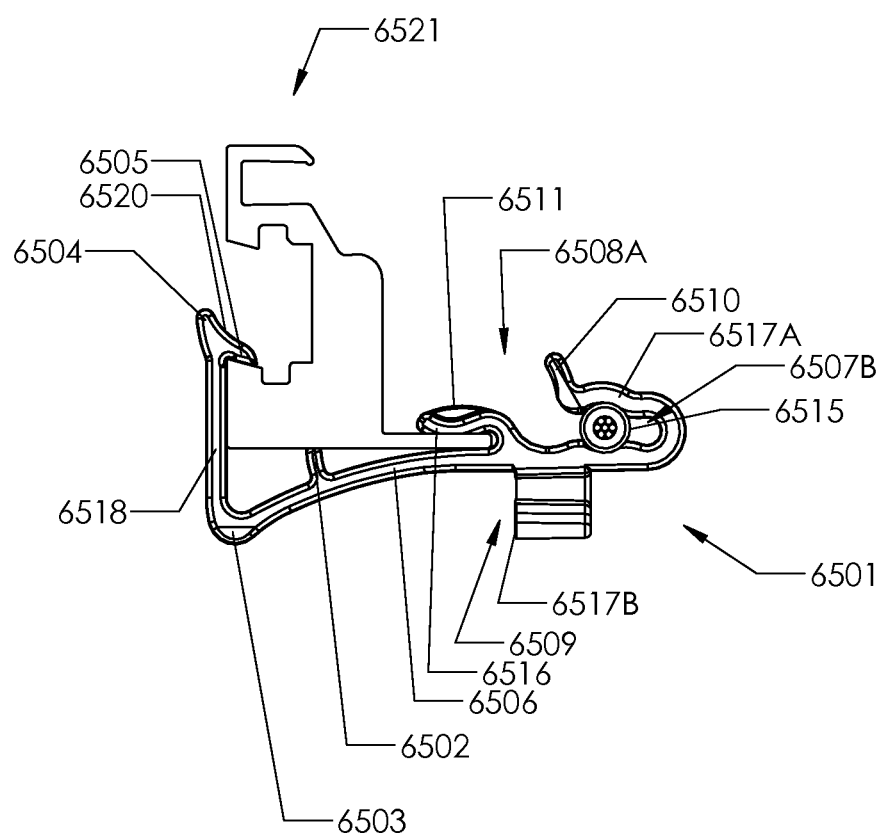
FIG. 65D is a side view of a wire clip holding a wire and connected to a frame.

Referring now to FIG. 65D, a wire clip is shown holding a wire and connected to a frame.

Figure 66:
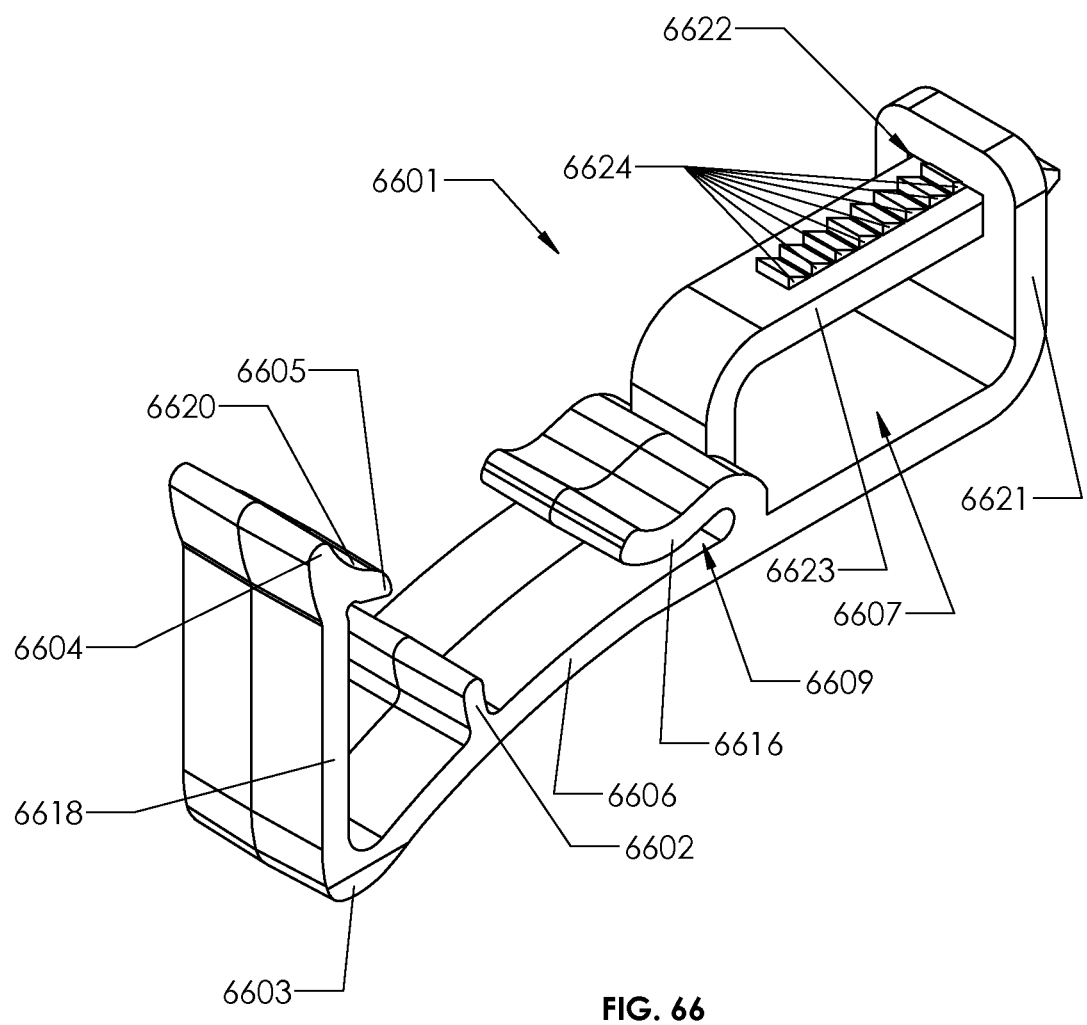
FIG. 66 is a perspective view of an embodiment of a wire clip.

Referring now to FIG. 66, another embodiment of a wire clip is shown. A wire clip such as wire clip 6601 is similar to wire clip 5601 as shown and described regarding FIG. 56 and others, to wire clip 5701 as shown and described regarding FIG. 57 and others, to wire clip 5901 as shown and described regarding FIG. 59 and others, to wire clip 6001 as shown and described regarding FIG. 60 and others, to wire clip 6101 as shown and described regarding FIG. 61 and others, to wire clip 6201 as shown and described in FIG. 62 and others, to wire clip 6301 as shown and described in FIG. 63 and others, to wire clip 6401 as shown and described in FIG. 64 and others, to wire clip 6501 as shown and described in FIG. 65A and others, and to other wire clips. Wire clip 6601 may include a brace 6602, a trigger 6603, a tab 6604 with an inner surface 6620, and a catch 6605 as shown and described regarding FIG. 66. Wire clip 6601 may further include an arm 6606, a slot 6609, a flange 6616, and a panel 6618 as well as a rear panel 6621 with a slot 6622 and a strap 6623 with teeth 6624 that may create a wire channel 6607. Wires or other components may be placed in wire channel 6607. Strap 6623 with teeth 6624 may then be placed into and pulled through slot 6622. Once through, any given tooth 6624 will lock against panel 6621 to prevent strap 6623 from disconnecting from slot 6622. Strap 6623 may also be pulled tight to create friction upon any wires or other components in wire channel 6607.

Figure 67:
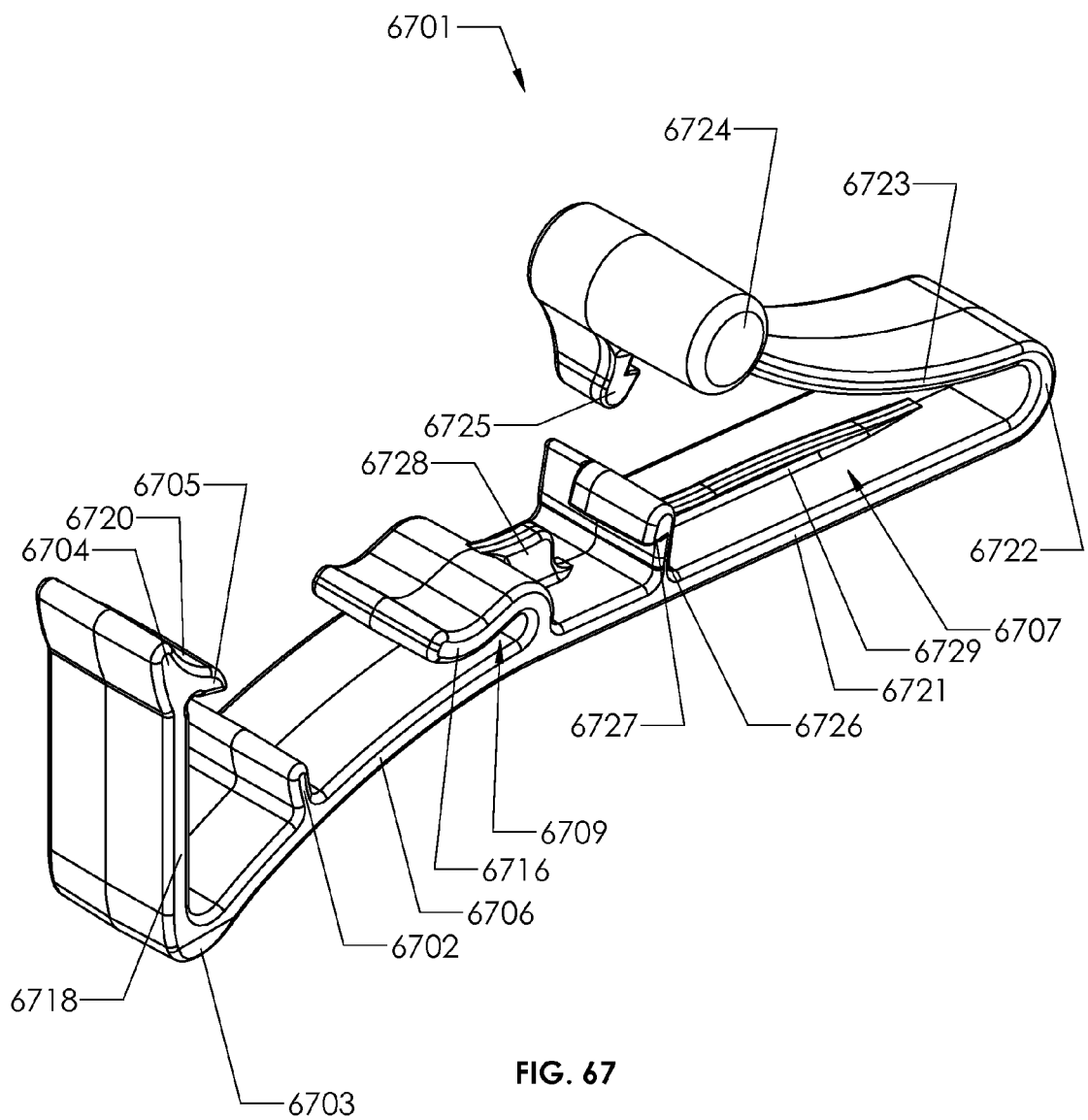
FIG. 67 is a perspective view of another embodiment of a wire clip.

Referring now to FIG. 67, another embodiment of a wire clip is shown. A wire clip, such as wire clip 6701, for holding multiple wires, for example 2 up 15 wires, is shown in FIG. 67. Wire clip 6701 may be useful to gather "homerun" wires along one side of a PV array. Wire clip 6701 may be similar to wire clip 5601 as shown and described in FIG. 56 and others, to wire clip 5701 as shown and described regarding FIG. 57 and others, to wire clip 5901 as shown and described regarding FIG. 59 and others, to wire clip 6001 as shown and described regarding FIG. 60 and others, to wire clip 6101 as shown and described regarding FIG. 61 and others, to wire clip 6201 as shown and described in FIG. 62 and others, to wire clip 6301 as shown and described in FIG. 63 and others, to wire clip 6401 as shown and described in FIG. 64 and others, to wire clip 6501 as shown and described in FIG. 65A and others, to wire clip 6601 as shown and described in FIG. 66 and others, and to other wire clips. Wire clip 6701 may include a brace 6702, a trigger 6703, a tab 6704 with an inner surface 6720, a catch 6705, an arm 6706, a slot 6709, a flange 6716, a blocking panel 6728, and a panel 6718. Wire clip 6701 may also include a rear arm 6721, a riser 6729, a rear bend 6722, a spring arm 6723, a knob 6724, a hook 6725 and a clasp 6726 with a rear catch 6727 that may create a wire channel 6707. Wires or other components may be placed in wire channel 6707 when hook 6725 is disengaged from rear catch 6727. Knob 6724 may then be pressed downward until hook 6725 "snaps" beneath rear catch 6727. Knob 6724 may be moved laterally such that hook 6725 moves away from rear catch 6727 to disengage hook 6725 from rear catch 6727. When wires are placed in wire channel 6707 and hook 6725 engages rear clasp 6727, the wires may be pressed against spring arm 6723 and riser 6729, which may create friction against the wires. Blocking panel 6728 may prevent wires from falling into the space beneath rear catch 6727, but blocking panel 6728 still leaves room for hook 6725 to engage rear catch 6727.

In summary regarding all wire clips herein, disclosed is a photovoltaic module comprising a frame (5721) supporting a photovoltaic laminate (20, 20A, 20B, 420), the frame (5721) comprising an outer portion (5799) and an inner portion (5798, 8198), the inner portion (5798, 8198) substantially beneath the photovoltaic laminate (20, 20A, 20B, 420); and a wire clip comprising a wire channel (5607A, 5607B, 5607C, 5907, 6007A, 6007B, 6107A, 6107B, 6107C, 6307A, 6307B, 6407A, 6407B, 6507A, 6507B, 6607) for holding a wire, an arm portion (5606, 5706, 5906, 6006, 6106, 6206, 6306, 6406, 6506, 6606) extending away from the wire channel (5607A, 5607B, 5607C, 5907, 6007A, 6007B, 6107A, 6107B, 6107C, 6307A, 6307B, 6407A, 6407B, 6507A, 6507B, 6607), a slot portion (5609, 5709, 5909, 6009, 6109, 6209, 6309, 6409, 6509, 6609) near a first end of the arm portion (5606, 5706, 5906, 6006, 6106, 6206, 6306, 6406, 6506, 6606), and a catch portion (5605, 5705, 5905, 6005, 6105, 6205, 6305, 6405, 6505, 6605) near a second end of the arm portion (5606, 5706, 5906, 6006, 6106, 6206, 6306, 6406, 6506, 6606) wherein the catch portion (5605, 5705, 5905, 6005, 6105, 6205, 6305, 6405, 6505, 6605) engages the outer portion (5799) and the slot portion (5609, 5709, 5909, 6009, 6109, 6209, 6309, 6409, 6509, 6609) engages a portion of the frame (5721) underneath the PV module to securely attach the wire clip to the frame (5721).

Also disclosed is the photovoltaic module and wire clip as noted above where the wire clip (5601, 5701, 5901, 6001, 6101, 6201, 6301, 6401, 6501, 6601) is adjustably positionable along the frame (5721). Also disclosed is the photovoltaic module and wire clip as noted above where the wire clip (5601, 5701, 5901, 6001, 6101, 6201, 6301, 6401, 6501, 6601) further comprises a brace (5602, 5702, 5902, 6002, 6102, 6202, 6302, 6402, 6502, 6602), the brace (5602, 5702, 5902, 6002, 6102, 6202, 6302, 6402, 6502, 6602) acting as a fulcrum about which the arm (5606, 5706, 5906, 6006, 6106, 6206, 6306, 6406, 6506, 6606) at least partly pivots during installation of the wire clip (5601, 5701, 5901, 6001, 6101, 6201, 6301, 6401, 6501, 6601). Also disclosed is the photovoltaic module and wire clip as noted above where the wire clip (5601, 5701, 5901, 6001, 6101, 6201, 6301, 6401, 6501, 6601) further comprises a trigger (5603, 5703, 5903, 6003, 6103, 6203, 6303, 6403, 6503, 6603) and application of a force to the trigger (5603, 5703, 5903, 6003, 6103, 6203, 6303, 6403, 6503, 6603) moves the arm (5606, 5706, 5906, 6006, 6106, 6206, 6306, 6406, 6506, 6606) such that the catch (5605, 5705, 5905, 6005, 6105, 6205, 6305, 6405, 6505, 6605) snaps into the outer portion (5799). Also disclosed is the photovoltaic module and wire clip as noted above where the outer portion (5799) comprises a groove (5722, 8122). Also disclosed is the photovoltaic module and wire clip as noted above where the portion of the frame (5721) underneath the photovoltaic module (1100, 11500, 11200, 11100) comprises a flange (5726).

In further summary regarding all wire clips herein, disclosed is a photovoltaic module comprising a frame (5721) supporting a photovoltaic laminate (20, 20A, 20B, 420); and a wire clip (5601, 5701, 5901, 6001, 6101, 6201, 6301, 6401, 6501, 6601) attached to the frame (5721) and comprising a first wire channel (5607A, 5607B, 5607C, 5907, 6007A, 6007B, 6107A, 6107B, 6107C, 6307A, 6307B, 6407A, 6407B, 6507A, 6507B, 6607) for holding a first wire (6515) and a second wire channel (5607A, 5607B, 5607C, 5907, 6007A, 6007B, 6107A, 6107B, 6107C, 6307A, 6307B, 6407A, 6407B, 6507A, 6507B, 6607) for holding a second wire (6515), the first wire channel (5607A, 5607B, 5607C, 5907, 6007A, 6007B, 6107A, 6107B, 6107C, 6307A, 6307B, 6407A, 6407B, 6507A, 6507B, 6607) oriented substantially perpendicular to the second wire channel (5607A, 5607B, 5607C, 5907, 6007A, 6007B, 6107A, 6107B, 6107C, 6307A, 6307B, 6407A, 6407B, 6507A, 6507B, 6607).

Also disclosed is the photovoltaic module and wire clip as noted above where the wire clip (5601, 5701, 5901, 6001, 6101, 6201, 6301, 6401, 6501, 6601) is adjustably positionable along the frame (5721). Also disclosed is the photovoltaic module and wire clip as noted above where the a top surface of a light-receiving side of the photovoltaic laminate (20, 20A, 20B, 420) defines a plane, the first wire (6515) is held in the first wire channel (5607A, 5607B, 5607C, 5907, 6007A, 6007B, 6107A, 6107B, 6107C, 6307A, 6307B, 6407A, 6407B, 6507A, 6507B, 6607) substantially parallel with the plane, the second wire (6515) is held in the second wire channel (5607A, 5607B, 5607C, 5907, 6007A, 6007B, 6107A, 6107B, 6107C, 6307A, 6307B, 6407A, 6407B, 6507A, 6507B, 6607) substantially parallel with the plane and substantially perpendicular to the first wire (6515). Also disclosed is the photovoltaic module and wire clip as noted above where the frame (5721) comprises a first side and a second side orthogonally connected to the first side, the wire clip (5601, 5701, 5901, 6001, 6101, 6201, 6301, 6401, 6501, 6601) is attached to the second side, the first wire channel (5607A, 5607B, 5607C, 5907, 6007A, 6007B, 6107A, 6107B, 6107C, 6307A, 6307B, 6407A, 6407B, 6507A, 6507B, 6607) holds the first wire (6515) such that the first wire runs substantially parallel to the second side, and the second wire channel (5607A, 5607B, 5607C, 5907, 6007A, 6007B, 6107A, 6107B, 6107C, 6307A, 6307B, 6407A, 6407B, 6507A, 6507B, 6607) holds the second wire (6515) such that the second wire runs substantially perpendicular to the second side. Also disclosed is the photovoltaic module and wire clip as noted above where the first wire (6515) is held closer to the photovoltaic laminate (20, 20A, 20B, 420) than the second wire (6515) such that the first and second wires (6515) non-interferingly cross paths. Also disclosed is the photovoltaic module and wire clip as noted above where the second wire (6515) is held closer to the photovoltaic laminate (20, 20A, 20B, 420) than the first wire (6515) such that the first and second wires (6515) non-interferingly cross paths.

Referring now to FIGS. 68-70, where like numbers refer to like components, embodiments of wire clips are shown with cross sections of wires and with frames containing laminates. Referring now to FIG. 68, a wire clip such as wire clip 6801 may include two or more prongs 6802A and 6802B, each with a lip 6803A and 6803B, that form a trough 6804 between them. Wire clip 6801 may further have a body 6805 and a clip 6806 composed of an upper portion 6807A and a lower portion 6807B. Prongs 6802A and 6802B may snap into a groove such as groove 6852 of a frame such as frame 6850 (which engages laminate 6891) by flexing inward toward trough 6804 when being pressed into groove 6852. Clip 6806 may grip a wire such as wire 6880 by pressing the wire between upper portion 6807A and 6807B. Referring now to FIG. 69, a wire clip such as wire clip 6901 is similar to wire clip 6801 as shown and described in FIG. 68 and others, and to other wire clips. Wire clip 6901 may include two or more prongs 6902A and 6902B, each with a lip 6903A and 6903B, that define a trough 6904 between them, and may further include a clip 6906 composed of an upper portion 6907A and a lower portion 6907B extending out directly from the base of the prongs 6902A and 6902B. Referring now to FIG. 70, a wire clip such as wire clip 7001 is similar to wire clip 6801 as shown and described in FIG. 68 and others, to wire clip 6901 as shown and described in FIG. 69 and others, and to other wire clips. Wire clip 7001 may have two body sections, an upper body 7005A and a lower body 7005B. Upper body 7005A may have the female portion 7008 of a snap feature, or other coupling feature. Lower body 7005B may have the male portion 7009 of a snap feature, or other coupling feature. Male portion 7009 may snap into female portion 7008 to connect upper body 7005A to lower body 7005B.

Referring now to FIGS. 71 and 72, where like numbers refer to like components, embodiments of wire clips are shown with cross sections of wires and with frames containing laminates. Referring now to FIG. 71, a wire clip such as wire clip 7101 is shown. Wire clip 7101 may include an upper lip 7102 and a lower lip 7103 that form a trough 7104. Wire clip 7101 may further include a body 7105, a back stop 7106, and a clasp 7107 with one or more dimples 7108A and 7108B and a tab 7109. Wire clip 7101 may, but need not, be formed of one piece of metal, plastic, or another semi-rigid, flexible material. To connect to a frame 7150, upper lip 7102 and lower lip 7103 may be pressed into groove 7152, causing upper lip 7102 and lower lip 7103 to flex and deform toward trough 7104 before springing back toward their original shape upon entering groove 7152. Once connected, body 7105 may extend beneath and behind frame 7150 such that back stop 7106 and clasp 7107 are beneath laminate 7191. A wire such as wire 7180 may be inserted into wire clip 7101 by pulling tab 7109 away from back stop 7106 until dimple 7108B has moved sufficiently far from back stop 7106 that cable 7180 may enter, at which point tab 7109 may be released once wire 7180 is oriented between dimples 7108A and 7108B. Clasp 7107 and back stop 7106 may then press against wire 7180, and dimples 7108A and 7108B may restrict upward or downward movement of wire 7180. Referring now to FIG. 72, a wire clip such as wire clip 7201 is shown. Wire clip 7201 is similar to wire clip 7101 as shown and described referring to FIG. 71 and others, and to other wire clips. Wire clip 7201 may include an upper lip 7202 and a lower lip 7203 that form a trough 7204. Wire clip 7201 may further include a body 7205, a back stop 7206, and a clasp 7207 with one or more dimples 7208A and 7208B and a tab 7209. Wire clip 7201 may connect to the groove 7152 of frame 7150 in the same manner as wire clip 7101, however body 7205 may extend upward out of groove 7152 rather than beneath and behind.

While a number of exemplary aspects and embodiments have been discussed above, it is contemplated herein as well to recognize certain modifications, permutations, additions and sub-combinations thereof. It is therefore intended that the following appended claims and claims hereafter introduced be interpreted to include all such modifications, permutations, additions, and sub-combinations as are within their true spirit and scope.

What is claimed as invention is:

1. A photovoltaic module assembly, comprising:
   a frame supporting a photovoltaic laminate; and
   a wire clip, comprising:
      an arm having a first end and a second end opposite the first end,
      an engaging feature extending from and integrally formed with the first end of the arm, the engaging feature comprising a catch engaged with a first portion of the frame and positioned between the first portion of the frame and a second portion of the frame that contacts the photovoltaic laminate,
      a wire gather coupled to the arm, and
      a frame receiving slot,
   wherein a third portion of the frame is disposed within the frame receiving slot and a fourth portion of the frame is positioned between the frame receiving slot and the engaging feature.

2. The photovoltaic module assembly of claim 1, wherein the first end of the arm comprises a trigger connecting the engaging feature to the arm.

3. The photovoltaic module assembly of claim 1, wherein at least a portion of the wire gather protrudes from the second end of the arm toward the photovoltaic laminate.

4. The photovoltaic module assembly of claim 1, further comprising:
   a brace that protrudes laterally from a central region of the arm, a distal end of the brace contacting the frame to establish a standoff distance between the arm and the frame.

5. The photovoltaic module assembly of claim 1, wherein the frame receiving slot is positioned closer to the first end of the arm than the second end of the arm.

6. A photovoltaic module assembly, comprising:
a wire clip, comprising:
- an arm having a first end and a second end opposite the first end,
- a plurality of gathers defining a wire channel positioned at the first end of the arm,
- a frame receiving slot, and
- an engaging feature at the second end of the arm, the engaging feature comprising a catch; and a frame supporting a photovoltaic laminate, the frame comprising a first portion disposed within the frame receiving slot and a second portion positioned outside of the frame receiving slot and engaged by the catch,
wherein one or more gathers of the plurality of gathers protrude from the arm toward the photovoltaic laminate.

7. The photovoltaic module assembly of claim 6, wherein the frame receiving slot is positioned closer to the first end of the arm than the second end of the arm.

8. The photovoltaic module assembly of claim 6, wherein the second end of the arm comprises a trigger that includes a protrusion extending away from engaging feature.

9. The photovoltaic module assembly of claim 8, wherein the trigger is configured to receive a force that pivots the catch of the engaging feature until the catch is withdrawn from a groove defined by the second portion of the frame during removal of the wire clip from the frame.

10. A photovoltaic module assembly, comprising:
a frame supporting a photovoltaic laminate; and
a wire clip, comprising:
- an arm having a first end and a second end opposite the first end,
- an engaging feature extending from the first end of the arm, the engaging feature comprising a catch engaged with a first portion of the frame,
- a wire gather, at least a portion of the wire gather protruding from the second end of the arm toward the photovoltaic laminate, and
- a frame receiving slot, wherein a second portion of the frame is disposed within the frame receiving slot and a third portion of the frame is positioned between the frame receiving slot and the engaging feature.

11. The photovoltaic module assembly of claim 10, wherein the engaging feature is integrally formed with the first end of the arm.

12. The photovoltaic module assembly of claim 10, wherein the first portion of the frame engaged by the catch is disposed between the second portion of the frame and a fourth portion of the frame that contacts the photovoltaic laminate.

* * * * *